United States Patent
Hoffman

(10) Patent No.: US 9,065,371 B2
(45) Date of Patent: Jun. 23, 2015

(54) SOLAR ENERGY COLLECTION SYSTEM

(75) Inventor: James T. Hoffman, Alameda, CA (US)

(73) Assignee: Sun Synchrony, Inc., Vallejo, CA (US)

( * ) Notice: Subject to any disclaimer, the term of this patent is extended or adjusted under 35 U.S.C. 154(b) by 0 days.

(21) Appl. No.: 13/131,065

(22) PCT Filed: Dec. 3, 2009

(86) PCT No.: PCT/US2009/066661
§ 371 (c)(1),
(2), (4) Date: Jul. 7, 2011

(87) PCT Pub. No.: WO2010/065794
PCT Pub. Date: Jun. 10, 2010

(65) Prior Publication Data
US 2011/0259396 A1    Oct. 27, 2011

Related U.S. Application Data

(60) Provisional application No. 61/200,835, filed on Dec. 3, 2008.

(51) Int. Cl.
*H02S 40/22* (2014.01)
*H01L 31/054* (2014.01)
(Continued)

(52) U.S. Cl.
CPC ............ *H02P 5/68* (2013.01); *Y10T 29/49355* (2015.01); *F24J 2/18* (2013.01); *H02S 40/22* (2014.12);
(Continued)

(58) Field of Classification Search
CPC ............... F24J 2002/109; F24J 2002/1004; F24J 2002/1061; F24J 2002/1066; F24J 2002/1085; F24J 2002/1014; F24J 2002/1019; F24J 2002/5479; F24J 2/5417; F24J 2/5427

USPC ........ 126/600; 250/203.4; 343/765, 766, 882, 343/915; 342/359; 52/167.4; 248/128, 138, 248/184.1; 136/243–290
See application file for complete search history.

(56) References Cited

U.S. PATENT DOCUMENTS 2,512,636 A    6/1950  Flynt
3,923,381 A   12/1975  Winston
(Continued)

FOREIGN PATENT DOCUMENTS

CN    1447058 A    10/2003
EP    0909929 A2    4/1999
(Continued)

OTHER PUBLICATIONS

"Brian Sanderson's pattern recognition algorithm" [retrieved from internet at http://www.math.toronto.edu/~drorbn/Gallery/Symmetry/Tilings/Sanderson/Algorithm.pdf on Jan. 16, 2013].*
(Continued)

*Primary Examiner* — Jeffrey T Barton
*Assistant Examiner* — Eric R Smith
(74) *Attorney, Agent, or Firm* — Kilpatrick Townsend & Stockton LLP

(57) ABSTRACT

A system for collecting solar energy using a plurality of energy collection elements arranged in a planar array within a stationary base structure, each comprising: an energy capture unit with optical means of focusing directional sunlight parallel to its axis onto one or more sunlight-to-electricity converters within itself, and means of sensing divergence of its axis from the sun's direction; and an angular positioning unit that orients said capture unit about two nested axes by slidably mounting two arcuate tracks in opposed and perpendicular arcuate slots, a convex track within said energy capture unit and a concave track within said base structure, each said slot equipped with a drive apparatus that engages its respective track and moves the positioner along it. The invention provides methods for determining the shapes and arrangement of such elements so as to maximize aperture efficiency while preventing collisions of adjacent elements.

22 Claims, 32 Drawing Sheets

(51) Int. Cl.
| | |
|---|---|
| *F24J 2/18* | (2006.01) |
| *H02S 20/32* | (2014.01) |
| *H02P 5/68* | (2006.01) |
| *F24J 2/38* | (2014.01) |
| *F24J 2/54* | (2006.01) |
| *H01L 31/052* | (2014.01) |
| *H01L 31/042* | (2014.01) |
| *F24J 2/10* | (2006.01) |
| *F24J 2/07* | (2006.01) |
| *F24J 2/12* | (2006.01) |

(52) U.S. Cl.
CPC ..... *F24J 2002/109* (2013.01); *F24J 2002/1028* (2013.01); *F24J 2/07* (2013.01); *F24J 2/1047* (2013.01); *F24J 2/12* (2013.01); *F24J 2/38* (2013.01); *F24J 2/5424* (2013.01); *F24J 2002/385* (2013.01); *F24J 2002/5475* (2013.01); *H01L 31/052* (2013.01); *Y02E 10/47* (2013.01); *Y02E 10/52* (2013.01); *H02S 20/00* (2013.01); *H01L 31/0547* (2014.12)

(56) References Cited

U.S. PATENT DOCUMENTS

| | | | |
|---|---|---|---|
| 3,972,598 A | 8/1976 | Kunz | |
| 3,974,824 A | 8/1976 | Smith | |
| 3,995,933 A | 12/1976 | Crowhurst | |
| 4,002,159 A | 1/1977 | Angilletta | |
| 4,056,309 A | 11/1977 | Harbison et al. | |
| 4,069,812 A | 1/1978 | O'Neill | |
| 4,088,120 A | 5/1978 | Anderson | |
| 4,088,121 A | 5/1978 | Lapeyre | |
| 4,092,531 A | 5/1978 | Moss | |
| 4,106,484 A | 8/1978 | Dame | |
| 4,107,521 A | 8/1978 | Winders | |
| 4,111,184 A | 9/1978 | Perkins et al. | |
| 4,129,119 A | 12/1978 | Yoke | |
| 4,137,098 A | 1/1979 | Field | |
| 4,143,640 A | 3/1979 | Pierce | |
| 4,146,785 A | 3/1979 | Neale | |
| 4,153,474 A | 5/1979 | Rex | |
| 4,189,122 A | 2/1980 | Miller | |
| 4,200,472 A | 4/1980 | Chappell et al. | |
| 4,204,881 A | 5/1980 | McGrew | |
| 4,222,368 A | 9/1980 | Rost et al. | |
| 4,226,502 A | 10/1980 | Gunzler | |
| 4,269,168 A | 5/1981 | Johnson | |
| 4,282,529 A | 8/1981 | Speicher | |
| 4,285,330 A | 8/1981 | Shook | |
| 4,287,880 A | 9/1981 | Geppert | |
| 4,296,737 A | 10/1981 | Silk | |
| 4,304,218 A | 12/1981 | Karlsson | |
| 4,320,288 A | 3/1982 | Schlarlack | |
| 4,332,426 A | 6/1982 | Speicher | |
| 4,349,733 A | 9/1982 | Beam et al. | |
| 4,388,481 A | 6/1983 | Uroshevich | |
| 4,440,155 A | 4/1984 | Maloof et al. | |
| 4,489,709 A | 12/1984 | Balzer | |
| 4,495,408 A | 1/1985 | Mori | |
| 4,690,355 A | 9/1987 | Hornung et al. | |
| 4,691,075 A | 9/1987 | Murphy | |
| 4,870,949 A | 10/1989 | Butler | |
| 4,968,355 A | 11/1990 | Johnson | |
| 5,169,456 A | 12/1992 | Johnson | |
| 5,180,441 A | 1/1993 | Cornwall et al. | |
| 5,255,666 A | 10/1993 | Curchod | |
| 5,344,496 A | 9/1994 | Stern et al. | |
| 5,374,317 A | 12/1994 | Lamb et al. | |
| 5,498,297 A | 3/1996 | O'Neill et al. | |
| 5,882,434 A * | 3/1999 | Horne | 136/246 |
| 6,164,022 A | 12/2000 | Ishikawa et al. | |
| 6,276,359 B1 | 8/2001 | Frazier | |
| 6,531,990 B2 | 3/2003 | Verkerk | |
| 6,686,533 B2 * | 2/2004 | Baum et al. | 136/244 |
| 6,764,051 B2 | 7/2004 | Knight | |
| 6,911,950 B2 | 6/2005 | Harron | |
| 6,971,756 B2 | 12/2005 | Vasylyev et al. | |
| 7,240,674 B2 | 7/2007 | Patterson | |
| 7,825,327 B2 | 11/2010 | Johnson | |
| 2002/0008670 A1 | 1/2002 | Sharman | |
| 2003/0000567 A1 | 1/2003 | Lynn | |
| 2003/0202349 A1 | 10/2003 | Suehiro et al. | |
| 2004/0074490 A1 * | 4/2004 | Mills et al. | 126/600 |
| 2004/0150574 A1 | 8/2004 | Harron | |
| 2005/0034752 A1 | 2/2005 | Gross et al. | |
| 2005/0284468 A1 | 12/2005 | Pawlenko et al. | |
| 2006/0012896 A1 * | 1/2006 | Strieber | 359/853 |
| 2006/0220492 A1 * | 10/2006 | Greywall | 310/309 |
| 2006/0266408 A1 * | 11/2006 | Horne et al. | 136/246 |
| 2006/0283497 A1 | 12/2006 | Hines | |
| 2007/0039610 A1 | 2/2007 | Head et al. | |
| 2007/0070531 A1 | 3/2007 | Lu | |
| 2007/0079864 A1 | 4/2007 | Gronet | |
| 2007/0188876 A1 | 8/2007 | Hines et al. | |
| 2007/0193620 A1 | 8/2007 | Hines et al. | |
| 2007/0215197 A1 | 9/2007 | Buller et al. | |
| 2007/0256726 A1 | 11/2007 | Fork et al. | |
| 2008/0000516 A1 | 1/2008 | Shifman | |
| 2008/0001059 A1 | 1/2008 | Wang | |
| 2008/0087276 A1 | 4/2008 | Zhao | |
| 2008/0142078 A1 | 6/2008 | Johnson | |
| 2008/0251113 A1 * | 10/2008 | Horne et al. | 136/246 |
| 2009/0065045 A1 * | 3/2009 | Tsadka et al. | 136/246 |
| 2009/0126774 A1 * | 5/2009 | Taylor et al. | 136/244 |
| 2009/0314280 A1 * | 12/2009 | Banerjee | 126/606 |
| 2011/0142332 A1 | 6/2011 | Hoffman | |

FOREIGN PATENT DOCUMENTS

| | | |
|---|---|---|
| EP | 0936365 A1 | 8/1999 |
| GB | 2343206 A | 2/2001 |
| JP | 01-179453 | 7/1989 |
| JP | 2003-258291 | 9/2003 |
| JP | 2004-153202 | 5/2004 |
| JP | 2004-526117 | 8/2004 |
| JP | 2012-513102 A | 6/2012 |
| WO | 2002-070966 | 12/2002 |
| WO | WO 2008/039509 A2 | 4/2008 |
| WO | 2010/065794 A2 | 12/2009 |
| WO | WO 2009/149450 A1 | 12/2009 |

OTHER PUBLICATIONS

International Search Report mailed on Sep. 29, 2009, for International Application No. PCT/US2009/046606.
U.S. Appl. No. 12/966,317, filed Jun. 8, 2009.
International Search Report and Written Opinion mailed on Apr. 28, 2012, and International Preliminary Report on Patentability mailed on Jun. 26, 2012, for Application No. PCT/US09/66661.
Japanese Office Action mailed on Nov. 26, 2013, for Japanese Patent Application No. 2011-539714, 11 pages.
Chinese Office Action mailed on Oct. 23, 2013, for Chinese Patent Application No. 200980156021.X, 8 pages.
State Intellectual Property Office of People's Republic China Search Report for Chinese Patent Application No. 200980156021.X, mailed on Oct. 15, 2013, 2 pages.
EP Search Report for EP Application No. EP09831154.1, mailed on Jan. 27, 2014, 10 pages.
Japanese Office Action for Application No. 2011-539714, mailed on Aug. 5, 2014, 8 pages.
Chinese Second Office Action for Application No. 200980156021.x, mailed on Jun. 19, 2014, 7 pages.

* cited by examiner

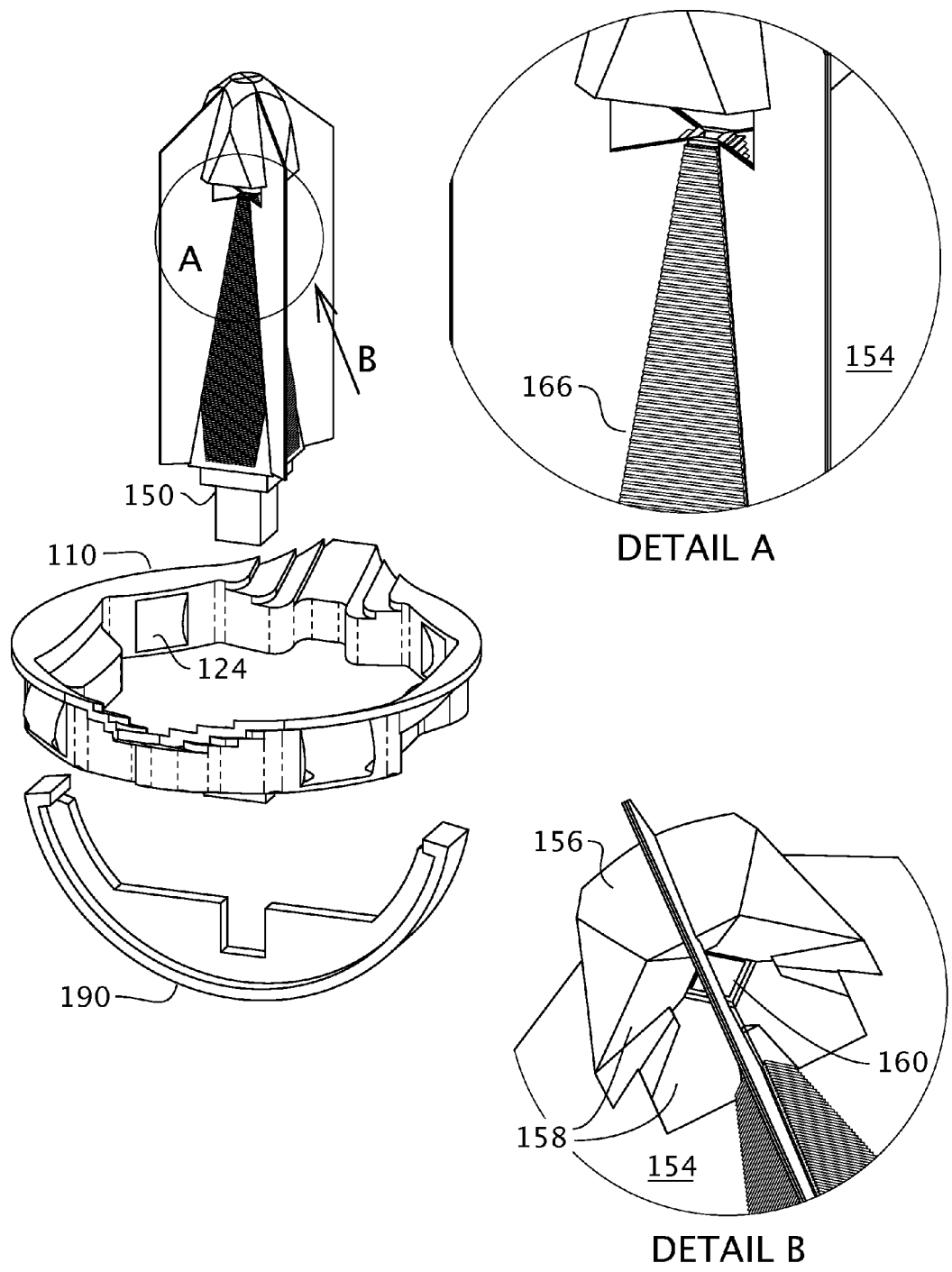

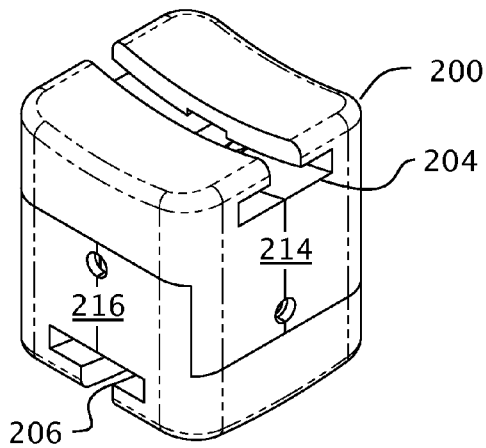
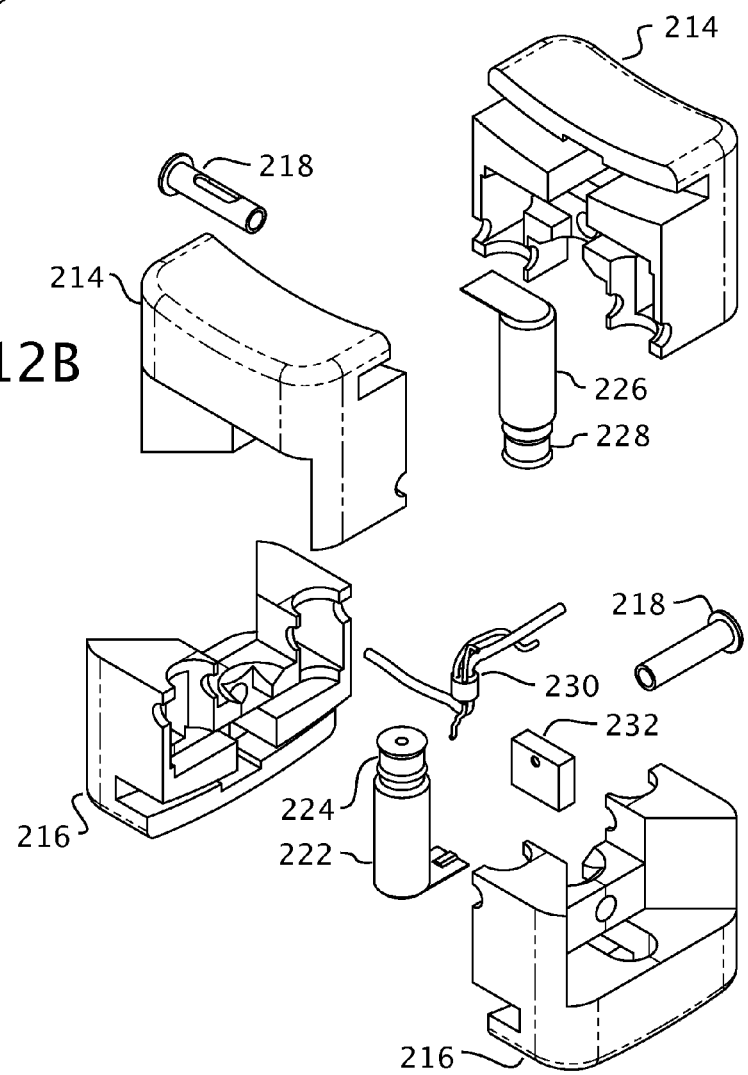

FIG. 15
FIG. 16
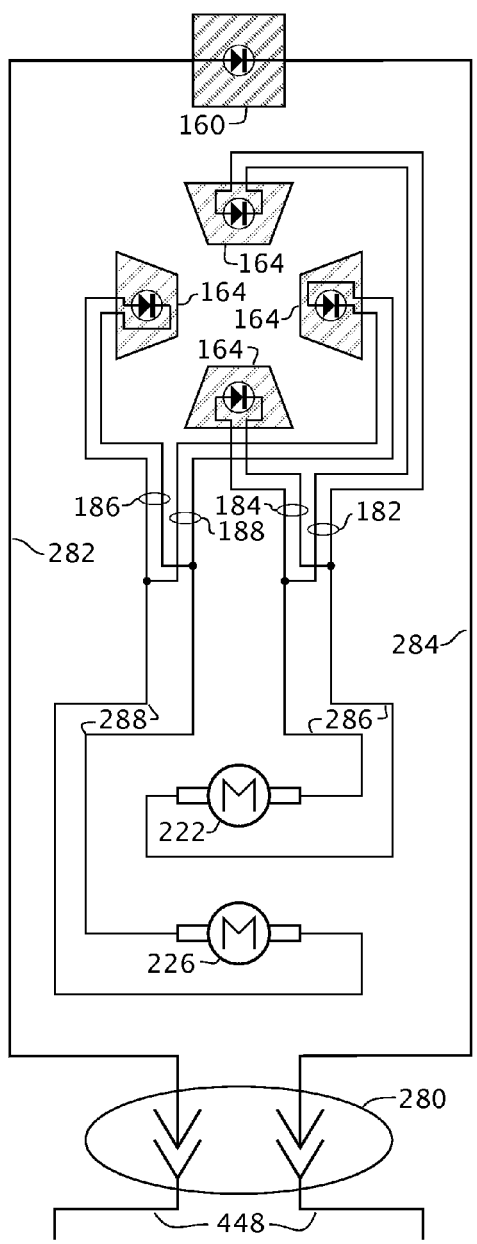
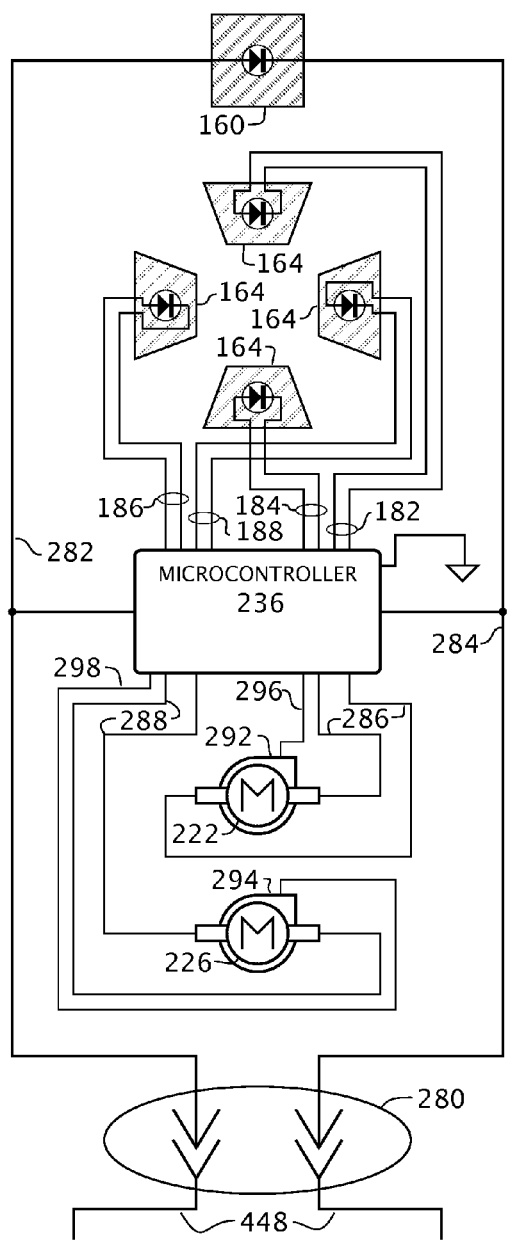

FIG. 26A
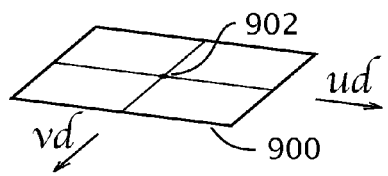
FIG. 26B
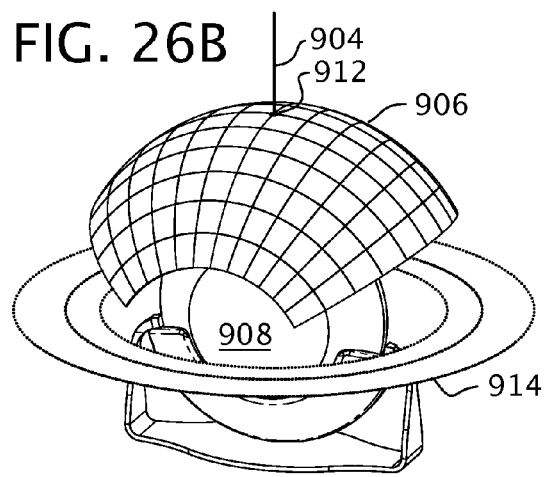
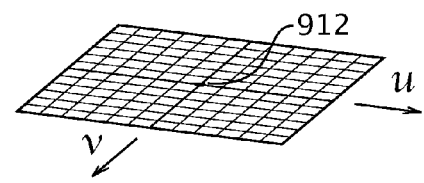
FIG. 26C
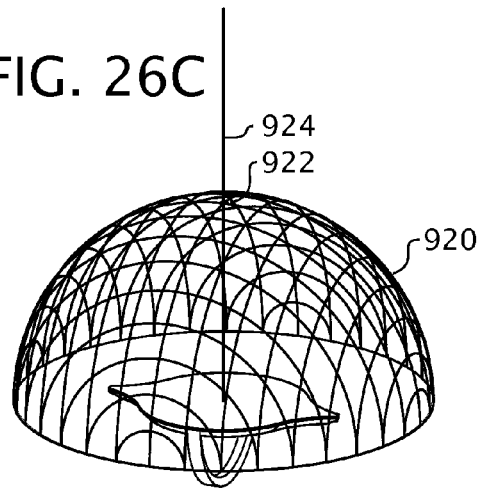
FIG. 26D
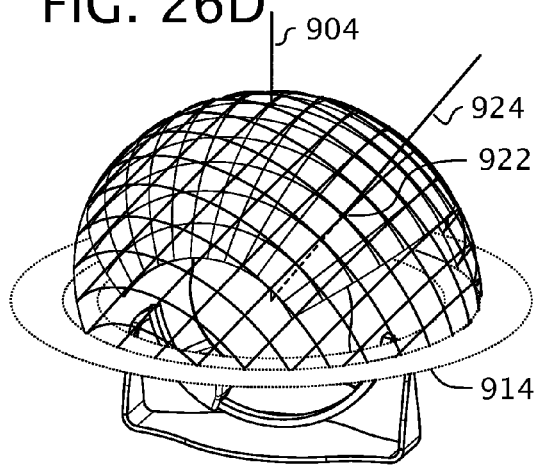

FIG. 30
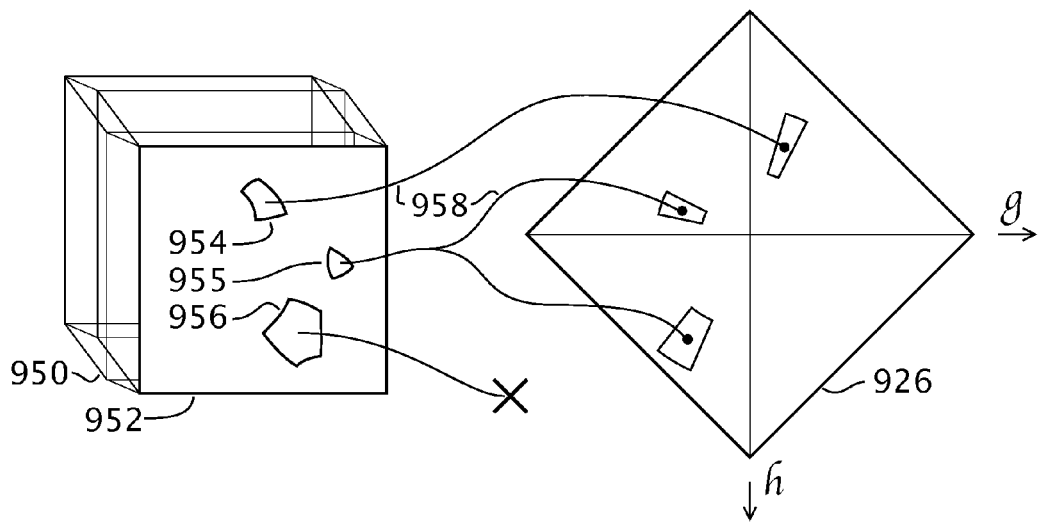
FIG. 31
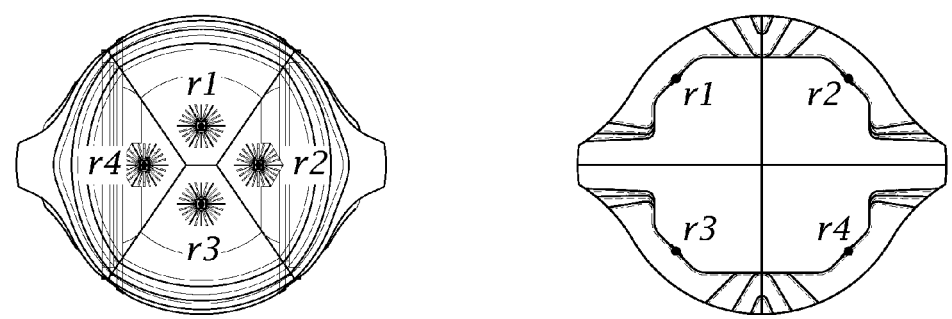
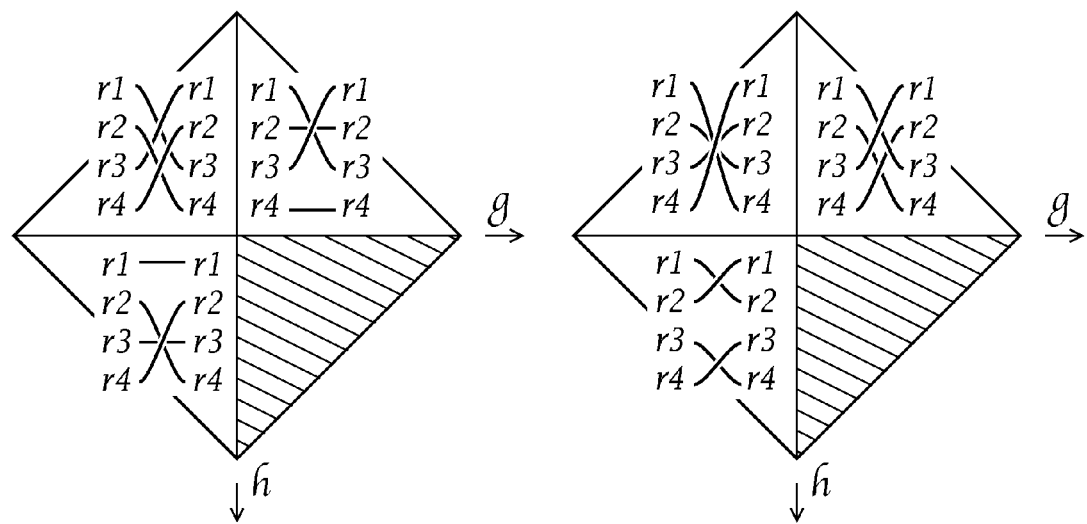

SOLAR ENERGY COLLECTION SYSTEM

PRIORITY

Claim of Priority Under 35 U.S.C. §119

The present Application claims benefit of U.S. Provisional Patent Application having Ser. No. 61/200,835, filed Dec. 3, 2008, by the present inventor.

FIELD OF THE INVENTION

The present invention relates to methods of collecting solar energy using optical concentration with moving modules that track the sun, and, in particular, such methods which are suitable for the construction of concentrating photovoltaic systems having form factors and installation features similar to conventional solar panels.

BACKGROUND

Approaches to converting sunlight to electricity using photovoltaic cells are primarily of two types: those that use flat panels of photovoltaic cells mounted in fixed orientations, and those that use tracking optical elements to concentrate sunlight onto smaller areas of photovoltaic cells. The latter type potentially affords higher power densities and lower equipment costs by reducing the quantities of photovoltaic materials required, thereby enabling the economic use of high-efficiency photovoltaic cells, whose cost in non-concentrating panels would be prohibitive. For example, triple junction photovoltaic cells employing type III-V semiconductors have recently demonstrated sunlight-to-electricity conversion efficiencies of greater than 40 percent, but the cost-effective terrestrial applications of such cells typically require their use at concentrations of greater than one hundred suns.

To date, concentrating photovoltaic applications have been largely limited to industrial-scale operations. Although a number of recently-developed concentrating systems use optical elements of relatively small size and are described as having a low profile, they remain poorly suited for the single largest sector of the market for products that convert sunlight to electricity—the rooftop panel market.

Most rooftop solar panel installations mount the panels in fixed orientations, where they have a low profile and unobtrusive appearance. A solar collector that combined the superior economics of concentrating high-efficiency photovoltaics with the ease of installation and maintenance, and aesthetics of conventional solar panels would provide unprecedented value to the owner and user. The requirement that a concentrating solar collector using tracking optical elements have a fixed shape with a thin profile like a conventional panel necessitates the use of many such optical elements mounted within a fixed base structure.

Proposed systems incorporating arrays of optical elements in arrangements contained within relatively thin fixed slabs mechanically link the elements to an adjustment mechanism shared by multiple elements. Such approaches have several drawbacks including that failures in the mechanical linkages between elements can cause tracking failures of multiple elements, that the mechanical linkages introduce a source of tracking errors due to imprecisions in the mechanism, and that servicing individual elements is complicated by having to manipulate mechanical connections.

Objectives of the present invention include providing methods of creating solar energy collection systems that:

Make economical the manufacture of concentrating elements of sufficiently small dimensions that arrays of such can be configured in panel-like enclosures.

Provide exceptional sun tracking accuracy, allowing the maximization of the concentration ratio and thereby minimizing the quantity of photovoltaic material required.

Maximize the aperture efficiency of the concentrating optical system by minimizing losses of light to spaces between the array elements.

Provide exceptional operational robustness and allow easy maintenance and servicing by making the removal and re-installation of elements simple and straightforward.

Overview of the Invention

The invention enables the creation of solar energy collection systems using optical means to concentrate sunlight by factors of hundreds or thousands and direct it to high-efficiency photovoltaic (PV) cells through the use of two-axis self-orienting energy collection elements, each element comprising: an energy capture unit that performs the functions of sensing light orientation, concentrating light, and converting it to electricity; an angular positioning unit that supports and tilts the capture unit about two perpendicular axes; and a base unit that supports the angular positioning unit; where the said energy collection elements are arranged within slab-like enclosures, possibly having form-factors similar to conventional solar panels.

Each energy collection element individually tracks the sun through an angular positioning system that controls the capture unit's rotation about each of two perpendicular tilt axes through a combination of optical, photoelectric, electronic, and mechanical means. The energy capture unit, through its optical and light-sensing geometry, provides information in the form of electricity about deviations of the energy capture unit's axis from the direction of the sun. That information is used to control the movement of motors in the angular positioning unit that move the unit about two perpendicular axes—one relative to the base and one relative to the capturer—and thereby rotate the capturer in a direction that reduces said deviations.

Because each element has dedicated angular positioning drive motors which are controlled by the optical system in the energy capturer of same element, the drive system is stateless: no matter how an element is initially positioned, it will orient itself to focus directional light, and will be unaffected by the functioning of other elements in the panel. The close mechanical relationship between the optical system providing information to the orienting electronics and the angular positioning unit providing mounting and positioning control of that system minimizes opportunities for the introduction of tracking errors.

Each element's energy capturer is mounted by its angular positioner to rotate about two nested perpendicular axes where the outer axis is parallel to the base platform, and the inner axis is perpendicular to the outer axis and perpendicular to the normal axis of the capturer.

The invention describes a family of shapes that are used to define the profiles of the energy capture optics which, mounted by angular positioners in close-packed arrays, provide optimal aperture efficiency over a wide range of tilt angles without restricting the individual movement of the capturers. The shapes tile the plane when facing in the array's normal direction, yet, when moved by their angular positioners, remain entirely within the respective volumes defined by the extension in said normal direction of their respective planar tiles.

The invention further provides methods of designing the optics of energy capture units so that their profiles closely approximate said plane-tiling shapes, and their volumes of motion under the control of the angular positioner do not intersect the volumes of motions of their neighbors, thereby precluding collisions between array elements irrespective of their individual motions.

Whereas some embodiments of energy collection elements rely on the geometry of the capture unit's optics and PV cells to produce electricity that directly powers the positioning motors to effect capturer-orienting motion. Other embodiments employ algorithms and data sets generated in advance and installed on microcontrollers in each element to determine the capturer-orienting motion of the positioning motors based on the pattern of output levels of the capturer's PV cells. The use of such algorithms enables embodiments of the later type to rely entirely on the energy-collection PV cells for data from which to infer orienting information, eliminating the need for dedicated direction-sensing light sensors.

BRIEF DESCRIPTION OF THE DRAWINGS

FIG. 9 shows an exploded view and detail views the first embodiment's energy capture unit.

FIG. 12 shows details of the angular positioning unit.

FIG. 15 shows an electrical schematic of an energy collection element of the first embodiment having only simple analog circuits.

FIG. 16 shows an electrical schematic of an energy collection element having a microcontroller.

FIG. 26 shows representations of the spaces of movement and light direction displacement.

FIG. 30 illustrates an inverse map from response space to displacement space.

FIG. 31 illustrates a method of folding the map of the response space to the displacement space to reduce the data required to represent the map.

DETAILED DESCRIPTION OF THE PREFERRED EMBODIMENTS

The present detailed description of the preferred embodiments begins with an overview of a first embodiment of the invention. It then explains the method for determining the shapes of energy capture units of this and other embodiments that simultaneously provides optimal aperture efficiency through dense packing of the units while removing the possibility of their collision. With that background, the description returns to the first embodiment to explain its function in detail. Next, the description examines three additional embodiments of the invention whose energy capture units are segmented into several capture components, and algorithms by which the microcontrollers of individual elements of such embodiments orient their capture units using the data from their capture components. Finally the description covers two embodiments of the invention whose features depart significantly from the first four embodiments.

The Radiant Energy Collection Element

Figure 1:
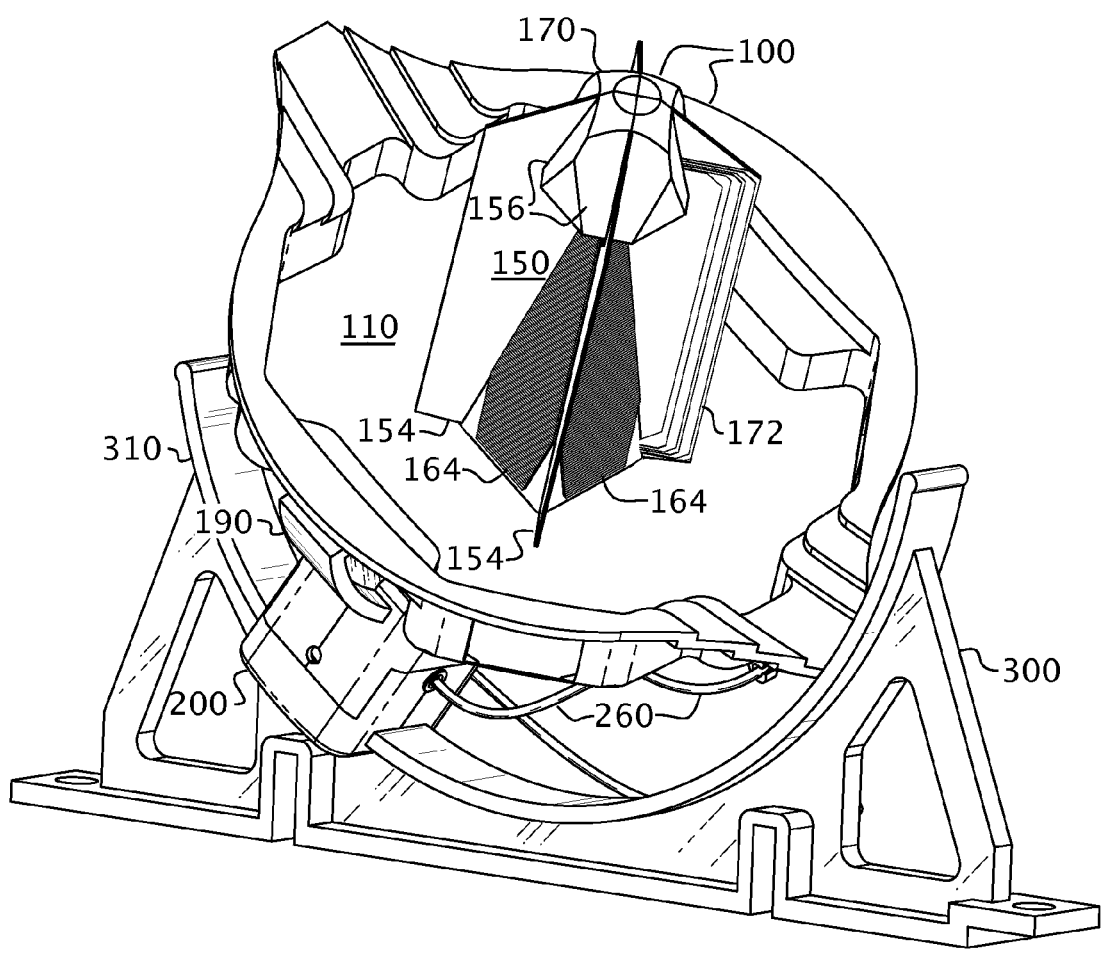
FIG. 1 shows a view of a single self-orienting energy collection element of the first embodiment of the invention.
Figure 2:
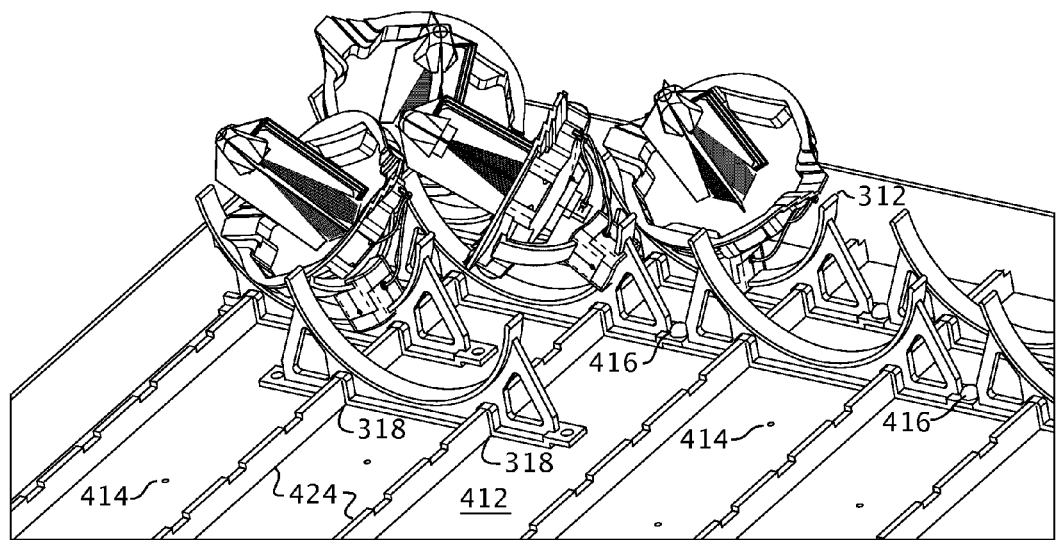
FIG. 2 shows elements such as shown in FIG. 1 being installed inside of a panel.
Figure 3:
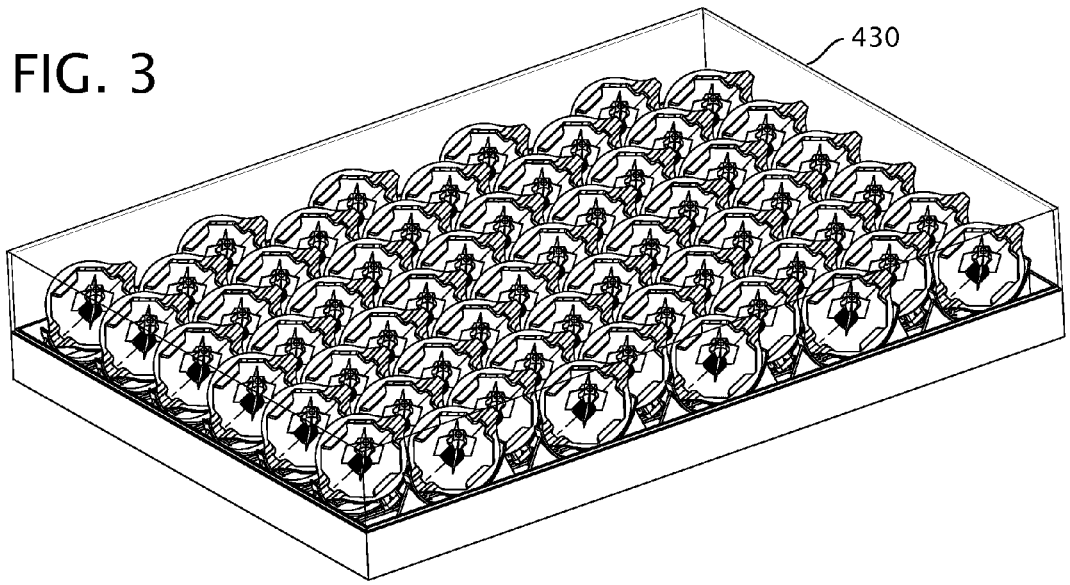
FIG. 3 shows a complete panel, housing sixty identical elements of the type shown in FIG. 1.

FIG. 1 shows a single energy collection element, FIG. 2 shows several such elements being installed into a panel, and FIG. 3 shows a panel with its full compliment of sixty elements.

The element comprises three rigid assemblies that move relative to each other: the radiant energy capture unit 100, the angular positioning unit 200, and the base unit 300. For brevity, the energy capture unit is also referred to as the energy capturer or simply capturer, and the angular positioning unit is also referred to as the angular positioner or simply positioner. The angular positioner simultaneously slidably mounts arcuate tracks of the energy capturer and the base unit and thereby provides for partial rotations about two perpendicular and intersecting axes—an outer axis of partial rotation of the positioner relative to the base and an inner axis of partial rotation of the capturer relative to the positioner. The capturer's arcuate track is a convex T-rail arc 190 extending through about 170 degrees of arc. The base's arcuate track is a concave T-rail arc 310 extending through about 170 degrees of arc. Because each of the two arc-engaging slots of the positioner spans about 25 degrees of angular distance, the angular range of motion afforded by each arc is about 145 degrees.

The angular positioner uses power and information in the form of electricity carried to it through the cable 260 to effect its sliding along the mounting arcs, through the action of a pair of micro gearmotors mounted inside of the positioner. The range of travel of the positioner relative to the base and to the capturer is limited by small risers in the mounting arcs, which act as bumpers encountered by the positioner's walls at the maximum angular displacements.

The energy collection element captures radiant energy by optically concentrating it onto the small high-efficiency photovoltaic cell, or power PV cell, 160, which converts the electromagnetic energy to electrical energy.

The energy capturer consists of three main parts: the tower 150, the reflector dish 110, and the convex mounting arc 190. Whereas the overlapping functions of these parts are explained in subsequent sections, this section highlights some of their salient features.

The tower is composed primarily of a solid aluminum alloy piece with polished surfaces including the paraboloid facets 156, the fins 154, and the interior facets 158 (seen in FIG. 9). This piece supports a pyramid of thin broad sensor PV cells 164 each with a transverse grating to intercept low-angle incident light.

Mounted within the concave underside of the of the block 170 forming the tower's top is the power PV cell 160 (seen in FIG. 9) facing down the capturer's optical axis, and located at the shared foci of the paraboloid surfaces comprising the reflector dish 110. Electrical power is conducted from said PV cell to the base of the tower by the flat cable 172 laminated to one of the tower fins.

The reflector dish has a mirrored upper surface of precise shape that is highly reflective, specular, and corrosion-resistant. It is mated with the tower via a square socket and is designed with the tower to assure precise alignment between features in the two parts. The convex mounting arc is a separate piece, attached to the tower at the tower's base.

Optically, the reflector is composed of five parabolic mirrors, sharing a common focal point and having different focal lengths. Seen from along its optical axis, the reflector is a symmetrical patchwork of different paraboloids, with risers between the patches, parallel to the optical axis, fully foreshortened to appear as thin lines between the patches.

Panel Assembly

The energy collection elements are designed to be installed inside of panel-like enclosures designed to accept them. FIG. 2 shows the base portion of an enclosure into which elements are being installed by a two-stage process of first installing elements' base units and then installing their positioning and capture units.

At least six base units have been installed by sliding their rail slots 318 onto the notched base rails 424, and attaching the ends of adjacent components to the enclosure base plate 412 using fasteners 416 that engage holes 414 in the said base plate.

Four complete elements have been installed by mounting pre-assembled modules combining energy capture and angular positioning units onto the concave arcs of installed base units. This mounting action entails aligning angular positioner's outer slot with the base module's track and applying force to the opposite side of the positioner to make it slide onto the track. A small bump at the end of the track 312 prevents the positioner from sliding off of the track once it has been installed. To complete an element's installation, the plug at the end of the module's electrical cable is mated with a socket in the base.

FIG. 3 shows a completed panel containing 60 elements, in which all of the elements' energy capturers are aligned with their optical axes parallel to direction of sunlight. The elements are protected from the weather by the transparent cover 430.

Optimal Packing Shapes

The present invention describes energy capture systems comprising close-packed arrays of identical energy collection elements, where the elements cannot collide however they move individually, and the elements essentially tile the plane when their optical axes coincide with the array's normal axis. The invention thus simultaneously achieves two important goals: It maximizes the aperture efficiency of arrays of two-axis tracking elements by minimizing the fraction light falling between elements to very small fractions of total incident light; and it assures that the elements will not collide, without requiring that motion of the elements be synchronized and without imposing constraints on the range of motion of the elements. The invention does this, in part, by providing a method of generating plane-tiling shapes that, when moved about the two perpendicular axes of rotation such as provided by the invention's angular positioner, sweep out volumes each of whose projection onto that plane coincides with the shape.

The following description of the invention's shape-generation method starts by examining the failure of common plane-tiling shapes to provide collision-avoiding volumes of motion.

Figure 4A:
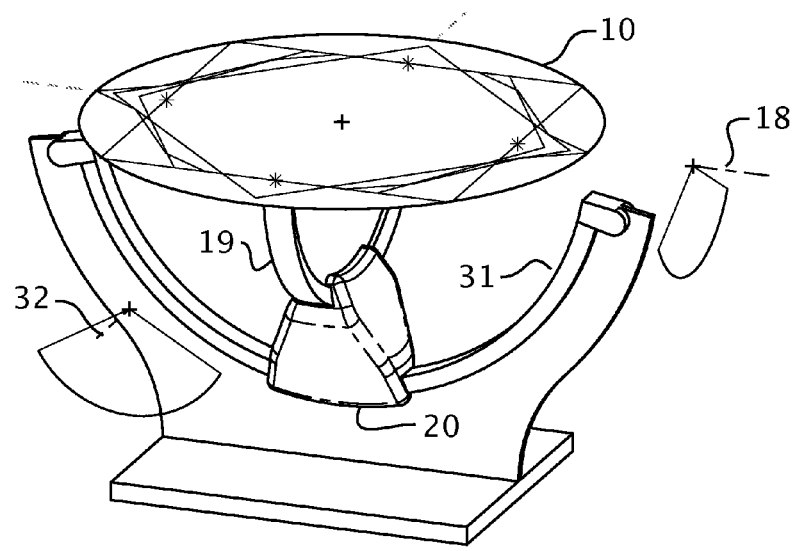
FIG. 4 shows projections of outlines of various plane-tiling shapes as they are tilted by increments about the two axes of motion provided by the invention's angular positioner.

FIG. 4 shows a study of the clearance profiles of a set of tiling shapes moved by the invention's angular positioner. FIG. 4A shows an embodiment of the angular positioner 20 mounting a plate 10 on which are inscribed the outlines of five plane-tiling polygons. The positioner is designed to move through 120 degrees of angular motion about the inner rotation axis 18 of the plate, which it mounts through inner arc 19 and through 120 degrees of angular motion about the outer rotation axis 32 of the base, which it mounts through outer arc 31. The embodiment is shown in a position where both of the angular displacements from the normal angles are zero, and the plate lies in the tiling plane.

Figure 4B:
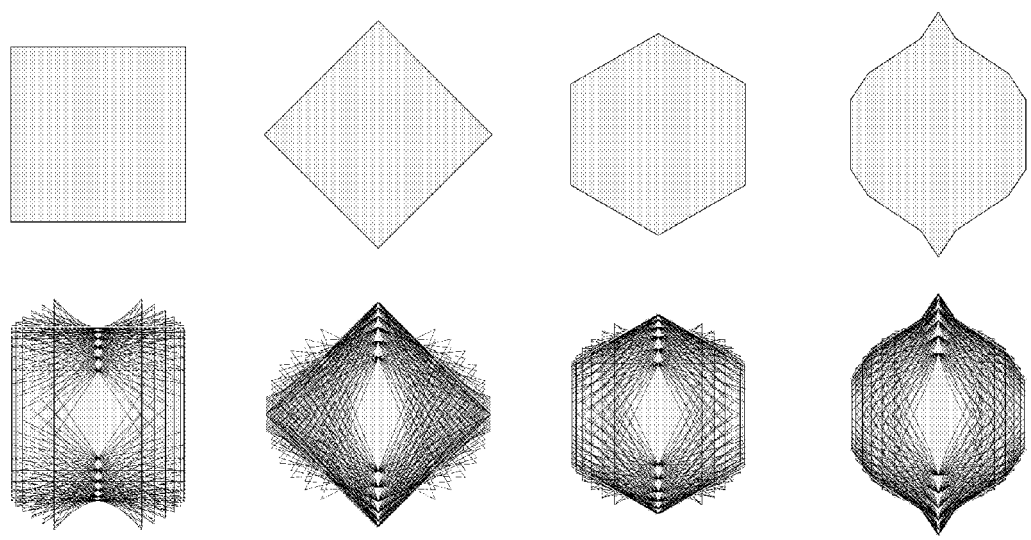

FIG. 4B shows the results of a simulation in which, for each of the four tiling polygons, a trace estimating its clearance profile is generated by accumulating the perpendicular projections of the polygon's outline onto the tiling plane for each combination of inner and outer axis rotations away from the respective normal angles in the range of minus 60 to 60 degrees in 10-degree increments.

The simulation shows that none of the four polygons is suitable as a profile for an energy capture unit that enables the creation of arrays that tile the plane while simultaneously ensuring collision-free operation of neighboring elements. The portions of the projected polygon outlines that lie outside of the profile of the polygon in the tiling plane overlap the cells of adjacent polygons in a tiling arrangement and represent possibilities of collisions between adjacent elements. However, the fourteen-sided polygon on the right shows the least overlap with adjacent cells, and is a rough approximation to profiles in the one-parameter family of tiling profiles whose clearance profiles do not overlap shown in FIG. 5.

FIG. 5 illustrates a method for generating planar shapes each of which tiles the plane and sweeps out a volume, when moved by the invention's angular positioner, whose projection onto the tiling plane is identical to the shape. The method starts by defining the following four independent variables:

Xd: displacement between shapes within each row

Yd: displacement between rows

Rm, Xm: shape edge-to-boundary distances

Ignoring Rm and Xm, which are relatively small values that provide a buffer between adjacent shapes, the ratio of Yd and Xd, called the elongation ratio, defines a one-parameter family of shapes, that ratio being at least sin of one-third PI (approximately 0.866).

Given values of Xd and Yd, the coordinates of the center points of two adjacent shapes, P1 and P2, are established, placing P1 at the origin. The two shapes are in successive rows, the second row being displaced from the first row along the X axis by one-half the distance between adjacent shapes in the same row. The boundary radius R is one half the distance between P1 and P2. The convex arc radius Rp is R minus Rm, and the concave arc radius Rm is R plus Rm. The half shape width Xr is half of Xd minus Xm. and the half shape height Yr is a value of greater than R and less than Yd.

Since the shape has two planes of symmetry, it is sufficient to describe one quadrant of the shape, and use reflections through the X and Y axes to build the whole shape. The shape's edge profile is substantially parallel to the boundary curve 90. Its edge is composed of the concave arc 91 centered at P2, the convex arc 92 centered at P1, and, if the elongation ratio is greater than 0.866 the line segment 93 parallel to the Y axis at distance Xr, and, optionally, the curve 94 at distance Yr from the origin.

Elongation ratios (Yd divided by Xd) that result in useful shapes for the invention range from the minimum value of 0.866 up to a value of perhaps 1.5.

Figure 5A:
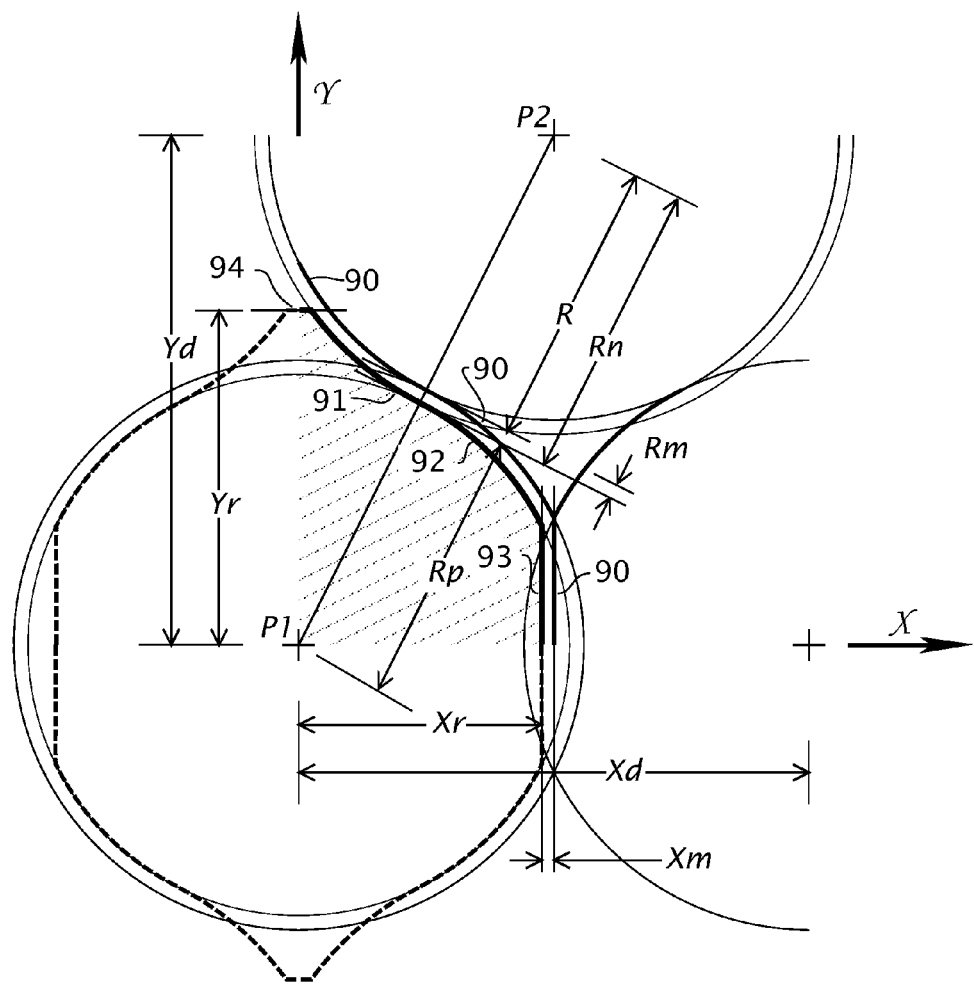
FIG. 5 shows a method of generating a one-parameter family of tiling shapes having non-intersecting volumes of motion when moved by the angular positioner.
Figure 5B:
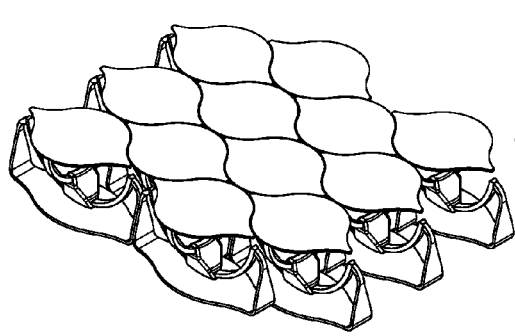
Figure 5C:
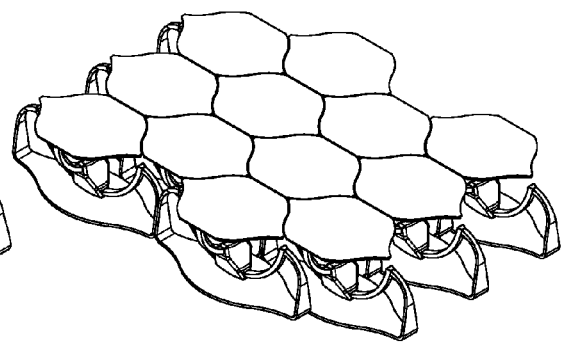

FIGS. 5B and 5C show two arrays whose elements were defined using elongation ratios of 0.866 and 1.0, respectively. The values of the shape parameters for the two arrays are as follows:

|  | Xd | Yd | Rm | Xm | R |
|---|---|---|---|---|---|
| FIG. 5A | 100 | 86.6 | 0.5 | — | 100 |
| FIG. 5B | 100 | 86.6 | 0.5 | 0.5 | 111.8 |

The upward-facing plates of the elements in the two figures represent energy capture units which could be of any of a variety of designs, but the flat surface represents the portion of the unit lying in its aperture plane, which is that plane perpendicular to the unit's axis of symmetry and optical axis or axes, and containing element's inner rotation axis.

Of the embodiments enumerated in this description, the first, third, fourth, and fifth use the shape geometry based on the minimum elongation ratio of 0.866, whereas the second and sixth use the shape geometry based on the elongation ration of 1. However, any of the embodiments could be adapted to use profile shapes based on different elongation ratios. The elongation ratios of 0.866 and 1.0 each have features that may be deemed desirable. The ratio of 0.866 results in close-packed arrays with a regular hexagonal geometry in which the six neighbors of each element lie at the same distance. The ratio of 1.0 results in close-packed arrays in which the distance between elements in a row equals the distance between rows.

Shapes of the one-parameter family described by the invention have two planes of reflective symmetry and tile the plane with the cmm symmetry group. This family is part of a larger family of plane-tiling shapes of this symmetry group, compact arrays of which have non-intersecting volumes of motion when mounted by the angular positioner. However, the present one-parameter family describes the subset of this larger family whose shapes have the shortest profile edge for a given area, and are therefore the most useful as profiles of solar energy collectors in compact arrays.

FIG. 6 shows the volumes swept out by a tiling shape 12, suitable for an energy capture unit, where the shape is generated by the method described above with an elongation ratio of 0.866. FIG. 6A shows the shape tilted slightly away from the normal angles on both the inner and outer mounting axes. FIG. 6B shows the volume swept out by the unit's energy capturer as it rotates through its angular range of motion about its inner mounting axis 18. FIG. 6C shows the volume swept out by the moving parts of the unit—the unit's tiling shape 12 and its angular positioner 20—as the unit rotates through its angular ranges of motion about both its inner mounting axis 18 and outer mounting axis 32. FIG. 6D shows four of the volumes of FIG. 6C arranged in a close-packed array, showing that the volumes are non-intersecting.

Figure 6A:
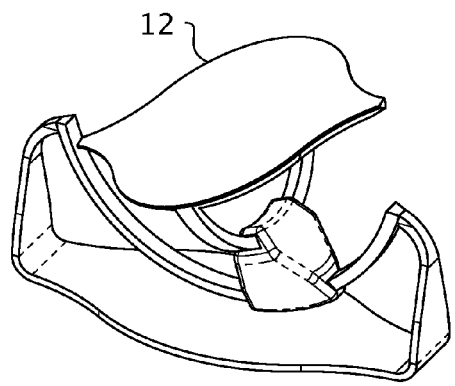
FIG. 6 shows the volumes swept out by a tiling shape defined in FIG. 5 as it moves about one and both tilt axes of the angular positioner.
Figure 6B:
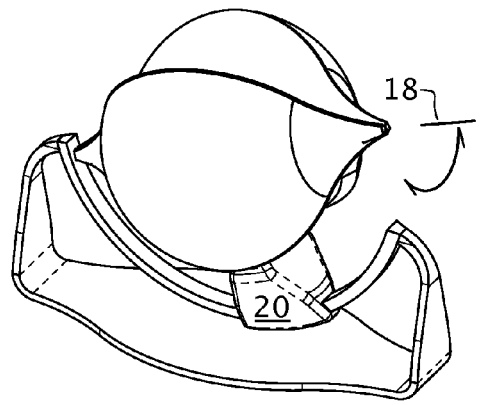
Figure 6C:
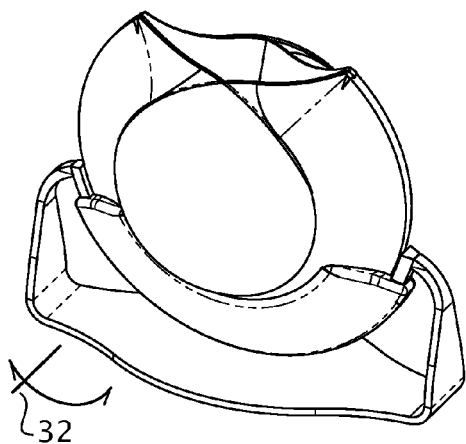
Figure 6D:
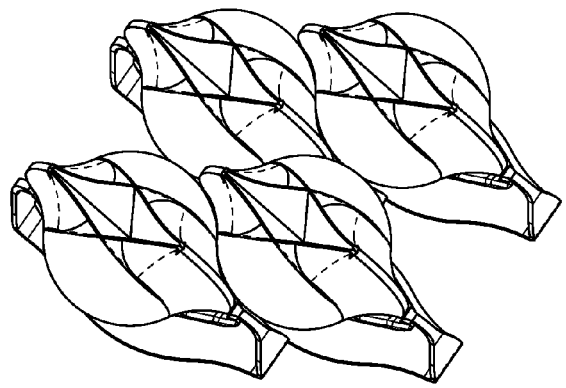
Figure 7A:
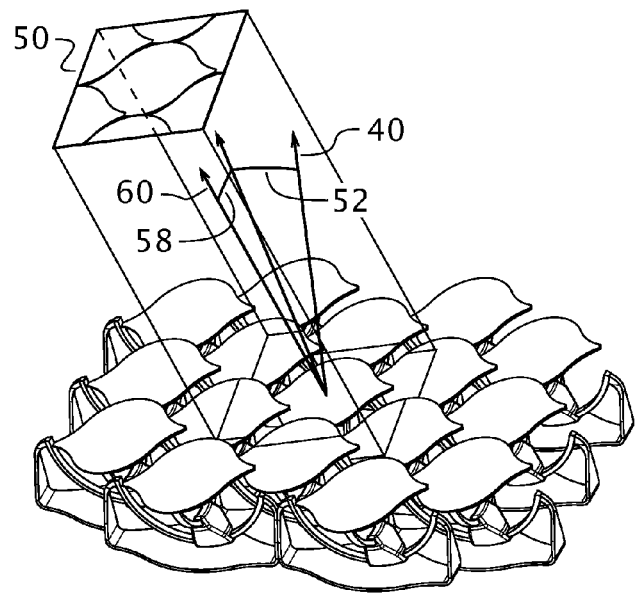
FIG. 7 shows a simulation depicting the aperture efficiency of an instance of the invention for various angular displacements of incident light from the array's normal axis.
Figure 7B:
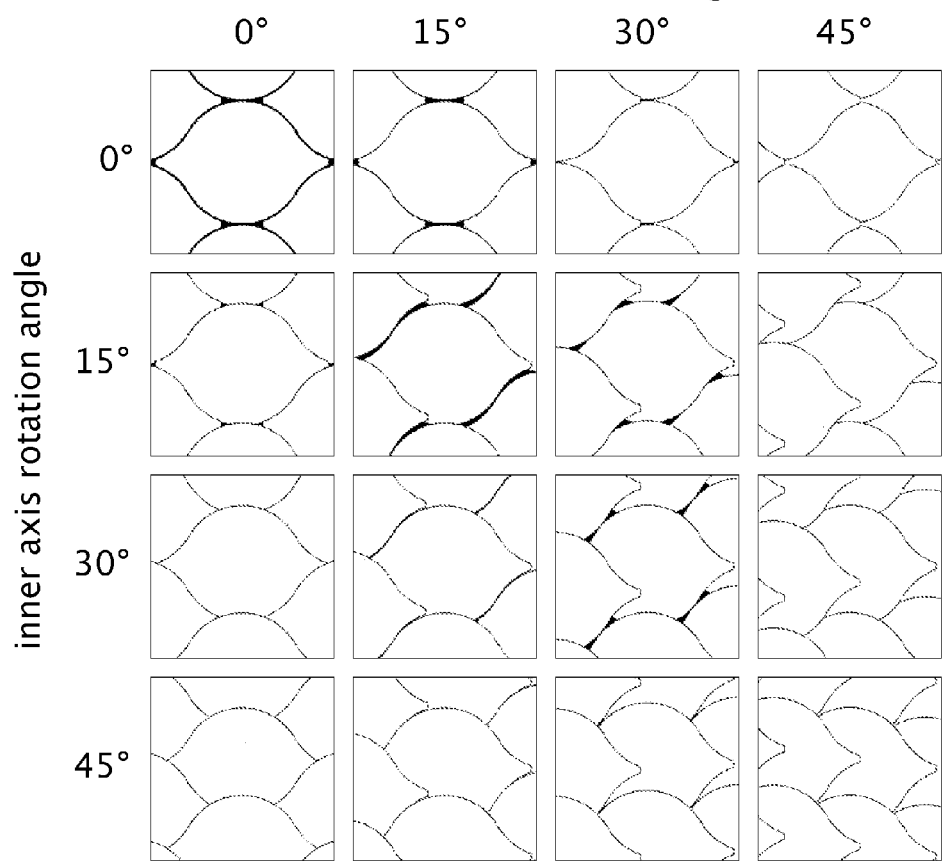

FIG. 7 shows a simulation measuring the aperture efficiency of an array of units such as shown in FIG. 6A over a range of tilt angles about the inner and outer mounting axes. FIG. 7A shows the method of generating the projections shown in the table of FIG. 7B. The projection plane 50 and the aperture planes of the capturers of the various modules are oriented perpendicular to the direction of the sun 60, which is displaced from the normal direction of the array 40 by the inner axis rotation 58 and the outer axis rotation 52. The narrow black areas seen in some of the projections shown in FIG. 7B for axis rotations of 30 degrees and less represent aperture losses, which, in all cases, are less than 5 percent.

Reflector Design

FIG. 8 shows the method used to design the reflector of the first embodiment. Since the reflector has two planes of mirror symmetry, the method describes the generation of a single quadrant of the reflector, which is subsequently mirrored by the planes of symmetry to build up the entire reflector. FIG.

8A shows a set of five paraboloid sections 115, 116, 117, 118, and 119 sharing a common focal point 112. These paraboloid sections are clipped by the shell 102 which represents one-quarter of the surface of the capturer clearance volume shown in FIG. 6B. The reflector can include only portions of the paraboloid sections that lie inside of the clearance volume.

Figure 8A:
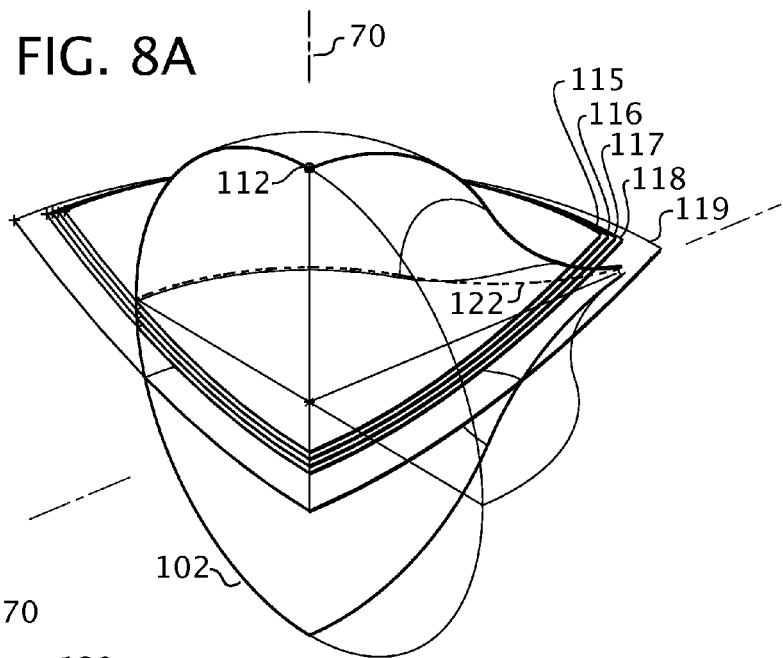
FIG. 8 shows the method of designing the reflector part of the first embodiment's energy capture unit.
Figure 8B:
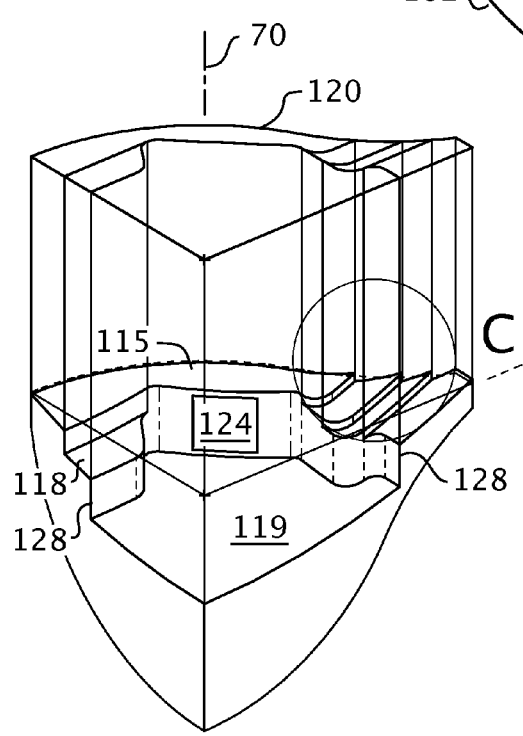

FIG. 8B shows the upper surface of a quadrant of the reflector generated by combining patches of the five clipped paraboloid sections shown in FIG. 8A with risers connecting the edges of the patches. A map 120 in the plane perpendicular to the reflector's optical and normal axis 70 defines a set of six regions where each region is projected onto one of the five paraboloid sections to define a paraboloid patch, indicated in FIGS. 8B and 8C by the number of its parent paraboloid section. These patches are joined along their edges by the vertical riser surfaces 128. The riser surfaces are composed of planar and cylindrical faces parallel to the reflector's optical axis and everywhere having a normal direction separated by 90 degrees or less from the direction to that axis. This design assures that, when the reflector's optical axis is parallel to the direction of incident light, the risers will not obstruct light and thereby reduce the unit's effective aperture: they will neither prevent incident light from reaching the paraboloid surfaces, nor prevent light reflected by the paraboloid surfaces from reaching the receiver 160, positioned along the optical axis.

The selection of the shapes of the regions that define the paraboloid patches is guided by several criteria, including:
1. Keeping the outer edge of the reflector within a small distance from the clearance profile curve 122.
2. Making the average focal length of the reflector as long as possible.
3. Accommodating indentations in the rear side of the reflector to provide space for the inner mounting arc and other features.

Figure 8C:
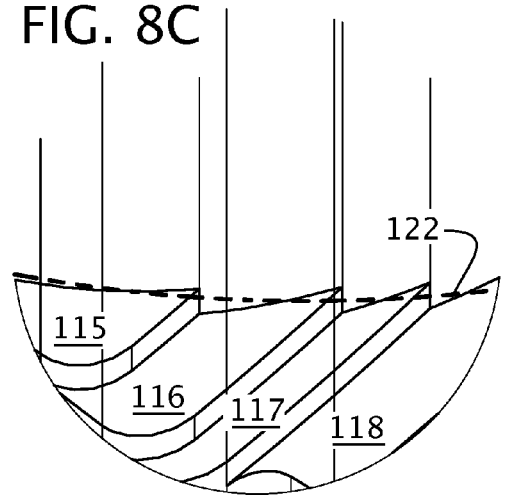

The detail view of FIG. 8C shows how the first criterion is met. Each paraboloid intersects the clipping shell 102 at a height determined, at any given point, by the paraboloid's focal length and by the distance of that point from the optical axis 70. Paraboloid 115, having the shortest focal length, intersects the shell on the highest curve, with each succeeding paraboloid intersecting the shell along a lower curve. Since the distance from the optical axis increases as one moves into the tapered portion of the reflector shown in FIG. 8C., paraboloids of successively greater focal lengths must be selected to intersect the shell at a given height, such as that of the midplane containing the profile curve 122. The Map 120 is designed so that each paraboloid patch meets the clipping shell within a narrow range of vertical displacement from the mid-plane.

The second criterion guiding the design of the reflector is to maximize the average focal lengths of paraboloid surfaces comprising the reflector. Whereas the selection of paraboloid patches that extend to the edge of the reflector is constrained by the requirement that the patches intersect the clipping shell near the mid-plane, patches from paraboloids of longer focal lengths can be selected for the reflector's interior. The use of a large patch of paraboloid 119 for the reflector's interior instead of paraboloids of shorter focal length means that much of the light reaching the receiver will have a smaller incidence angle than would otherwise be the case.

An additional advantage provided the selection of a longer focal-length paraboloid for the reflector's interior is that it allows the elongation of the risers between patches, providing space for features such as the recessed mirrors 124.

In summary, the present method is used to design reflective optics to fit within the invention's plane-tiling profile shapes by combining multiple paraboloids having the same optical axis and focus but different focal lengths by using a map of contiguous regions in a plane perpendicular to the paraboloids' optical axis to slice patches from the different paraboloids which are then joined along their edges by riser surfaces perpendicular to said optical axis. This method is easily generalized to apply to the design of reflectors that have multiple optical sectors, each defined by an aperture and optical axis, such as the reflector of the second embodiment shown by FIGS. 18 and 19, or the reflector of the fourth embodiment shown by FIG. 22.

A similar method is used to design refractive optics to fit within the invention's plane-tiling profile shapes and corresponding collision-avoiding volumes of motion. It involves combining multiple lens sections having the same optical axis and focus but different focal lengths, where the extents of the lens sections are determined by the capture unit's volume of motion. The use of such a method is illustrated for a lens having four optical sectors in the case of the third embodiment, shown by FIG. 21.

FIG. 9 shows exploded and detail views of the first embodiment's energy capture unit. The unit is separated into its three principal components: the tower 150, the reflector 110 and the convex mounting arc 190. The circular region marked A is magnified as DETAIL A to show the refractive grating 166 covering the directional PV patches.

The magnified view in the lower-right corner labeled DETAIL B shows the recess in the tower block containing the power PV cell 160 and the mirrored inward-facing facets 158 and the mirrored outward-facing facets 156

Figure 10:
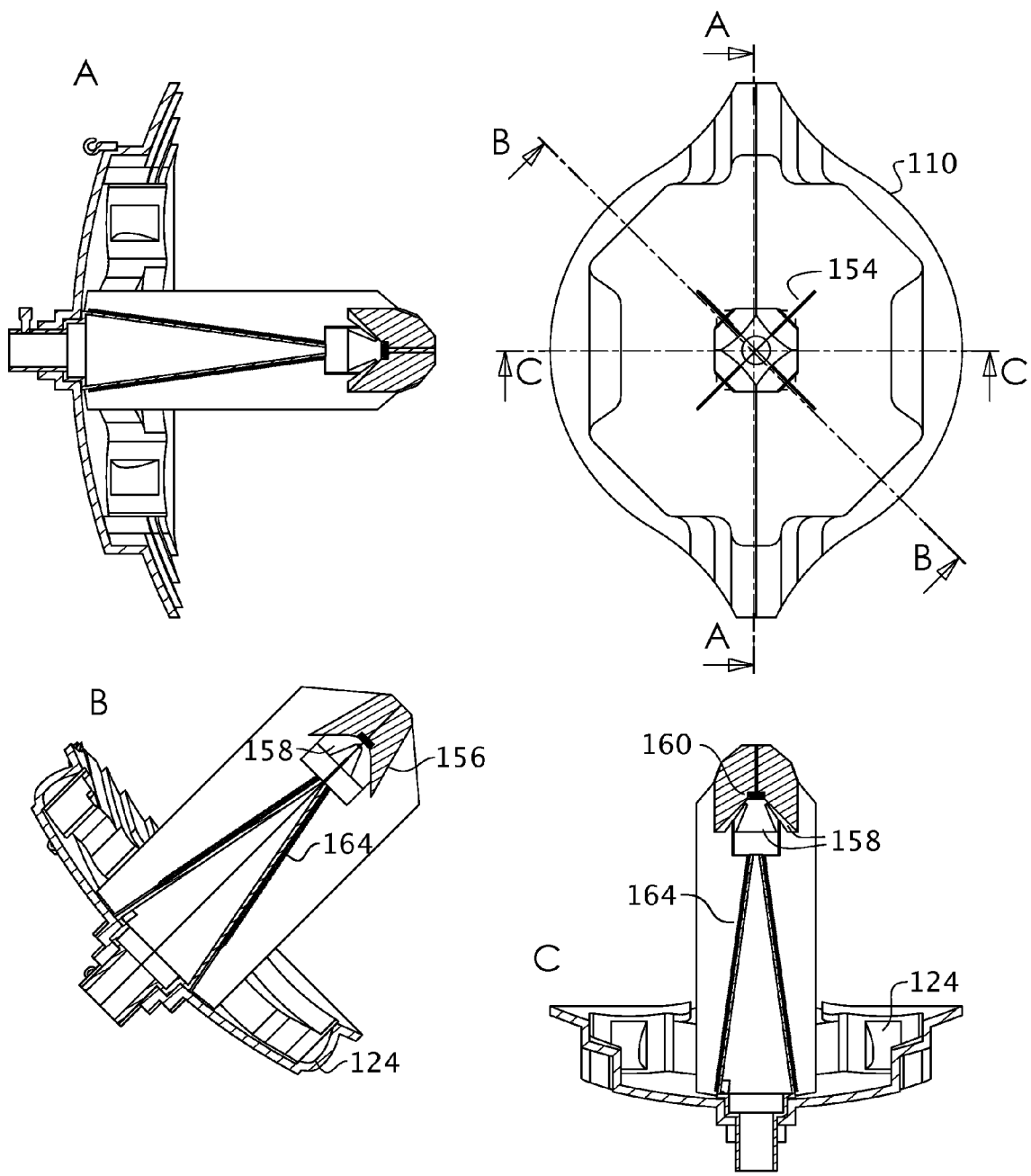
FIG. 10 shows a view down the normal axis of the energy capture unit, and three longitudinal sections of the unit.

FIG. 10 shows a view of the capture unit down its normal axis, and the three indicated longitudinal sections. Section B is cut just forward of the optical axis, so two of the fins 154 are seen in profile.

FIG. 11 shows the paths of representative light rays falling on an element's energy capture unit. FIGS. 11A and 11B show the diagonal section indicated by B in FIG. 10, and FIGS. 11C and 11D show the section indicated by C in FIG. 10. In all four figures, incident light is parallel to the vertical axis of the page, whereas the unit's optical axis tilted away from that direction about the axis perpendicular to the page by four different angles: 0 degrees in FIG. 11A, 0.5 degrees in FIG. 11B, 2 degrees in FIG. 11C, and 20 degrees in FIG. 11D.

Figure 11A:
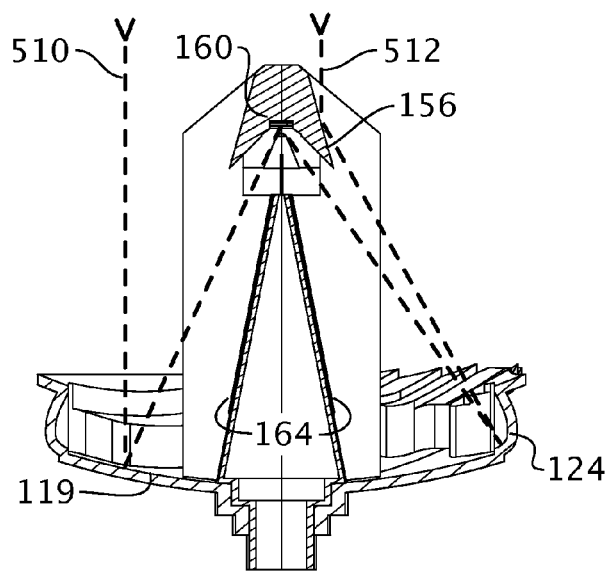
FIG. 11 shows the paths taken by representative light rays striking the energy capture unit.
Figure 11B:
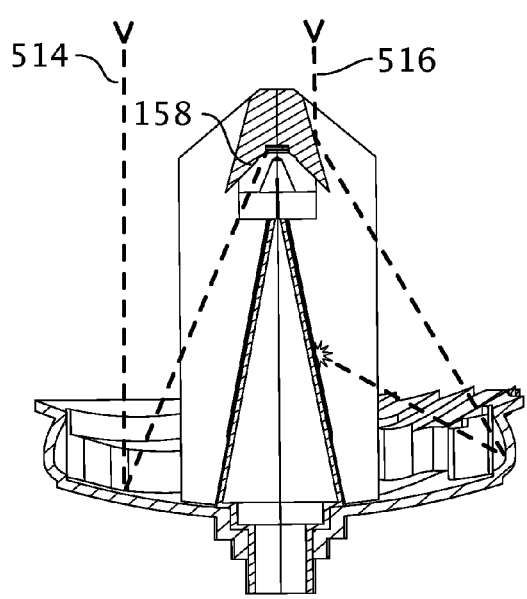

When the unit's optical axis is parallel to the direction of incident light, as in FIG. 11A, the various paraboloid surfaces of the reflector reflect incident light to the power PV cell 160. Light ray 510 is reflected by the paraboloid surface 119 to the power PV cell 160. Light ray 512 is first reflected by tower block facet 156 then by the lower portion of the recessed mirror 124 to the power PV cell. The sensor PVs 164 lie precisely in the shadow of the tower block When the unit's optical axis diverges only slightly from the direction of incident light, as in FIG. 11B, much of the light reflected by the reflector's surfaces still reaches the power PV cell, while other light begins to strike one or two of the sensor PVs 164. Light ray 514 is reflected by paraboloid surface 119 toward the power PV cell, possibly reflecting off of the interior tower block facet 158 before reaching the cell. Light ray 516 is first reflected by the tower block facet 156 then by the middle recessed mirror 124 to the sensor PV 164. Because of the curvature of the cupped surface of the recessed mirror, a slight increase in the height of the point of reflection results in a large change in the angle of reflected light.

Figure 11C:
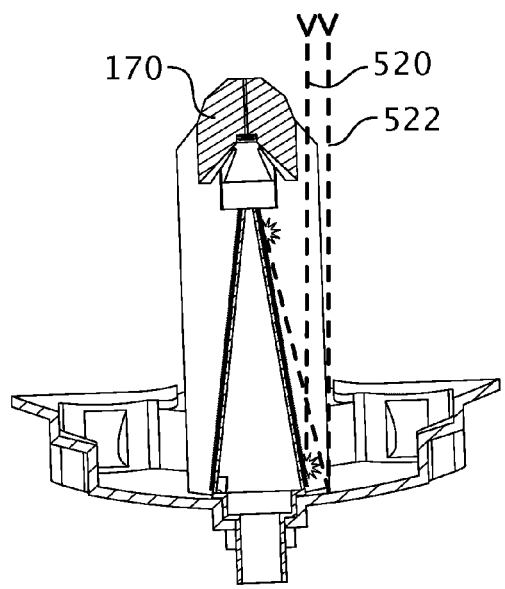

When the unit's optical axis diverges more from the direction of incident light, as in FIG. 11C, light reaches the sensor PVs via two kinds of routes. Light ray 520, passing just to the side of the tower block 170 strikes the sensor PV 164 directly. Light ray 522 is reflected by the paraboloid surface 119 to the upper portion of the sensor PV 164. Although both of these light rays reach the sensor PV via very high angles of incidence, the transverse grated surface covering the PV assures that much of the light is captured and absorbed by the PV.

Figure 11D:
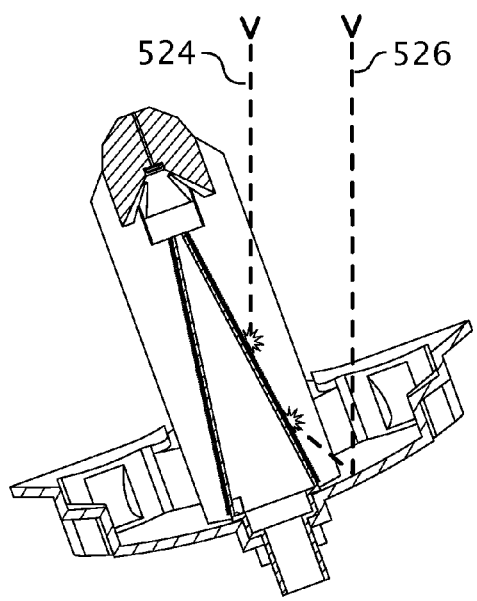

When the unit's optical axis diverges still more from the direction of incident light, as in FIG. 11D, light continues to reaches the sensor PVs via two kinds of routes, but the amount of light incident on the PVs increases. Light ray 524, passes directly to the sensor PV 164. Light ray 526 is reflected by the paraboloid surface 119 to the lower portion of the sensor PV.

Angular Positioner

The two-axis angular positioner 200 has two arcuate slots, an upper one 204 that slidably mounts the convex track 190, and a lower one 206 that slidably mounts the concave track 310.

Each of said positioner's arcuate slots is equipped with a motor-driven roller that engages the slot's respective track along the perimeter of the track's flanged edge. The slot 204 has the roller 224, driven by the micro gearmotor 222, and the slot 206 has roller 228 driven by the micro gearmotor 226.

Wires bundled in the wire harness 230 connect the electronic components inside of the positioner through various communicating cavities. FIG. 12B shows a microcontroller 232 such as found in the version of the embodiment described in FIG. 16.

The positioner's body is composed of four molded pieces: two identical upper halves 214, and two identical lower halves 216. The positioner is assembled by inserting components, such as the drive motors and wires, into cavities in the upper and lower halves, mating the respective halves, sliding the resulting top and bottom assemblies together, and finally locking the complete assembly by inserting the lock nipples 218 into lateral holes in the assembly. External cables 260 and 262, shown in FIGS. 1 and 2, enter the positioner through the lock nipples.

The angular positioner provides a protective enclosure for the gearmotors and electronics while simultaneously supporting the solar energy capture unit and providing angular positioning of it relative to the base unit. Its articulation with the base is such that it can be removed by sliding it off the end of the base-anchored concave track.

Other embodiments of the angular positioner may modify the manner by which a drive engages its track. A drive may be equipped with a pinion gear and the track with communicating teeth, and a servomotor to allow an element's microcontroller to record of angular distance traveled and hence infer angular position. Or a drive may have a roller with longitudinal ridges that provide better traction on the track's surface.

Figure 13:
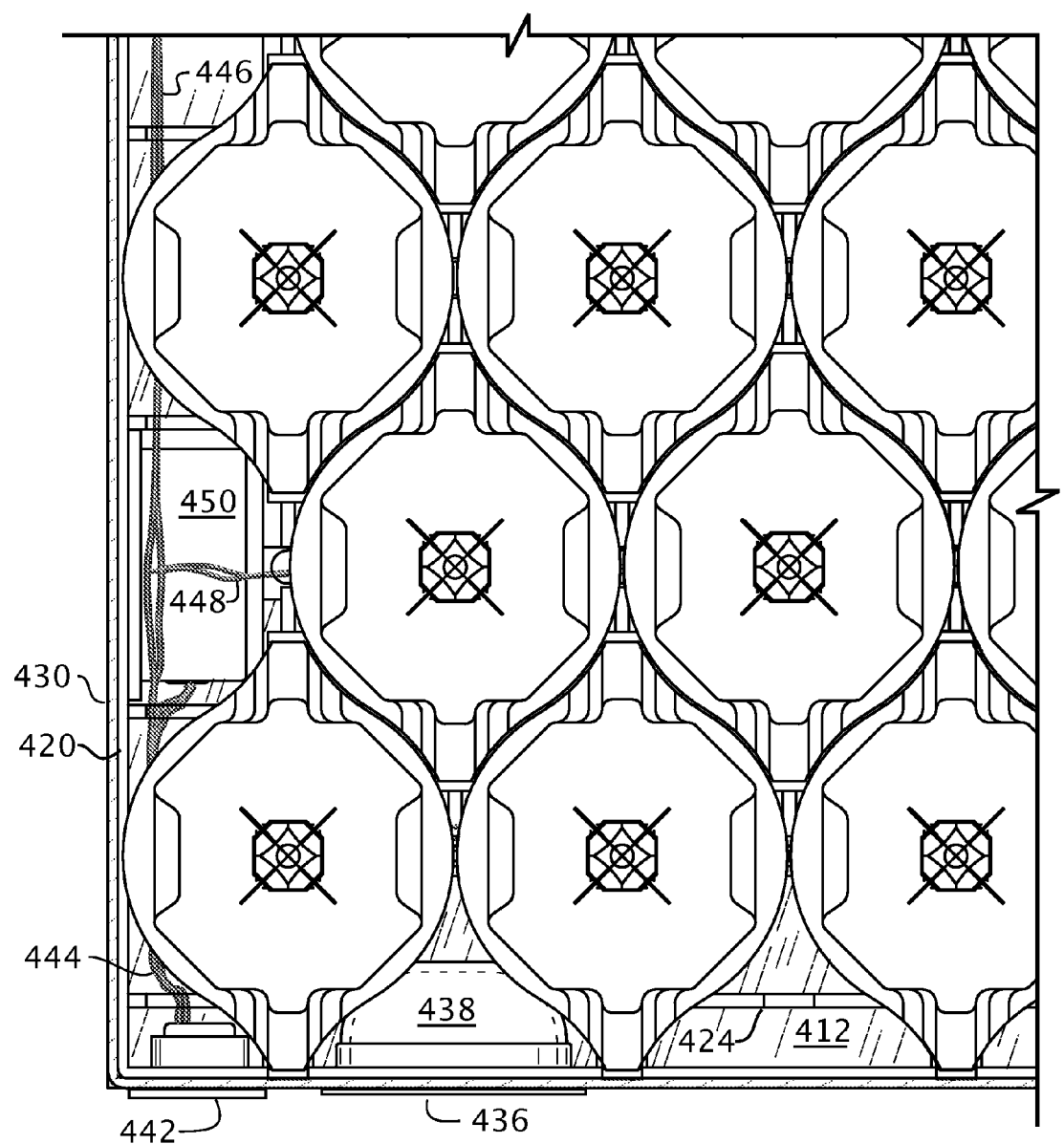
FIG. 13 shows a detail view of the corner of a panel containing energy collection elements of the invention's first embodiment.

FIG. 13 shows details of a portion of a panel of the first embodiment in which all of the energy capturers are oriented in the normal position. The view is a section just below the broad top face of the transparent cover of the panel enclosure 430. The section plane slices through the shallow side walls of said cover, which extend down from said face around the panel's perimeter to meet the opaque base side walls 420.

The intake port 436 is situated along the bottom edge of the panel. Equipped with filter 438, it can either be used to equalize pressure in a panel that is otherwise sealed from outside air, or can be used in conjunction with an exhaust fan (not shown) which draws air through the panel from the intake filter and exhausts it through an exhaust port. The exhaust port may be ducted for delivery of warmed air to an application such as building heating.

The row wires 448 connect the outputs of each element within a row in parallel, and the backbone wires 446 connect said row wires either in parallel or in series to the panel microcontroller 450. The main output wires 444 conduct the cumulative electrical power of all the elements, and connect said microcontroller to the electrical connector 442, mounted on the panel's exterior. A chord with an electrical connector, not shown, that mates with said connector, is used to supply electrical current generated by the panel to an external load.

Electronics of First Embodiment

Figure 14:
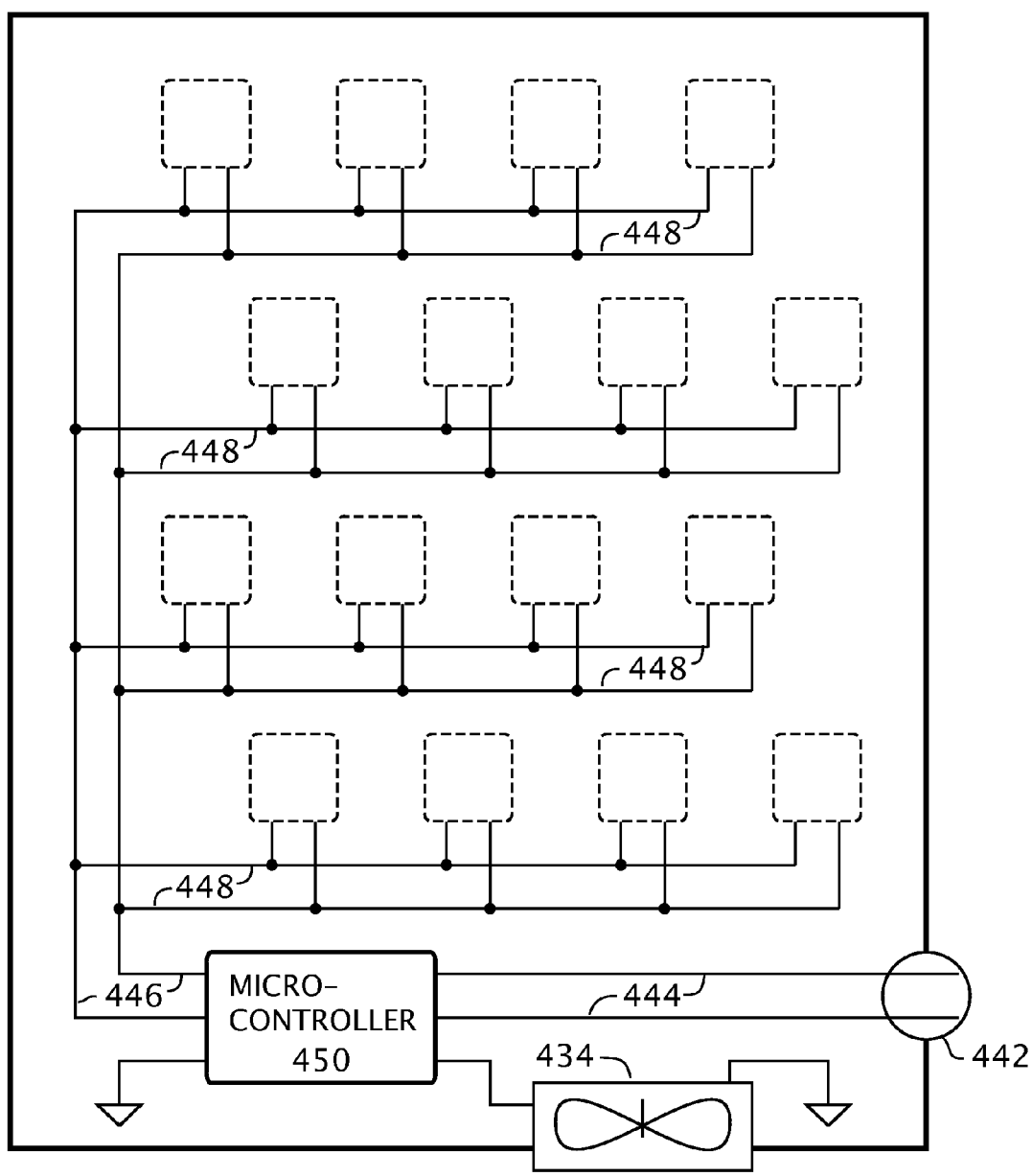
FIG. 14 shows an electrical schematic of a panel.

FIG. 14 is an electrical schematic of the panel shown in FIG. 13, simplified to show only sixteen elements. Electrical schematics of the elements, which are truncated and indicted by dashed squares in FIG. 14, are shown in FIGS. 15 and 16.

FIGS. 15 and 16 are electrical schematics of elements of two variants of the first embodiment, where FIG. 15 shows an element with a simple pair of analog circuits that implements the element's self-orienting behavior, and FIG. 16 shows an element whose function is augmented by a microcontroller 236.

This description first examines the common features of the two circuits and then examines their individual features. The element circuits are connected to their respective row wires 448 by the connectors 280. The conductors 282 and 284 carry current produced by the power photovoltaic cell 160 and, in the case of the circuit shown in FIG. 16, provide power to the element microcontroller 236. The drive motors 222 and 226 are powered by the conductor pairs 286 and 288, respectively, Turning now to the specifics of the schematic in FIG. 15, it has three circuits, one that caries the power from the power PV cell 160 to the connector 280, one that connects the one pair of opposite-facing sensor PV cells 164 to the drive motor 222 and another that connects the other pair of opposite-facing sensor PV cells 164 to the drive motor 226.

Turning how to the specifics of the schematic in FIG. 16, it has several electrical circuits connected to the microcontroller 236 When the power PV cell 160 is not producing current, a voltage bias between conductors 282 and 284 is maintained through the action of the panel microcontroller 450 sufficient to power the element microcontroller 236 and the drive motors controlled by it.

The drive motors 222 and 226 and have axles equipped with the rotary switches 292 and 284, respectively, which are connected to the element microcontroller 236 by conductors 296 and 298, respectively. By monitoring the voltages on the drive motor conductor pairs 286 and 288 in conjunction with the signals from the rotary switches, the element microcontroller can record the direction and distance of travel of each of the rollers mounted on said drive motor axles.

The radiant energy collection units in the microcontroller-augmented system depicted in FIG. 16 have the ability to track the sun even when their light orientation sensors are shadowed by adjacent elements early or late in the day, and when the sun is occluded by clouds; thus extending the hours of operation per day, and reducing or eliminating delays in resuming tracking following brief occlusions of direct sunlight.

For the purpose of this description, primary tracking is defined as tracking performed directly in response to electrical potentials or currents generated by the light orientation sensor, and secondary tracking is defined as all other forms of tracking. Secondary tracking is necessarily under the control of the element and/or panel microcontrollers, whereas primary tracking may or may not be mediated by said microcontrollers.

During primary tracking, a collection element's microcontroller records rotations of the drive motors as described above, and thereby infers the angular displacements of the element's two mount axes over time. The microcontroller uses this data to calibrate a model which predicts the position of the sun as a function of time of day and time of year and the angular displacements of the mount axes that will keep the element's axis of symmetry pointing at the sun as a function of time. Then, during secondary tracking, said microcontroller supplies currents to the drive motors to effect the displacements of said mount axes, as measured by motor rotations, to keep the element's energy capture unit oriented.

Switching between primary and secondary tracking is determined by the electrical potential between the conductors 282 and 284: when said potential is above a certain threshold, due to concentrated sunlight falling on the power PV cell 160, the element tracks in primary mode, and when said potential is below that threshold, the element tracks in secondary mode.

The microcontroller may be equipped with pass-through switches that allow currents from the light-orientation sensors to directly power the drive motors. The microcontroller may default to such operation if it detects a malfunction. During pass-through operation, electrical currents on the conductor pairs 182 and 184 are combined with reverse parity to produce current on the conductor pair 288, and electrical currents on the conductor pairs 186 and 188 are combined with reverse parity to produce current on the conductor pair 286.

The primary function of the sensor PVs 164 is to provide information on the direction of incident light relative to the capture unit's optical axis for use by electrical circuits to restore alignment between the unit's optical axis and the direction of incident light. That is the only function of the sensor PVs in the element embodiment whose electrical circuit is shown in FIG. 15. However, the sensor PVs may also be used to generate electrical power when the sun is obstructed and directional light required to focus on the power PV cell is absent in element embodiments with the requisite electronics show as shown in FIG. 16. Although the maximum amount power generated by the sensor PVs is small compared to that generated by the power PV when the unit is focusing directional light, electricity from the sensor PVs could be used for functions such as providing power for the element microcontrollers and motors and panel microcontroller when the sun is obstructed.

Embodiments with Multiple Energy Capture Components

This section describes three additional embodiments of the invention. These embodiments share with the first embodiment pictured in FIGS. 1 through 3 and 8 through 12 the following underlying features of the invention:

Arrays of substantially identical elements, each with the means to independently sense its orientation relative to the sun and adjust its orientation accordingly, are arranged inside of panel-like enclosures.

The element's energy capture unit is designed according to the method illustrated in FIG. 5 allowing the units to be arranged in the optimal close-packed arrangement wherein their capture units essentially tile the plane when oriented in their normal positions, yet cannot collide with each other no matter how they move individually.

The optics of the energy capture unit is designed such that the aperture of each unit extends to the edge of its profile shape in its aperture plane Orienting of the energy capture unit is effected by the angular positioning unit, which engages perpendicular arcs in the capture unit and base.

Information from photovoltaic cells in the capture unit is used to determine directions of angular movement needed to bring the unit into alignment with directional incident light.

These additional embodiments differ from the first embodiment primarily in the configuration of optics and photovoltaic elements in the energy capture unit, and some also demonstrate variations in the shape of the angular positioning unit and configuration of mounting arcs.

All of the remaining embodiments depart from the first embodiment's reliance on dedicated sensor PV cells by incorporating multiple power PV cells into the capture units and relying on their outputs for deriving orienting information. The energy capture unit of the first embodiment shown in FIG. 1 has a single power PV cell situated along the capture unit's single optical axis, and four sensor PVs arranged around that axis. In contrast, the energy capture unit of each of the four remaining embodiments has multiple power PV cells, each having its own optical axis. When a capture unit of one of these embodiments is aligned with directional light, the light within its aperture is captured by any of several energy capture components, each having an aperture segment which is some fraction of the unit's aperture, an optical axis parallel to the unit's normal axis, and power PV cell located along that optical axis. In most cases, the optical concentration function of each component is performed by different portions of a common part, such as a compound reflector or lens.

Figure 17:
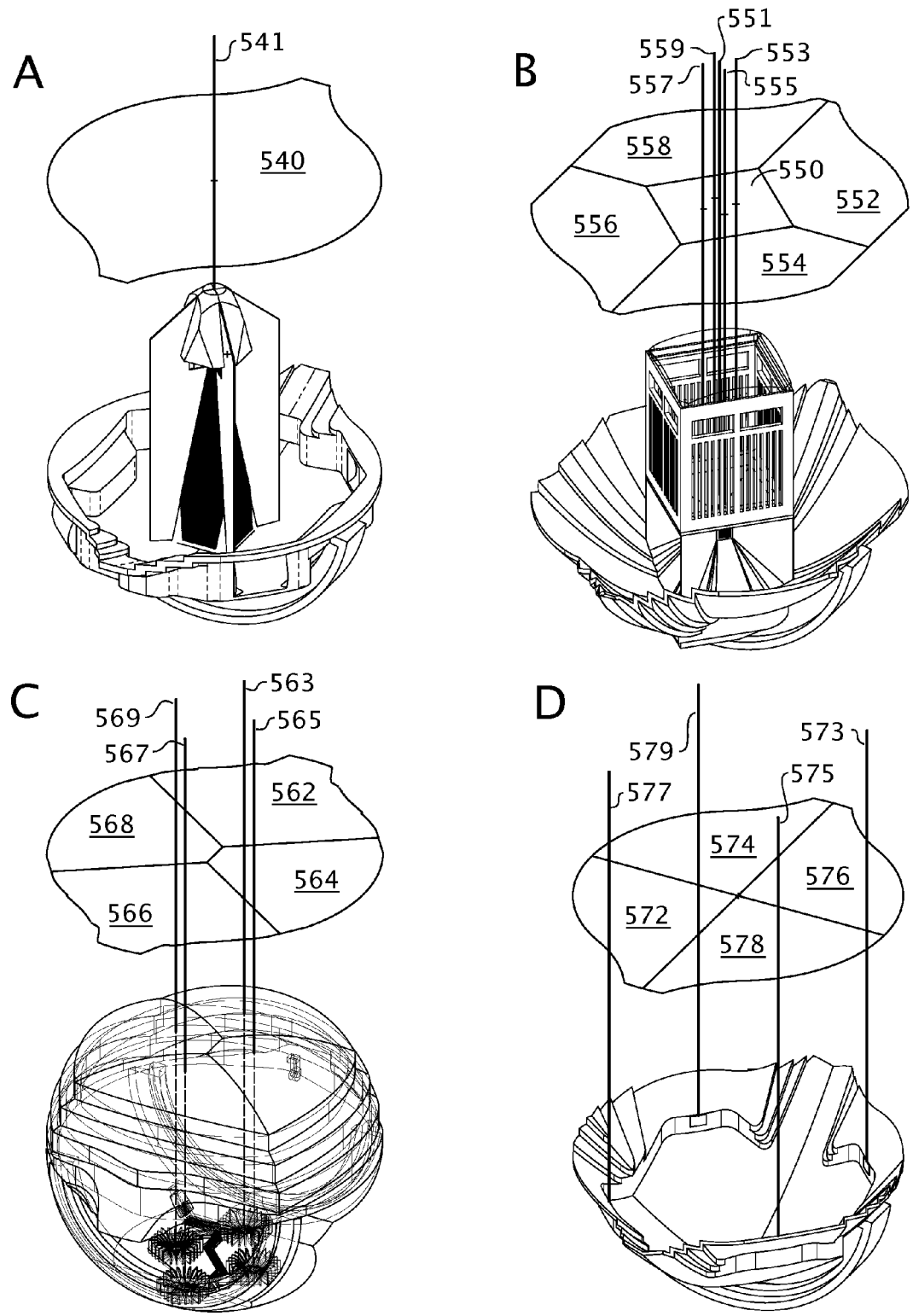
FIG. 17 shows arrangements of energy capture components and their respective optical axes for several embodiments of the invention.

FIG. 17 shows the energy capture units of the first through fourth embodiments, with each of the four illustrations, denoted A through D, indicating the optical axis and corresponding aperture segment of the energy capture unit's capture components. Complete elements of the second through fourth embodiments are shown in FIGS. 18 through 23.

FIG. 17A shows the energy capture unit of the first embodiment, with a single energy capture component having the aperture segment 540 and the optical axis 541.

Figure 18:
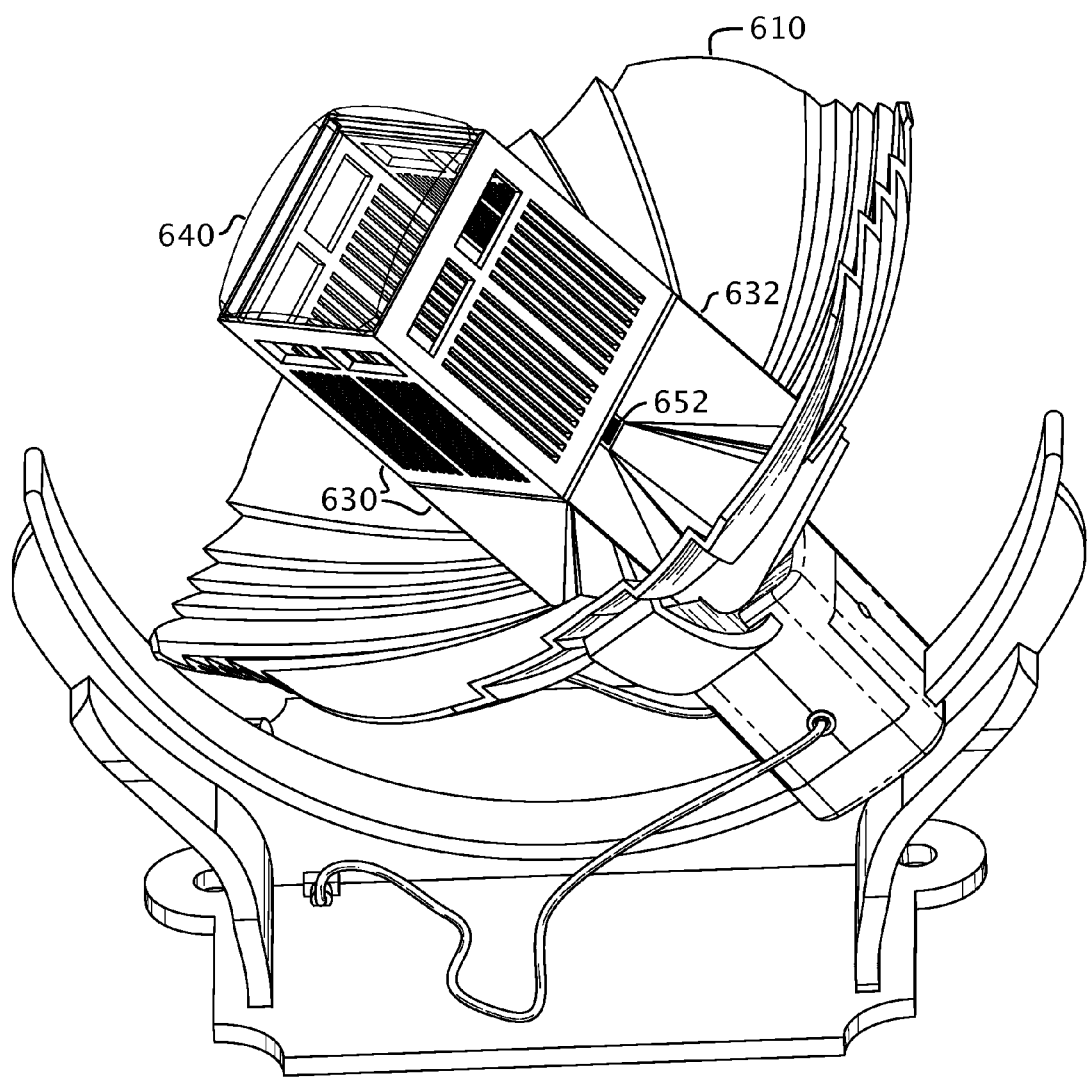
FIG. 18 shows an energy collection element of the second embodiment, whose energy capture unit has five capture components, four using reflective and one using refractive optics.
Figure 19A:
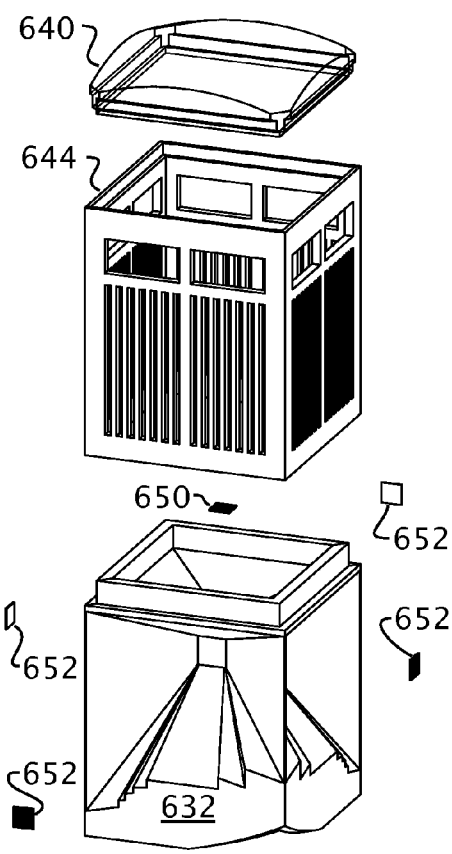
FIG. 19 shows views of portions of the energy capture unit of the second embodiment.

FIG. 17B shows the energy capture unit of the second embodiment, detailed in FIGS. 18 and 19, which has five energy capture components, a central component using a lens to focus light on an upward-facing PV cell, and four surrounding components using portions of a reflector to focus light on outward-facing PV cells. The central component has the aperture segment 550 and the optical axis 551, and four surrounding components have the aperture segment 552 and the optical axis 553, the aperture segment 554 and the optical axis 555, the aperture segment 556 and the optical axis 557, the aperture segment 558 and the optical axis 559, respectively.

Figure 20A:
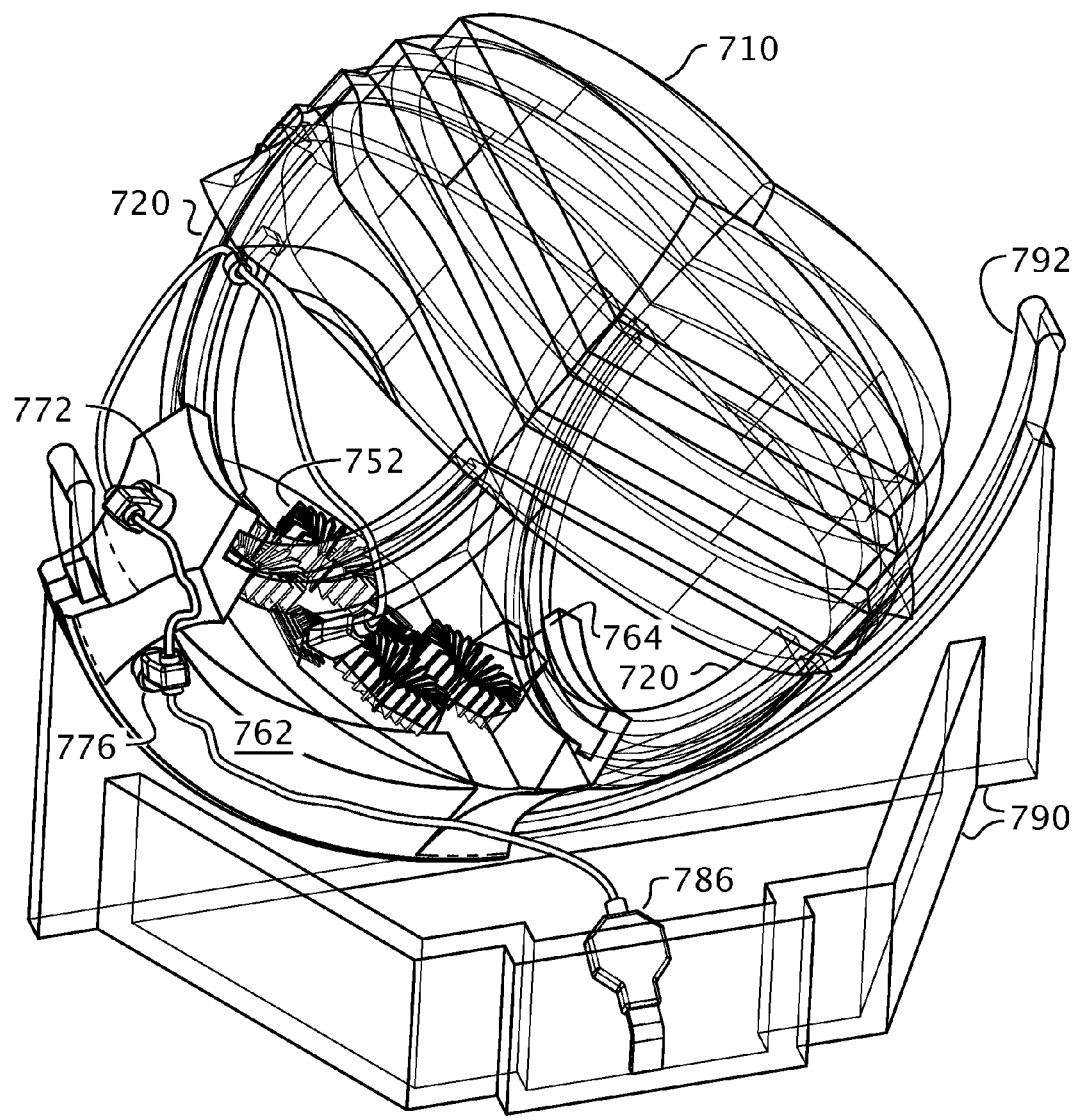
FIG. 20 shows an assembled and an exploded view of an energy collection element of the third embodiment, whose energy capture unit has four capture components using refractive optics.
Figure 20B:
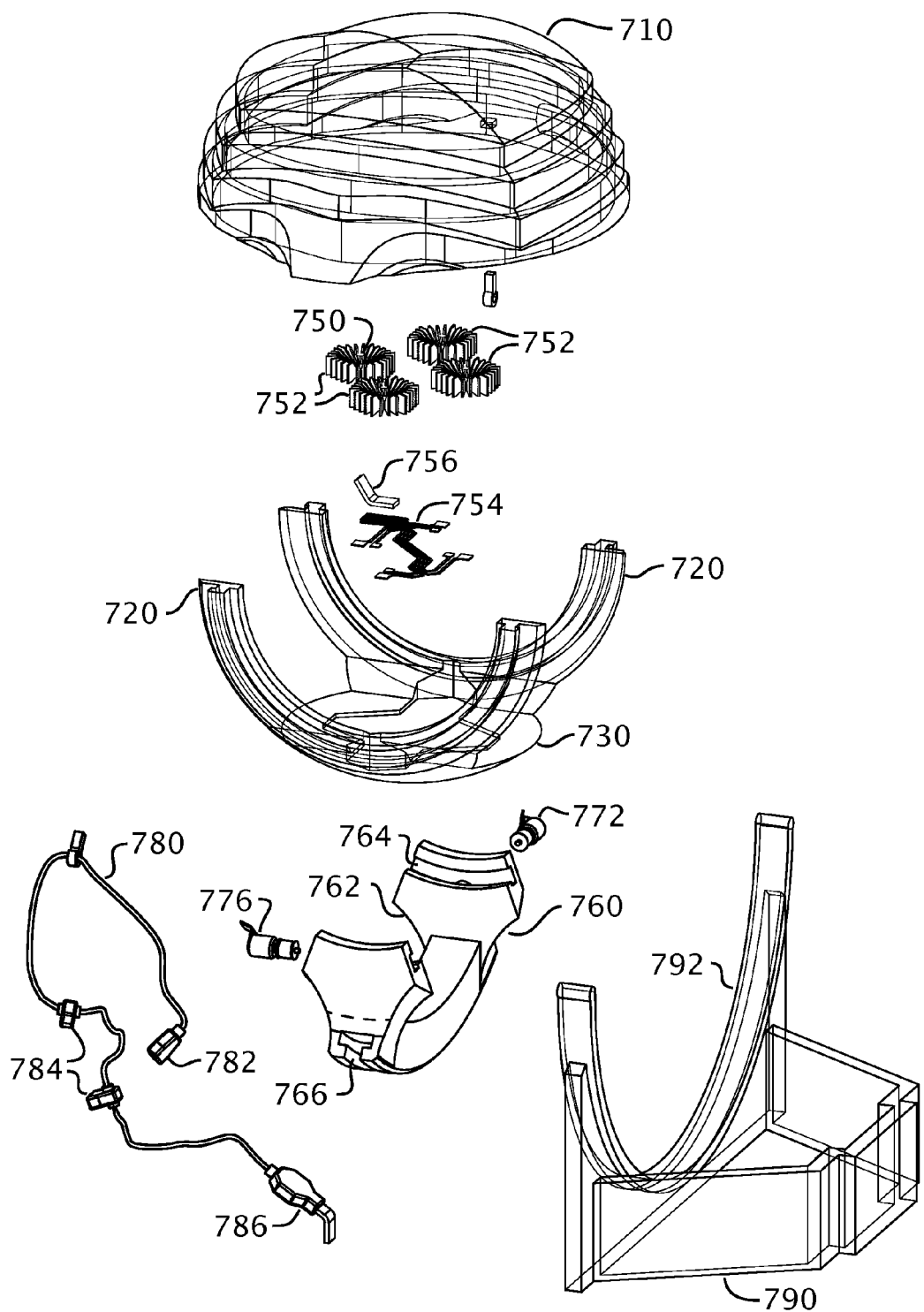
Figure 21:
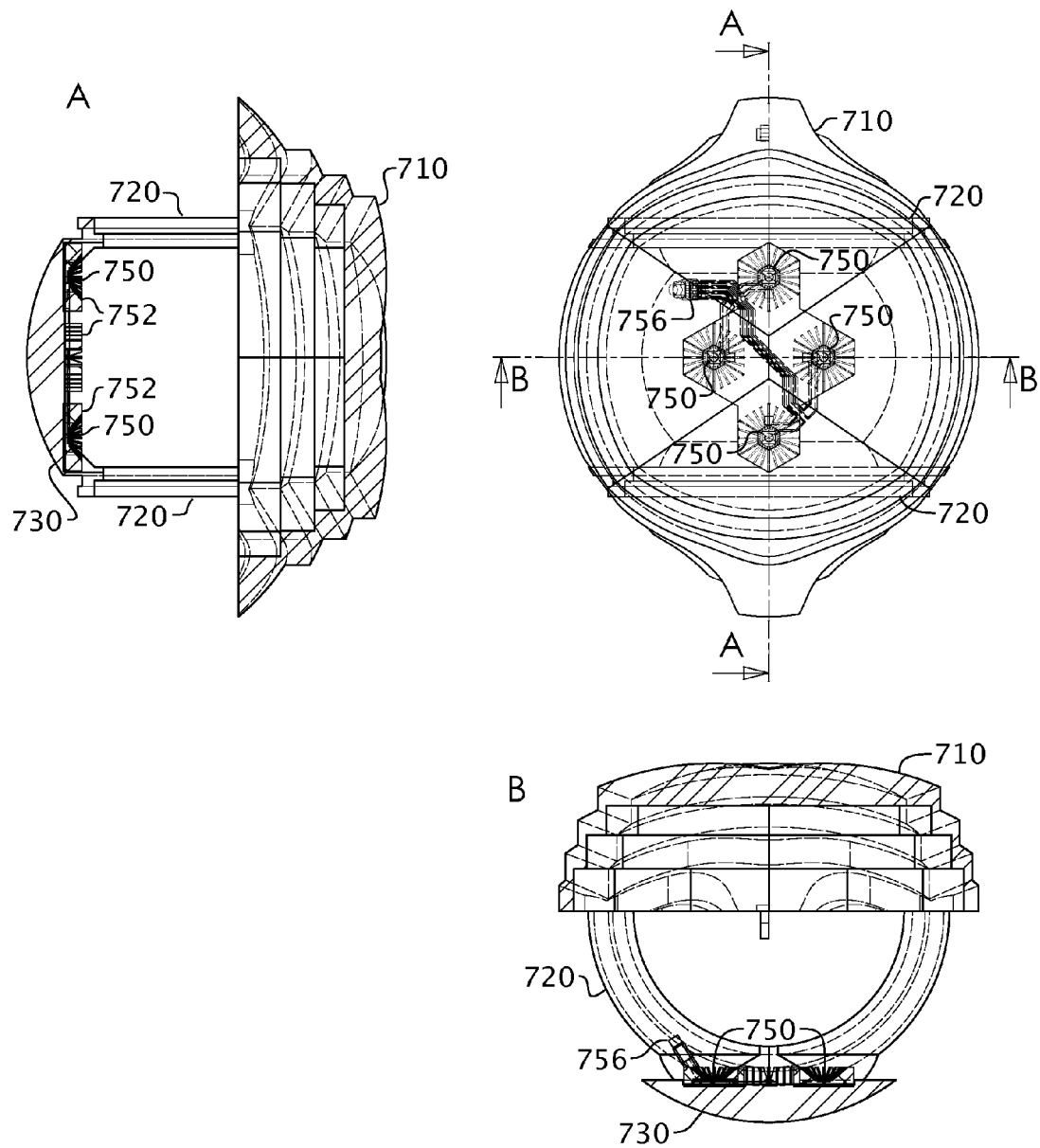
FIG. 21 shows a view and sections of the energy capture unit of the third embodiment.

FIG. 17C shows the energy capture unit of the third embodiment, detailed in FIGS. 20 and 21, which has four energy capture components, each using a different portion of a compound lens to focus light on a PV cell. The four components have the aperture segment 562 and the optical axis 563, the aperture segment 564 and the optical axis 565, the aperture segment 566 and the optical axis 567, the aperture segment 568 and the optical axis 569, respectively.

Figure 22:
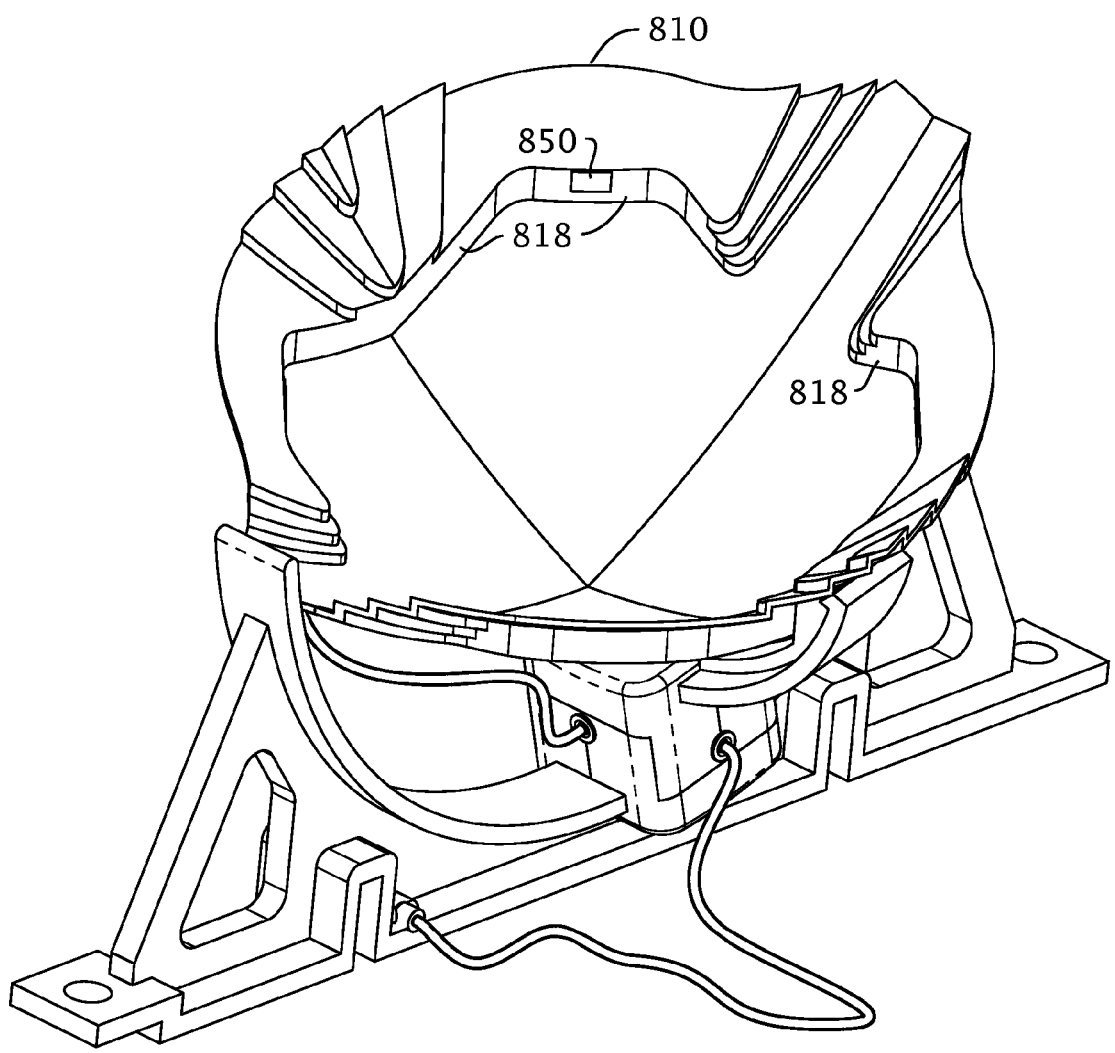
FIG. 22 shows an energy collection element of the fourth embodiment, whose energy capture unit has four capture components using reflective optics.
Figure 23:
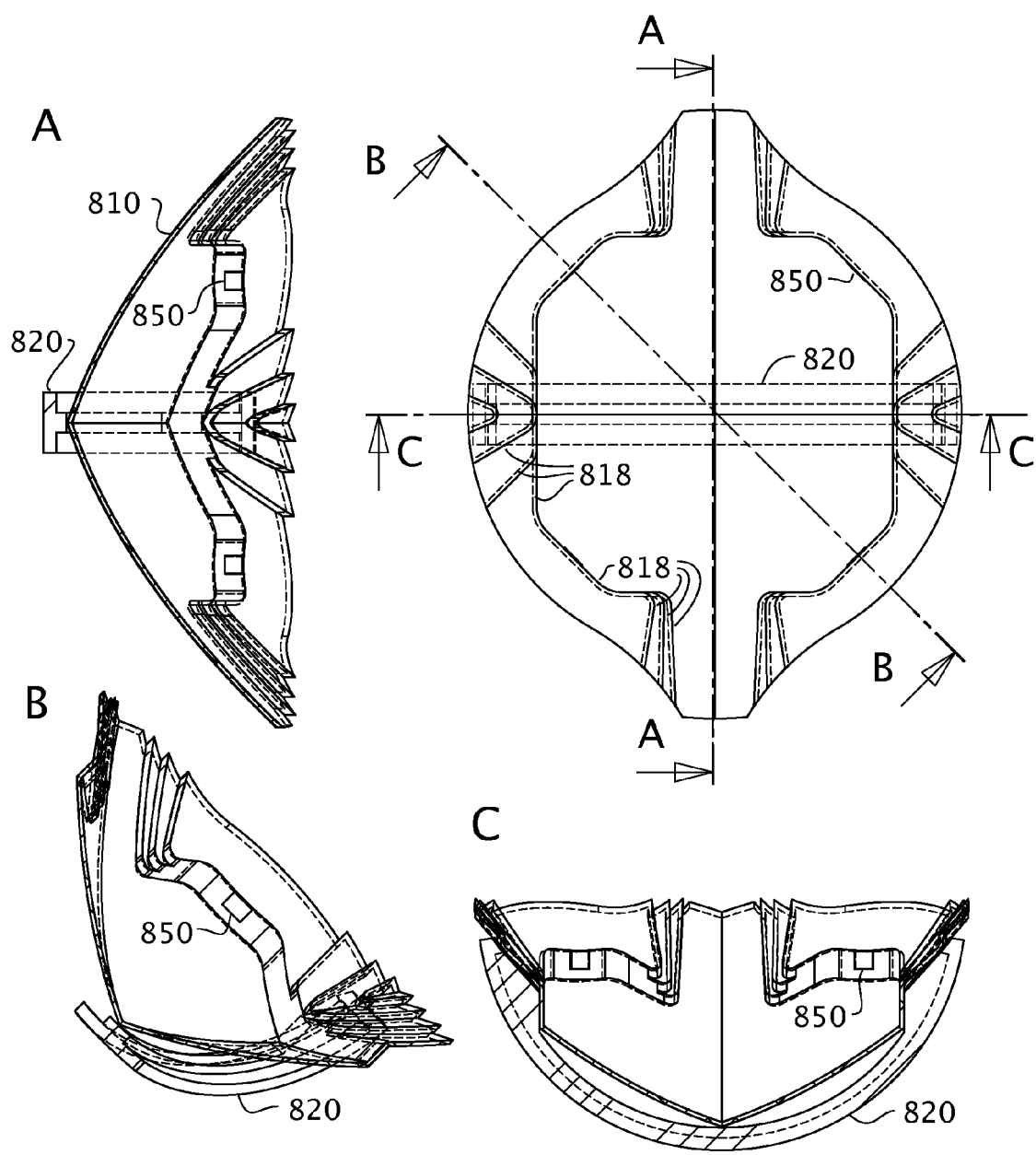
FIG. 23 shows a view and sections of the energy capture unit of the fourth embodiment.

FIG. 17D shows the energy capture unit of the fourth embodiment, detailed in FIGS. 22 and 23, which has four energy capture components, each using a different portion of a compound reflector to focus light on one of the PV cells mounted on risers on the same reflector. The four components have the aperture segment 572 and the optical axis 573, the aperture segment 574 and the optical axis 575, the aperture segment 576 and the optical axis 577, the aperture segment 578 and the optical axis 579, respectively.

Element with Five Capture Components

FIG. 18 shows an energy collection element of the second embodiment of the invention, whose energy capture unit has five energy capture components, each with its respective aperture segment, optical axis and power PV cell. FIG. 19 shows details of the energy capture unit of the second embodiment.

The cells are mounted in recesses in the central block 632. The central capture component uses the lens 640, supported by the perforated tower 644, to focus directional light onto the upward-facing cell 650.

Figure 19B:
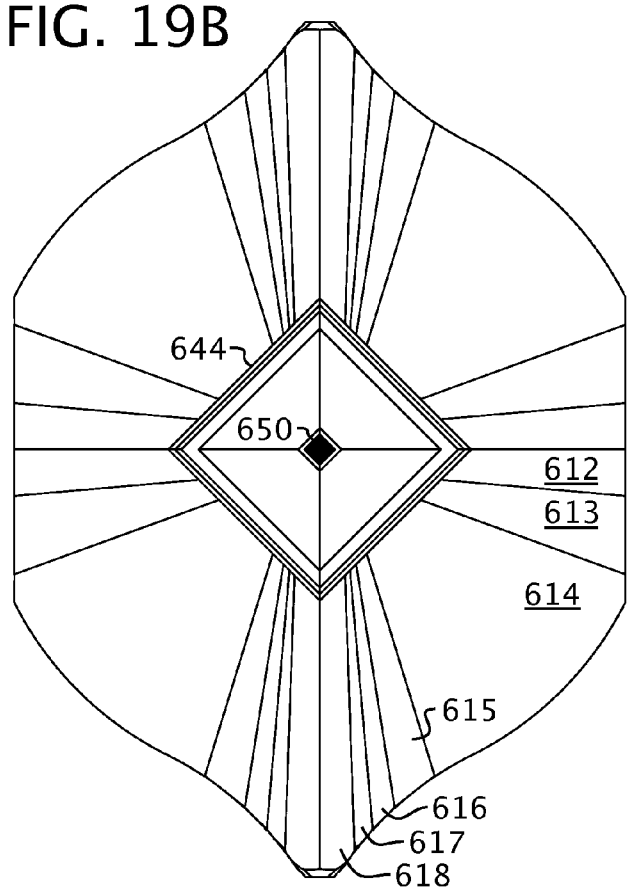

Each of the remaining four capture components uses a quadrant of the reflector dish 610 to focus directional light onto one of the four outward-facing power PV cells 652. Each said quadrant comprises a series of paraboloid surfaces sharing the optical axis running through and the focal point straddled by its target PV cell 652. The heights of the different paraboloids defining the a quadrant's paraboloid surfaces and the angular extents of those surfaces are selected such that the height of the surface where it intersects the capture element's inner axis clearance profile remains within a specified distance of the element's aperture plane. FIG. 19B labels the paraboloid surfaces of one of the four quadrants, which, in order of increasing focal length, are the surfaces 612, 613, 614, 615, 616, 617, and 618.

Whereas all five of the power PVs participate in the conversion of directional light to electricity when the capture unit is aligned with that light, the outward-facing power PV cells 652 are used to determine the direction of departure of the energy capture unit from the direction of incident light when the two axes are not aligned. Methods of using such information to drive the element's angular positioner to track the sun's movement are described below.

Whereas, compared to the first embodiment, the second embodiment requires more sophisticated electronics to implement orienting and tracking behavior, it has the advantage of eliminating the small aperture losses of the first embodiment's tower, while providing a much larger heat sink, distributing the hotspots among the several PV cell locations, and providing space inside of the heat sink for PV wires and thermally-conductive structure pass through the reflector.

Element with Four Capture Components Using Refractive Optics

FIG. 20 shows an energy collection element of the third embodiment, whose energy capture unit uses a compound lens 710 to focus light on four power PV cells 750. FIG. 20A shows the element in an assembled state and FIG. 20B shows the same element exploded.

FIG. 21 shows a view and the two indicated sections of the energy capture unit of the third embodiment. The view shows the unit from its normal axis, and the sections, marked A and B, cut through the two planes of symmetry of the compound lens.

The PV cells 750 are fixed to heat sinks 752, which are in turn embedded in the platform 730 The PV cells are electrically connected to the electrical connector 756 by the conductors 754 embedded in the platform.

The platform 730 is rigidly connected to the lens through the dual mounting arcs 720, which are slidably mounted by the inner arcuate slots 764 of the angular positioning unit 760.

The capture unit, comprising the lens 710, the dual mounting arcs 720, and the platform 730 and electronics mounted therein, is supported and positioned by the angular positioning unit 760, which consists of a shaped block of material 762 with the dual inner arcuate slots 764, the outer arcuate slot 766, and bores to accept the inner axis gearmotor 772 and the outer axis gearmotor 776. The positioner slidably mounts the base arc 792 integral to the base unit 790.

An electronics module 780 in the form of a flexible cable equipped with connectors and embedded electronics components connects electrically to the PV electronics plug 756 via the connector 782, to the drive motors via the connectors 784, and to the base through the connector 786, which houses the element's microcontroller. Both the electronics module and the drive gearmotors can be replaced without disassembly of the element's main mechanical components.

Among the embodiments described herein, only the third embodiment uses entirely refractive optics. It also uses transparent materials for most of the other bulky parts, such as the capture unit's arcs and platform, and the base unit. Arrays of elements of this embodiment could be enclosed in panels having a transparent back faces.

A predominantly transparent concentrating panel made possible by the third embodiment has properties particularly useful for certain applications. Used in a skylight, window opening, or awning, such a panel would concentrate the vast majority of incident light onto its PV cells whenever the sun is shining and the panel's capture units are oriented to face the sun, thereby shading the space underneath it, but would transmit the majority of light whenever the sun is occluded or the panel's capture units are not so oriented, thereby flooding the same space with light. Used to cover an opaque surface, such a panel would have an appearance whose color and other visual attributes mimic those of the surface. When the sun is shining and the panel's capture units are tracking the sun, the panel will absorb most of the light so as to appear much darker than the surface, but when the sun is occluded or the units are not so oriented, the panel will transmit most of the incident light to and then from the covered surface, thereby taking on the surface's color and appearance.

Element with PV Cells Embedded in Reflector

FIG. 22 shows an energy collection element of the fourth embodiment, whose energy capture unit uses a compound reflector, each of whose four quadrants focuses directional light onto a PV cell embedded in a riser in the opposite quadrant of the reflector. FIG. 23 shows a view of the embodiment's energy capturer from its normal axis, and three sections of the capturer.

The methods used to create the reflector are the subject of the patent application PCT/US2009/046606 by the present inventor. In the present application, the embodiment is used to illustrate the two-axis mounting provided by the angular positioning unit and the related orienting methods based on differences in the electrical potentials of the power PV cells.

The reflector 810, whose back side is rigidly attached to the convex mounting arc 820, is a single part with two planes of reflective symmetry that divide the reflector into four quadrants. The upper surface of each quadrant is composed of a set of paraboloid faces sharing a common focus and optical axis, and a set of flat and cylindrical riser faces 818 that are parallel to the capture unit's normal axis. The focus of the paraboloids of one quadrant lies on the middle of a riser face of the opposite quadrant and is straddled by a photovoltaic cell 850 mounted in that face.

When the axis of symmetry of the reflector is aligned with the direction of incident light, the four quadrants' optical axes are as well, and each of the paraboloid faces focuses light onto the PV cell in the opposite quadrant.

The fourth embodiment provides several features which are advantageous for the creation of energy capture units. In particular, the embedding of the PV cells in risers in the reflector itself removes structures above the reflector and the concomitant design issues in assuring the rigidity of such structures, and minimizes the aperture losses there from. The reflector part, which constitutes the bulk of the energy capture unit, could be manufactured as a single part for simplicity and dimensional accuracy.

Furthermore, because the PV cells are mounted in the reflector at points evenly distributed about the reflector's circumference, and along its radii, the reflector can provide an especially efficient heat sink, particularly if composed largely of a material with high thermal conductivity, such as aluminum. Even if the reflector part were composed of a material with low thermal conductivity and therefore unsuitable as a heat sink, separate heat sinks attached to the back sides of the PV cells could be designed so as to extend into the space behind the reflector where they would not shadow the reflector.

Another advantage of the fourth embodiment is that the light focused onto the PV cells by the reflector has a low average angle of incidence, avoiding reflective losses on PV cell surfaces caused by high light incidence angles.

Electronics for Embodiments with Multiple Capture Components

The second through fourth embodiments share the common feature distinguishing them from the first embodiment that they have multiple energy capture components, each displaced from the energy capture unit's axis of symmetry in a different direction. Because the capture components are symmetrically arranged about the capture unit's axis of symmetry but are individually asymmetric, and because the optical geometry is such that the PV cells will receive some illumination even when the capture unit's axis diverges from the direction of incident light, the PV cells will produce electricity, at least in small quantities at levels that are a function of the displacement of the unit's axis from the incident light axis. Unlike the first embodiment's energy collection unit, which has four direction-sensing PV cells in addition to its power PV cell, the second through fourth embodiment's energy collection elements rely on the outputs of their multiple power PV cells to gather information about the orientation of their energy capture units relative to incident light, and dispense with dedicated direction-sensing PV cells.

For embodiments with multiple power PV cells per capture unit, the invention contemplates several methods by which the unit determines the movement required by its angular positioner to bring its capture unit into alignment with directional incident light. The methods range from simple analog circuits only slightly more complex than the one illustrated in FIG. 15 to ones employing stored programs executed by microcontrollers.

Figure 24:
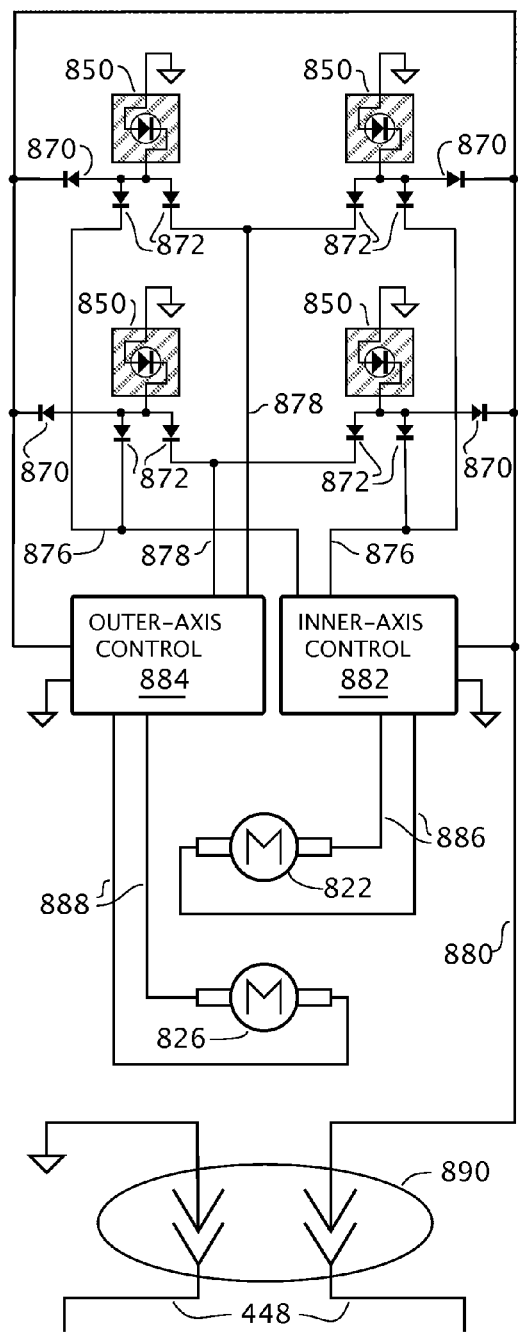
FIG. 24 shows an electrical schematic of an energy collection element based on analog circuits.
Figure 25:
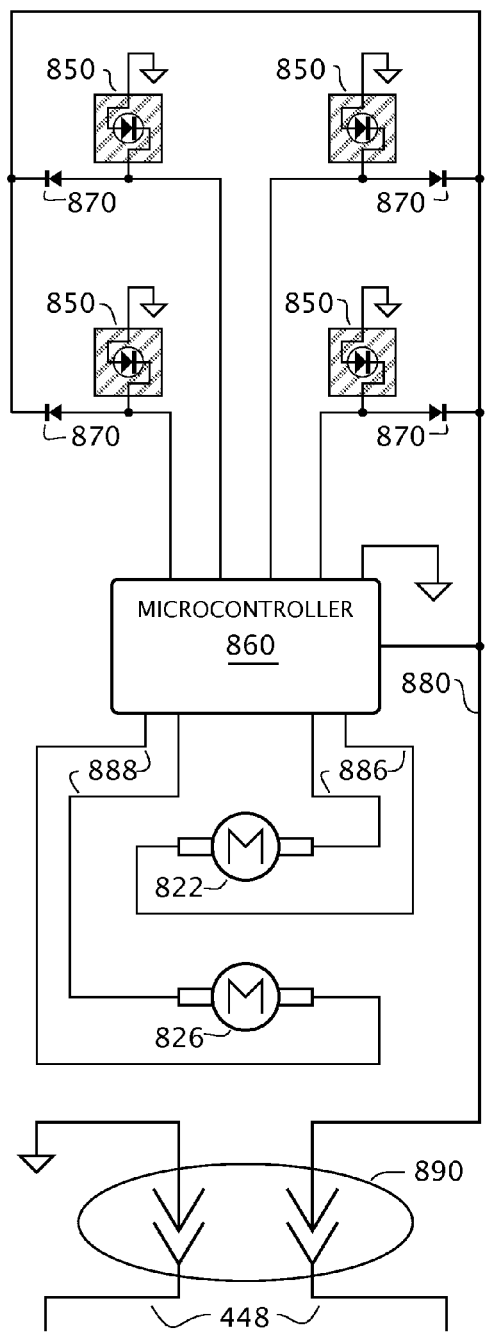
FIG. 25 shows an electrical schematic of an energy collection element having a microcontroller.

FIGS. 24 and 25 show electrical schematics of two variants of the fourth embodiment. The fourth embodiment was selected as a representative example with which to illustrate specific circuit designs, variants of which would be suitable for the second, third, and fifth embodiment.

FIG. 24 is an electrical schematic of a module of the fourth embodiment whose sun tracking function is implemented entirely with analog electronics.

In the circuit shown in FIG. 24, the four diodes 870 connect the outputs of the four PV cells 850 to the module power wire 880, and the eight diodes 872 connect the output of each PV cell to one of the two inner-axis direction-sensing wires 876 and one of the two outer-axis direction-sensing wires 878.

The inner- and outer-axis control circuits 882 and 884 provide electrical power to the drive motors 822 and 826 via the motor wire pairs 886 and 888, respectively, based on the relative potentials of their inputs from the said direction-sensing wire pairs 876 and 878, respectively. When the two direction potentials communicated to a control circuit are relatively similar, the circuit balances the potentials on its motor wires. When one direction-sensing wire potential differs from the other by at least some threshold, the control circuit effectively switches one motor wire to the module ground and the other motor wire to the module power wire 880, where the pairing is reversed when the direction-sensing wire potential difference is reversed. Therefore, the motor runs when the absolute value of the difference in direction potentials is greater than some threshold, and in a direction determined by the sign of that difference.

FIG. 25 is an electrical schematic of a module of the fourth embodiment having the microcontroller 860. The four diodes 870 allow the flow of current from the PV cells 850 to the output and module power wire 880, while allowing the microcontroller to read the potentials on the individual cells. Using information about such potentials so gathered, the microcontroller executes an algorithm, such as described in the next section, to move the gearmotors 882 and 884 so as to bring the energy capture unit into alignment with directional incident light.

The elements whose schematics are shown in FIGS. 24 and 25 connect electrically to the panel circuit via the pluggable connector 890, which is compatible with the connector 280 shown in FIGS. 15 and 16. Both the electronics and the mounting systems of elements used in arrays can be designed to be compatible. Elements having very different designs, particularly in their energy capture units, can be used in the same arrays, provided the elements are designed with compatible operating clearance profiles, mounting systems, and electronics interfaces.

Orienting Algorithms for Elements with Multiple Capture Components

The first embodiment with the electronics pictured in FIG. 15 implements an method for moving the energy capture unit into alignment with directional light through the shapes of its surfaces and very simple electrical circuits. This orienting behavior is possible because the sign of the difference between the intensity of illumination of opposite-facing sensor PV cells matches the sign of the angle of the capturer's optical axis relative to the incident light direction in the plane of rotation of the tilt axis controlled by that pair of PV cells.

The fourth embodiment with the electronics pictured in FIG. 24 also implements a method for moving its energy capture unit into alignment with directional light through the shape of its reflector and slightly more complex electrical circuits than the first embodiment.

In several of the other embodiments, the relationships between the PV illumination levels and displacement of the optical axis from the light direction is more complex, making the implementation of orienting behavior through the design of its optical components and analog electronics more difficult. This section describes algorithms for orienting the energy capture units of embodiments whose elements have multiple energy capture components and are equipped with microcontrollers.

Because the second through fifth embodiments have only small photovoltaic cells that straddle the focal points of their respective capture components and operate at concentration ratios of up to several thousand, light levels to these PV cells fall to small fractions of their peak values when the capture unit's axis departs from the incident light direction by as little as a few degrees. However, directional light continues to fall upon the PV cells of the contemplated embodiments throughout most of the two-dimensional space of angular displacements of the incident light direction from the capture unit's axis out to 90 degrees in any direction from the unit's normal axis, because there exist many families of alternate paths that light may take to reach the PV cells, and these families cover different and overlapping regions of the space of angular displacements. For capture components using reflective optics, large portions of this space are covered by regions wherein light reaches the PV cell directly. Other portions of the space are covered by regions wherein light reaches the PV cell after one, two, or three reflections by the capture unit's reflector.

In such embodiments of the invention, the combinations of levels of illumination on an energy capture unit's various PV cells will vary as a function of the angular displacement of the unit's optical axes from the direction of incident light. The invention provides a set of methods for enabling energy collection elements to orient their capture units into alignment with directional light using real-time data about the illumination of their PV cells combined with pre-programmed algorithms and data sets which effectively implement inverse maps from PV response data to angular positioning control.

According to this set of methods, the energy collection elements translate PV response data directly into positioning control, using compact data sets generated in advance through a two-stage process. That process first uses a test system to produce high-resolution data describing PV response levels as a function of capture unit position and movement, and then processes that data to generate inverse maps of orienting positioning control as a function of PV response data, and encodes those maps into compact production data sets.

Spaces and Mappings Used by Orienting Algorithms

The processes involved in generating the production data sets are described with reference to the following five spaces, which are described with reference to FIGS. 26 and 27.

The positioning unit angular movement space, or movement space, describes the two dimensions of movement of the bi-directional drive motors of the angular positioning unit and the coupled movement of the capture unit within the position space. FIG. 26A shows a representation the angular movement space as a rectangular region of the plane 900 having a Cartesian coordinate system whose ud axis represents movement about the unit's inner tilt axis and whose vd axis represents movement about the unit's outer tilt axis. The space ranges from negative to positive movement in both directions, with the unit being motionless at the origin 902.

The capture unit angular position space, or position space, is the two-dimensional space of possible orientations of the energy capture unit relative to the element's base provided by the angular positioning unit. FIG. 26B shows two representations of the position space of a capture unit that can rotate to plus and minus 60 degrees from the element's normal axis 904 along both the inner and outer tilt axes. The upper portion of the illustration shows the space in relationship to the capture unit as a spherical patch 906 around the unit's clearance profile 908. The lower portion of the illustration shows the same space mapped to a rectangular region of the plane having a Cartesian coordinate system. The patch and region are ruled by a grid showing contours of angular movement along both axes separated by 10 degrees. The origin of the angular position space 912 corresponds to the capture unit being oriented so that its normal axis is parallel to the array's normal axis. The array horizon 914, which is a plane perpendicular to the array's normal axis containing the elements' outer tilt axes, is indicated as a ring surrounding the pictured element.

The light direction displacement space, or displacement space, is the two-dimensional space of angular displacements of the incident light direction from the capture unit's normal axis. FIG. 26C shows two representations of the displacement space, which extends out to 90 degrees in all directions from the capture unit's normal direction 924. The upper illustration shows the space in relationship to the capture unit as a hemisphere 920 ruled by a grid formed by two sets of curves, where the curves of each set are parallel to one of the capture unit's two planes of symmetry. The lower illustration shows the same space and its grid mapped to a diamond-shaped region of the plane having a Cartesian coordinate system with the axes g and h. Given a point (g, h) in this representation, the 3-dimensional Cartesian coordinates of its position on the sphere are expressed by the following set of equations:

$$x = \sin(|g|) * \cos(h) * (1 - |h|/\pi)$$

$$y = \sin(|h|) * \cos(g) * (1 - |g|/\pi)$$

$$z = \sqrt{1 - \sqrt{(x^2 + y^2)}}$$

There are many possible alternative representations of the displacement space, such as ones ruled by polar coordinate systems, and ones using different projections of the hemisphere to the plane. The representations of FIG. 26C were chosen because the density with which the grid covers the hemisphere varies only slightly, and the grid maps to a compact region of the plane whose points can be assigned Cartesian coordinates.

The PV response space, or response space, is the multi-dimensional space encompassing the possible combinations of output values of the capture unit's PV cells. This space has as many dimensions as the capture unit has such PV cells.

The delta PV response space, or delta response space, is the space encompassing the possible rates of change of output values of the capture unit's PV cells as the capture unit is moved by small increments along each of the two perpendicular axes of the angular movement space. For each dimension of the PV response space, there are two corresponding dimensions in the delta PV response space, one for each of the two directions of movement provided by the angular positioning unit.

For most of the embodiments of the invention described herein, the energy collection elements and their capture units have the ability to directly sense their coordinates in only the PV and delta PV response spaces, by reading the output levels of their PV cells, and have the ability to directly control their location in only the angular movement space, by controlling the electricity supplied to their angular positioners' drive motors. The algorithms described below enable the elements to move their capture units through the angular position space, and thereby in the light displacement space, in a way that rapidly and efficiently brings their capture units into alignment with directional light. Each algorithm implements, in effect, a function whose domain is either or both of the PV response spaces and whose range is the angular movement space. The design of the algorithms is based on the relationships between the various spaces, which are described presently.

The relationship of the first two spaces is straightforward: the u and v components of angular position are the integrals of the ud and vd components of angular movement over time.

The relationship of the position and displacement spaces is variable and is determined by selecting a point in the position space, which defines the orientation of the capture unit, and therefore the location of the displacement space origin within the position space. FIG. 26D shows the spherical representation of the displacement space superimposed on the spherical representation of the position space, the axis and origin of the displacement space being displaced from the origin of the position space by 40 degrees along the outer tilt axis and 30 degrees along the inner tilt axis. The construction requires that, at the displacement space origin 922 the grids of both spaces are aligned, with the great circles corresponding to the g and h axes of the displacement space being tangent to the contours along the u and v directions of the position space.

Because the selection of a point in the position space as the origin of the displacement space uniquely determines how the two spaces are superimposed, there is a well-defined one-to-one mapping between the two spaces for each such point. That mapping provides that the basis directions within the spaces, defined by the variables u and v in the position space and the variables g and h in the displacement space, are aligned at origin of the displacement space. However, because the two spaces are parameterized differently, these basis directions diverge with increasing distance from the origin of the displacement space. However, that divergence does not greatly exceed 45 degrees, in any part of the mapping for any selection of the displacement space origin within the position space.

The relationship of the response space to the displacement space is that of a multivalued function of two independent variables. Given an energy capture unit with four PV cells that participate in direction-sensing, for each point in the displacement space (g,h), there is an 4-tuple of PV response values.

FIG. 27 shows views of the function mapping the displacement space to the response space for a hypothetical capture unit having four PV cells. FIGS. 27A through 27C show the response function as surface graphs over the displacement space parameterized by the g and h variables. FIG. 27A shows the graph for a single capture component. The graph has a peak 930 over the origin of the displacement space, where the directional light is focused on the component's PV cell. The vertical dimension of the graph has a logarithmic scale so that the peak appears much lower relative to surrounding portions of the graph than would be the case if the dimension had a linear scale. FIG. 27B shows the graphs of the four capture components superimposed, where a wedge is removed from the graph to reveal sections through the four components. A line rising from the displacement-space point 940 intersects the graphs of the four components at the levels 941, 942, 943, and 944, respectively.

Figure 27A:
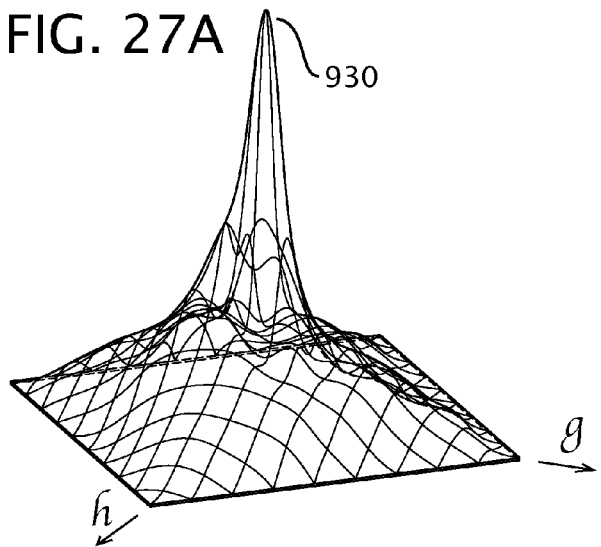
FIG. 27 shows an example of hypothetical PV response functions over the light displacement space.
Figure 27D:
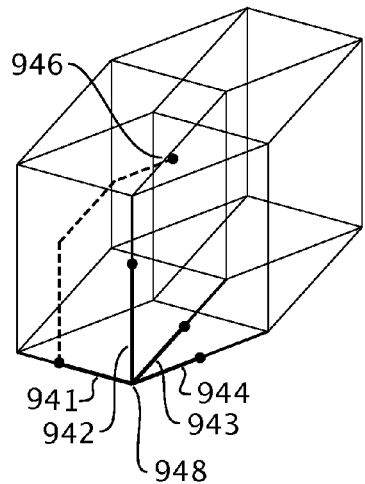

FIG. 27D shows a representation of the response space as a projection of a four-dimensional hypercube in which the response-space point 946 corresponds to the displacement-space point 940, being displaced from the response-space origin 948 by the distances 941, 942, 943, and 944 in the four dimensions representing the four capture components.

Figure 27B:
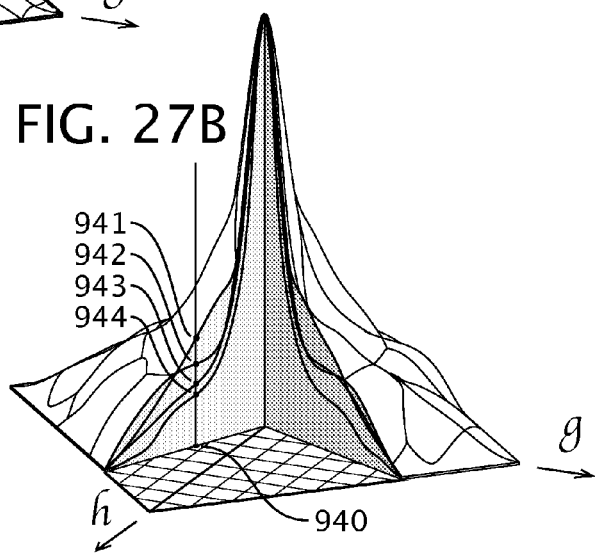
Figure 27C:
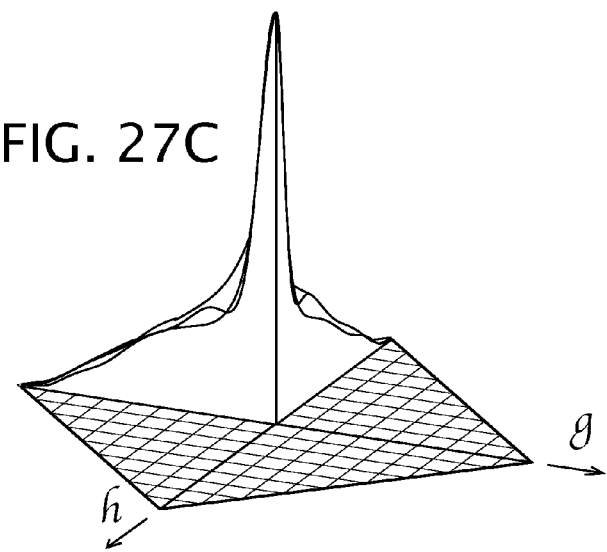

FIG. 27C shows the composite graph of FIG. 27B over just one-quarter of the displacement space. Because the response graphs of the four capture components are identical to each other, modulo one or two reflections through the g and/or h axes, the entire map of the four response functions over the displacement space can be folded into the four superimposed graphs in a single quadrant, reducing the memory required to represent the map. Using such a representation of the function, the response values for any point in the displacement space can be reconstructed by locating the image of that point in the quadrant containing data, and transposing the response-space axes accordingly. Details of a method of implementing such folding of the response function representation are provided below with reference to FIG. 31.

As an approximation, the delta response space is also related to the displacement space as a multivalued function of the two independent variables g and h, having two values for each PV cell, one for each of the two directions ud and vd in the movement space. However, because of the divergence of basis directions in mappings between the position and displacement spaces mentioned above, this description applies precisely only to the situation wherein the origins of these two spaces are coincident. A function that accurately describes the derivatives of the PV response levels with respect to the angular position of the energy capture unit having four PV cells has a four-dimensional domain and an eight-dimensional range: for each point ((g,h),(u,v)) there are two 4-tuples of delta response values.

Data Set Generation

Whereas the relationships between the movement, position, and displacement spaces are analytical and can be characterized with mathematical rigor, the functions mapping these spaces to the response and delta response spaces will, for a given embodiment, be subject to performance characteristics of the optics and PV cells of instances of that embodiment. The invention provides a set of methods of empirically generating data structures representing the map from the displacement space to the response space, and, based on that data, the reverse map from the response space back to the displacement space. These methods will work with embodiments having a wide range of optical designs, but whose individual units have sufficiently small variations in optical geometry of PV sensitivity that the same data sets will provide robust orienting behavior from one unit to the next.

Figure 28:
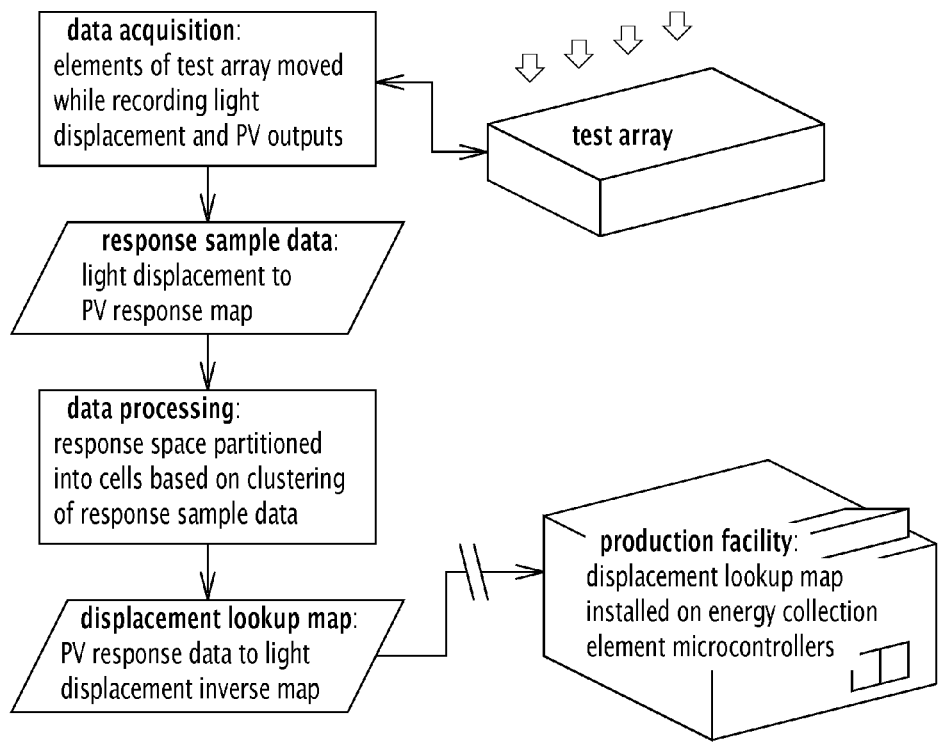
FIG. 28 is a flowchart summarizing the process of generating datasets used by microcontroller-equipped energy collection elements.

FIG. 28 summarizes the approach of using a testbed system to generate an intermediate data set representing the displacement-space to response-space mapping, then processing that data to generate a compact data set representing the response-space to displacement-space inverse mapping. That approach is described in detail presently.

The orienting algorithm executed by the energy collection elements' microcontrollers uses a production data set that represents a map from the response space to the displacement and/or movement spaces. For a given embodiment, a production data set is generated using a test array whose elements have essentially identical optics and PV cells to those of production array elements. The test array differs from a production array in that the elements are equipped with externally-controlled angular positioning units and are instrumented to measure the angular positions of their energy capture units, as well as other test conditions. The test system might be instrumented to measure the angular position of the sun or artificial lightsource relative to the array, or might be used with a fixed lightsource, where the angular displacement of the lightsource is produced by moving the test array. A specific embodiment of a test array is described below with reference to FIG. 37.

The generation of a production data set involves executing a data acquisition procedure to generate an intermediate data set called the response sample data, and is followed by data processing procedure that examines said sample data to produce the production data set called the displacement lookup data.

The present description first examines a simple variant of the procedure which ignores the departure of the basis directions of the position and displacement spaces, or skew. Because this skew between the spaces generally remains less in absolute value than 45 degrees of rotation, such a variant should produce motion of the energy capture unit that converges on the alignment of its normal axis with the direction of incident light, if not by the most direct route. This variant also ignores delta response data in favor of looking at only at the much simpler response data, and illustrates cases in which there are four energy capture components.

The data acquisition procedure entails moving the elements of a simulation array through their ranges of motion in a systematic and possibly stepwise fashion while recording, for each of numerous positions covering a portion of the displacement space, the outputs of their PV cells and corresponding position data. This procedure produces a data set representing the map from the displacement space to the response space as a high-resolution array of samples. This sample data is a two-dimensional array of 4-tuples representing points in the response space, where the array's rows and columns represent the positions in the displacement space. An alternative representation removes the requirement that the samples fall on the grid lines in displacement space (contours of equal g and h values), and drops the two-dimensional array structure. In that case, displacement data is supplied by a coordinate pair (g,h) stored with each sample instead of being inferred by the sample's position in the array.

The Orienting Algorithm and Data

The data processing procedure examines the intermediate data set to generate the production data set, which is a data structure and access method, called the displacement map, which maps points in the response space to points in the movement space. The preferred form of this data structure is a partition of the response space into a set of cells, each of which contains the coordinates of zero or more points or regions in the light displacement space that are likely to be close to or to encompass the actual coordinates of the capture unit in displacement space. Given a point in the response space, the lookup method locates the cell in the partition of that space within which the point falls, and returns zero or more points or regions in displacement space stored in that cell.

The unit's microcontroller repeatedly executes the lookup algorithm, supplying it with response data from its PV cells and obtaining from it displacement-space data. At each such step, the algorithm maps the displacement data to movement coordinates predicted to move the capture unit closer to the origin of displacement space, which it uses to adjust the levels governing the motion of its positioner's drive motors.

Figure 29:
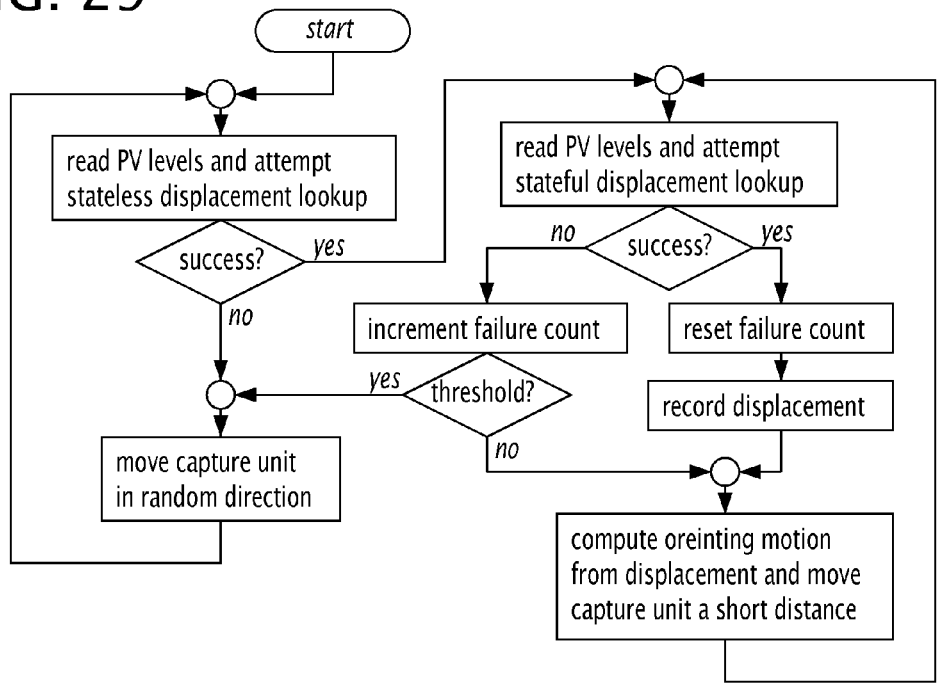
FIG. 29 is a flowchart illustrating an orienting algorithm executed by an energy collection element's microcontroller.

FIG. 29 is a flow chart summarizing the preferred form of the orienting algorithm. Details of the algorithm are described below, following an examination of implementations of the displacement lookup data and algorithms.

Because the map of response space to displacement space may be multi-valued in places, and because response behavior of the optics and PV cells as a function of light displacement is subject to some degree of error, the purpose of the displacement lookup map is enable the element to guess, as best as possible, its position in displacement space and the movement required to bring its capture unit closer to the displacement-space origin. The partition method uses information about the simultaneous distribution of sample data in both displacement and response spaces to generate a compact data structure useful in estimating the capture unit's displacement based on response data.

FIG. 30 illustrates the relationship of response-space partition cells to coordinates in response space. The block 950 represents the four-dimensional response space that is sliced to reveal a two-dimensional section of the space 952, within which three partition cells are shown. The curves 958 indicate the mapping of the said cells to points and regions of the displacement space 926. A principle criterion for the partition algorithm is that it produce cells that map to compact regions of the displacement space. A useful measure of the compactness of a set of samples is their angular extent and to a lesser extent their radial extent, because points within a region of limited angular and radial extent translate into similar points in movement space. The displacement-space values stored in the partition cells may consist of points representing the centroids of regions, and may include data about the extent of the regions, such as indicated by the radial shapes of the displacement-space regions shown in FIG. 30.

Of the three cells shown in FIG. 30, the cell 954 maps to a single region, the cell 955 maps to two regions, and the cell 956 maps to no regions, signified by an X. Given the response function shown in FIG. 27, most of the response space would be occupied by cells that, like cell 956, have null-valued maps. The role in orienting algorithms of single-valued, multi-valued, and null-valued maps from response-space cells to displacement space will be explained below.

Displacement Map Folding

Because the PV response functions for the described embodiments have reflective symmetry through both the g and h axes, it is possible to reduce fourfold the data required to represent the functions by using data covering just one quadrant in conjunction with access methods to provide maps covering the entire displacement space. Following is a description of a method, called response function folding, that applies a symmetry-exploiting data reduction method to both the generation of the sample data array and the generation and use of the displacement lookup maps. The method is described with reference to the third and fourth embodiments, both of which have four capture components, but with different symmetries.

The response function folding method modifies the generation of the sample data array to produce data covering only the first quadrant of the displacement space, in which both g and h are positive. As a quality control measure, data may be gathered for the other quadrants and compared to the data recorded for the first quadrant. The sample data for the first quadrant is then used to generate the production data set implementing the displacement lookup map.

The displacement lookup data in this folded representation contains displacement coordinates in only the first quadrant. However, it is used to find locations in any quadrant of the displacement space by using an access method that maps permutations of the four response-space dimensions to reflections of the two displacement-space dimensions. Thus, whereas the unpermuted 4-tuple of response-space values references a displacement in the first quadrant, three permutations of the tuple reference displacements in the other three quadrants.

FIG. 31 shows the permutations of the response-space dimensions that generate the remaining three quadrants of the displacement space from the selected quadrant for each of two cases: the third embodiment whose capture unit and permutation map are shown on the left, and the fourth embodiment, whose capture unit and permutation map are shown on the right. The symbols r1, r2, r3, and r4 designate the four response-space dimensions, each of which corresponds to a capture component as shown in the labeling within the capture units. The 4-tuple (r1,r2,r3,r4) represents a point in the response space.

The sample data array is generated only for the first quadrant, in which g and h are positive. The displacement lookup data is generated from that data, and hence all of the displacement points referenced by cells of the response-space partition are in the first quadrant as well.

The access method that generates the displacement map from the folded displacement lookup data is more fully described with the benefit of the following definitions. Let $D(r1,r2, \ldots rn)$ be the displacement map, which, given the n response-space dimensions r1 through rn, returns a set of zero or more displacement-space coordinates of the form (g,h). Let $Df(r1,r2, \ldots rn)$ be the folded displacement map, which, given the n response-space dimensions r1 through rn, returns a set of zero or more displacement-space coordinates of the form (g,h), where g and h are both positive. Let Df(r1,r2, . . . rn)*(sg,sh) be the same, where each of the returned coordinates is multiplied by the scalefactor (sg,sh) as (g*sg,h*sh). The folded displacement map Df corresponds to the displacement lookup data, covering the first quadrant. Now the displacement maps for the two examples shown in FIG. 31 can be defined, respectively, as follows:

$$D(r1,r2,r3,r4)=Df(r1,r2,r3,r4) \cup Df(r3,r2,r1,r4)*(1,-1) \cup Df(r3,r4,r1,r2)*(-1,-1) \cup Df(r1,r4,r3,r2)*(-1,1)$$

$$D(r1,r2,r3,r4)=Df(r1,r2,r3,r4) \cup Df(r3,r4,r1,r2)*(1,-1) \cup Df(r4,r3,r2,r1)*(-1,-1) \cup Df(r2,r1,r4,r3)*(-1,1)$$

Although illustrated with reference to the energy capture units of the third and fourth embodiments of the invention, each of these two definitions of displacement maps in terms of displacement lookup data is applicable to other embodiments whose capture components share its symmetries. The second definition also applies to the second embodiment, and the first definition also applies to the fifth embodiment, described below. Embodiments having more capture components, and therefore response spaces of more dimensions, will require different permutation maps based on the same method as the present examples illustrate.

Orienting Modes

The orienting algorithm summarized in FIG. 29 uses the displacement map to infer the capture unit's position in displacement space within two different lookup procedures: stateless, in which the algorithm relies exclusively on the unit's current response values; and stateful, in which the algorithm combines the current response values with information about the capture unit's recent displacement history. Each procedure can either succeed in finding a displacement point, or fail, as when the response values reference only null-valued cells in the response-space partition.

The algorithm can be summarized as having two main control loops or modes: the search mode occupying the left portion of the flowchart, which repeatedly moves the capture unit in random directions through significant distances in position space and executes the stateless lookup procedure until that procedure succeeds, whereupon it transfers control to the tracking loop; and the tracking mode occupying the right portion of the flowchart, which repeatedly moves the capture unit by small increments toward the origin of displacement space and executes the stateful lookup procedure until that procedure fails multiple times in succession, whereupon it transfers control back to the search loop.

The tracking loop records state information such as displacement coordinates of previous iterations, and uses that information to improve its orienting performance through several possible methods, two of which are described here: disambiguation of displacement map results and compensation for skew between the displacement and position spaces.

Figure 32:
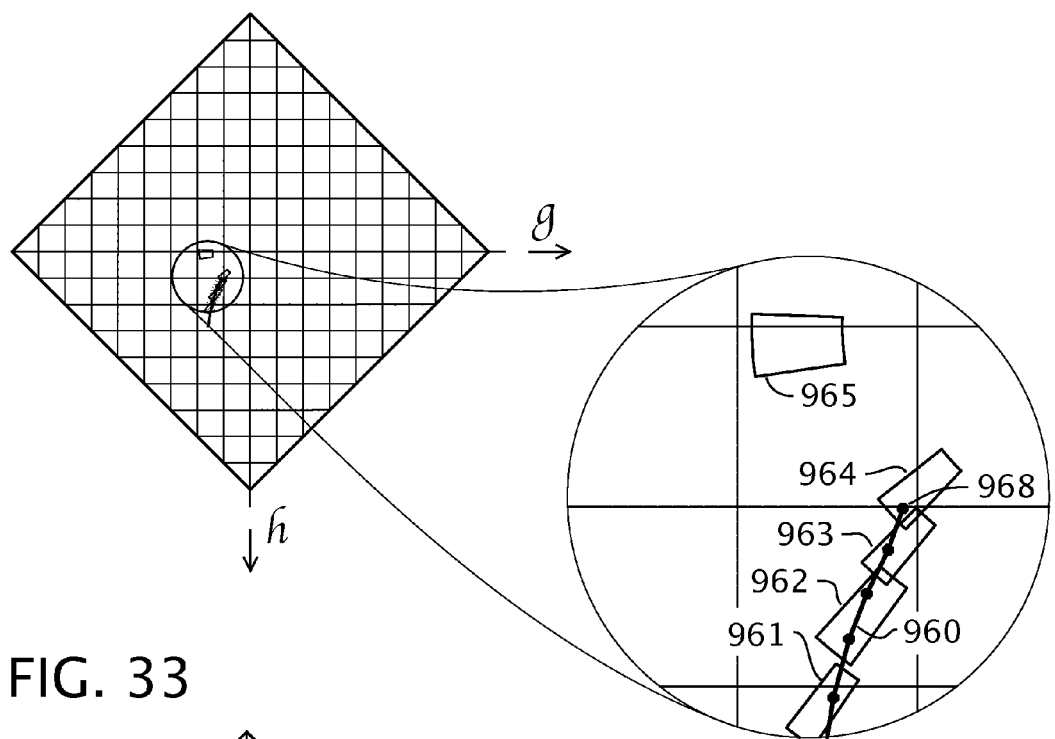
FIG. 32 illustrates the use of state information in the orienting algorithm to disambiguate the displacement map.

FIG. 32 illustrates the use of state information to disambiguate displacement map results. As noted above with reference to FIG. 30, cells in the response-space partition may reference multiple points or regions in the displacement space, resulting in ambiguities in the displacement map. However, because the capture unit is moved incrementally in tracking mode, the displacement coordinates recorded for previous iterations are likely to be proximal to the correct displacement coordinates for the current iteration. If and when the displacement map returns multiple candidate points, the algorithm compares each such point to one or more of the recently-recorded points and selects the candidate point, if any, that fits the trend of the recent points, based on criteria such as the length and direction of the vector between successive points.

FIG. 32 shows the trace 960 of the movement of a capture unit through displacement space, whose vertices represent the displacement coordinates at each step during which the algorithm reads PV response values, consults the displacement map to infer its displacement-space coordinates, and adjusts its trajectory by setting drive motor speeds. The radial sectors represent the results of displacement map lookups, with sector 962 returned by lookups at two consecutive steps and the sector 963 returned by the lookup at the next step. At the step indicated by the last trace point shown, 968, the lookup returns the two sectors 964 and 965. Because the sector 964 lies in the trend of sectors returned by lookups in previous steps, the algorithm accepts it as indicating the correct displacement location and rejects the sector 965.

Figure 33:
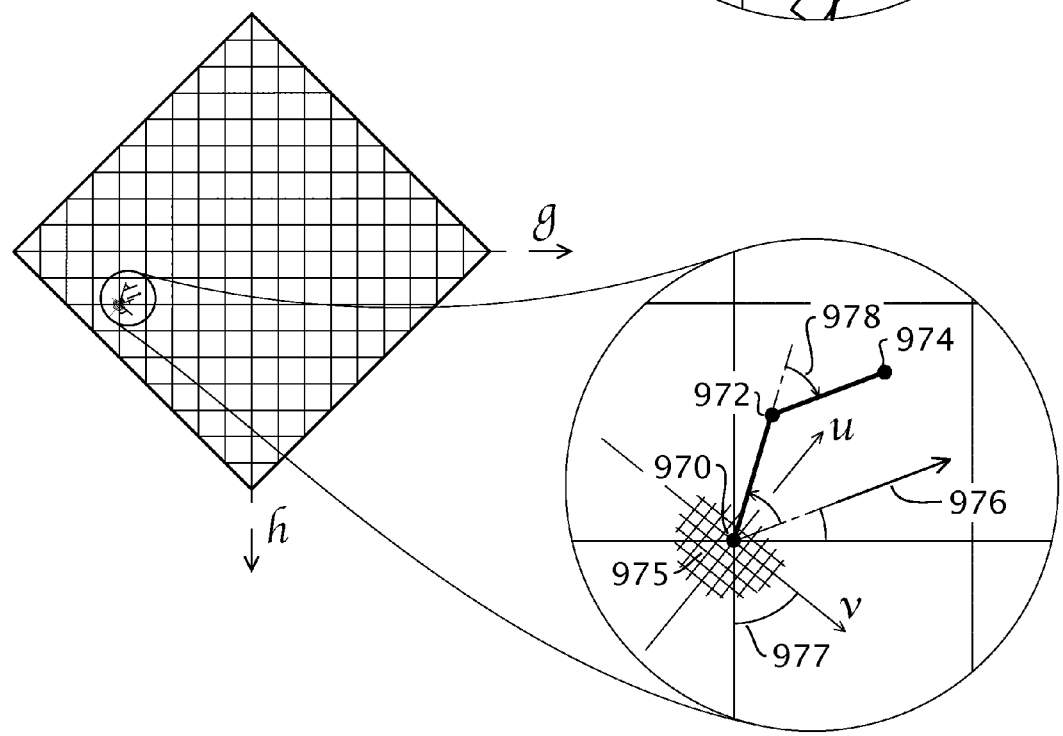
FIG. 33 illustrates the use of state information in the orienting algorithm to correct for skew in the displacement map.

FIG. 33 illustrates the use of state information to compensate for skew. As noted above with reference to FIG. 26, skew between displacement and position spaces generally grows with increasing distance from the displacement-space origin to as much as 50 degrees depending on factors such as the capture unit's current angular position, the light displacement magnitude, and parameterization of the displacement space. If the inferred displacement-space coordinates are translated directly into movement coordinates by mapping the (g,h) into (ud,vd) componentwise, then the orienting algorithm will produce motion to align the capture unit with the light direction that, in many cases, diverges significantly from the most direct path.

This non-optimal orienting behavior due to skewing is easily corrected by introducing an anti-skew rotation in the map from (g,h) to (ud,vd) and adjusting that rotation to cancel the effect of the skew. At each iteration of the tracking loop the current and previous one or more positions in displacement space are examined to measure the angular separation of the tracking direction from the optimal direction, and the anti-skew angle is incremented by the inverse of that angle.

FIG. 33 shows three points in displacement space inferred by displacement-map lookups from PV response data at three consecutive steps of executing the stateful tracking loop. On the first step the algorithm has just entered stateful mode, has estimated displacement coordinates of the point 970, and does not yet have information about the skew. At that point the position-space coordinate system 975 is rotated approximately 50 degrees with respect to the displacement coordinate system. Based on its inferred position in displacement space, the algorithm deduces the direction toward the spaces' origin, 976, which is about twenty degrees clockwise of the space's g axis, and sets the positioner's drive speeds based on a componentwise mapping of the origin direction vector in the g,h coordinate system into the ud,vd coordinate system. Because of the skew 977, motion is produced in a direction approximately 50 degrees clockwise from the optimal direction 976. At the next step, the algorithm measures the angle of the segment connecting the previous point 970 to the current point 972, and subtracts that angle from the current direction to the origin to obtain an anti-skew angle 978 of approximately minus 50 degrees. At this step the algorithm sets the positioner's drive speeds based on a mapping of the origin direction vector in the g,h coordinate system into the ud,vd coordinate system with a rotation by the anti-skew angle, resulting in motion to the next inferred point 974 whose direction closely approximates the origin direction vector.

The orienting algorithm may use ongoing measures of skew to make inferences about the capture unit's angular position and use that information to improve the performance of various tasks, such as searches of the response-space partition taking into account capture unit shading as described below.

Generalizations of Orienting Algorithms

The algorithms described above are designated displacement-space orienting algorithms because they generate a map from response space to displacement space. Although the capture unit's angular position may be inferred from displacement along with delta response values, state information such as skew history, the displacement lookup map described above is based on generating an inverse map from the empirical function mapping displacement data to PV response data.

Displacement-space orienting algorithms assume, as an approximation at least, that a capture unit's aperture is illuminated uniformly for any given light displacement. However, as can be seen from the aperture study of FIG. 7, a capture unit within a close-packed array begins to be shaded for even small light displacements and angular positions departing from the array's normal direction. Displacement-space orienting methods, such as described above, can be expected to provide robust orienting behavior for energy collection elements used in configurations where they are not such close proximity that they shade each-other through most of their range of motion and incident light conditions, but cannot necessarily be expected, without modification, to proved robust orienting behavior in close-packed arrays of elements.

Figure 34:
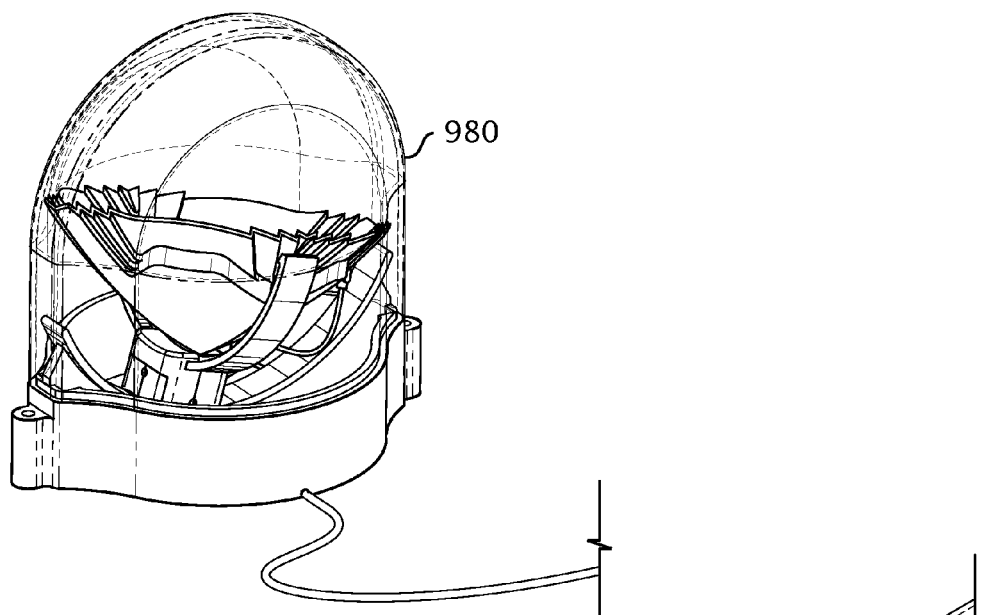
FIG. 34 shows an energy collection element of the fourth embodiment within an enclosure designed to house a single element.

FIG. 34 shows a stand-alone module consisting of an energy collection element of the fourth embodiment inside of an enclosure designed to receive it. The transparent top portion of the enclosure 980 extends well below the pivot point of the element's tilt axes and allows the capture unit's aperture to be fully illuminated throughout its operating range of motion. Such modules could be installed in sparse arrangements such that the individual modules would not significantly shade each other. Alternatively, elements could be installed in parse arrangements within enclosures containing multiple elements to avoid shading. However, several useful features of the invention enable and relate to the packing of elements in optimally compact arrangements wherein energy capture units experience some degree of shading from neighboring units most of the time.

Used with close-packed arrays of elements, the displacement lookups using response data from shaded capture units would be prone to fail because the response-space partition, generated from sample data from only unshaded units, would be missing coverage of portions of that space corresponding to shaded conditions. The following describes, first, a modification of displacement-space orienting algorithms that addresses the problem; and second, a generalization of displacement-space orienting algorithms that generates sample data and reverse lookup maps in relation to the product of the displacement and movement spaces rather than just the displacement space.

Response-Space Searching

As described above, The displacement map is used to infer locations in displacement space given a specific point in response space. However, the geometry of an embodiment's capture unit may be such that shadows covering portions of it affect the response values in a sufficiently predictable way that, given a response-space point for a given light displacement and condition of shading, a response-space point for the same approximate displacement without shading can be located by a constrained search of the response-space partition.

For example, if a capture unit's position and light displacement result in only one of its four capture components being shaded, its response-space point will differ from that recorded for the same displacement in the unshaded condition only in that the response-space coordinate for the shaded capture component will be reduced. Thus, given a point in response space, the algorithm constrains its search to one, two, or three-dimensional subspaces or sections of the response-space partition, depending on whether it assumes that one, two, or three of the capture components is shaded. In all cases the search need examine only such sections whose coordinates are equal to or greater than the coordinates of the given point.

Thus, even assuming that all four of the components may be shaded, the search of the response-space partition is still constrained to a subspace determined by the given response values. Because search times grow with the number of dimensions of the subspace to be searched, the algorithm may perform the searches in order of increasing dimension of the subspace, ending the search when it locates a cell satisfying its search criteria. The algorithm may also use state information to guide its order of search, such as by first searching the subspace in which a match was found in a previous iteration of the tracking loop.

Figure 35:
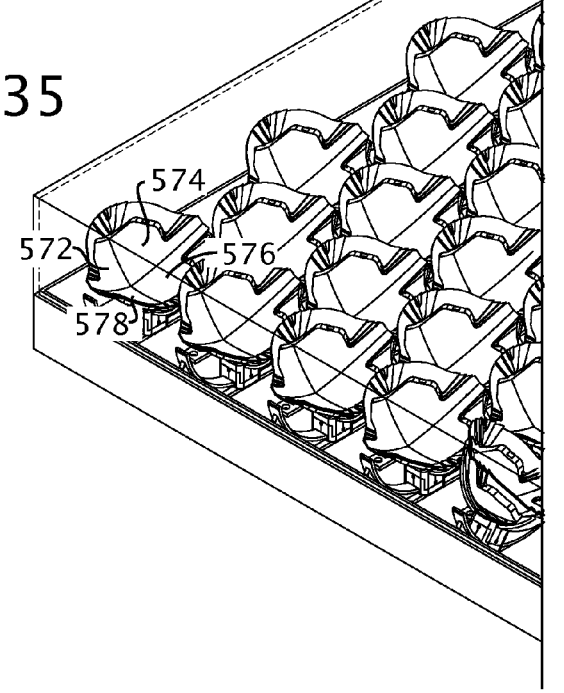
FIG. 35 shows the corner of a panel containing energy collection elements of the fourth embodiment to illustrate the shading of elements by their neighbors.

FIG. 35 shows a portion of a panel housing energy collection elements of the fourth embodiment, in which most of the capture units' normal axes are aligned with each-other. Quadrants of the reflector of the corner element are labeled according to the apertures of their corresponding capture components, ad described above with reference to FIG. 17. If the sun were directly behind the viewer, then all of the visible capture units are shaded to some degree, with all having the capture component farthest from the viewer 574 almost entirely unshaded and most having the capture component nearest to the viewer 578 entirely shaded. As the light displacement relative to the array becomes less, the shading of capture units decreases, both in quantity and in the number of capture components affected.

Due to the relationship between the light displacement relative to the array's normal axis and shading, displacement-space orienting algorithms can be expected to provide robust tracking behavior for close-packed arrays when the sun's direction is close to the array's normal direction, but may become less efficient and reliable as the angular displacement of these axes increases. The algorithm may exploit this fact by recording its tracking movements during conditions of low shading, and using that data to calibrate a programmed course of movement that is executed at other times. The implementation of such programmed movement may require that the angular positioner be equipped to sense its distance of travel relative to its respective arcs, such as is described above in relation to FIG. 16.

Condition Space Mappings

The generalized orienting algorithm defines the condition space of an energy collection element as the product of the angular position and light displacement spaces. Whereas the position and displacement spaces each have two dimensions, the condition space has four, u and v from the position space, and g and h from the displacement space. The condition space is divided into four quadrants based on the signs of g and h.

Figure 36:
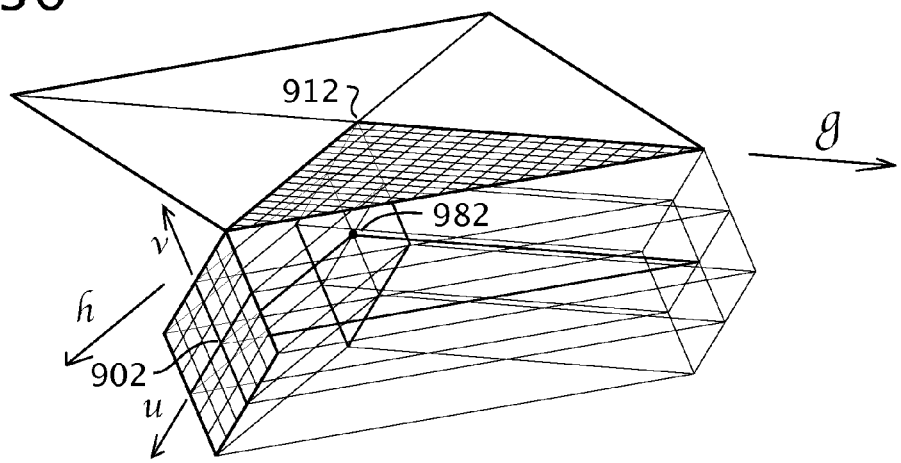
FIG. 36 illustrates the four-dimensional condition space consisting of the product of the displacement and position space.

FIG. 36 illustrates the condition space as a projection of a four-dimensional volume onto the page. For any point in the position space given by the coordinate pair (u, v) the condition space contains a slice spanning the displacement space, and for any point in the displacement space given by the coordinate pair (g, h) the condition space contains a slice spanning the position space. The origin of the condition space 982 is the point where the displacement space origin 912 and the position space origin 902 intersect.

The condition space depicted in FIG. 36 is folded in the same manner as the displacement space is folded as described above with reference to FIG. 31. Sample data is generated for only the first quadrant of condition space, and is used to generate the response-space partition. Given response values, the condition map returns locations in any of the four quadrants of condition space by returning the union of four response-space partition lookups, each using a unique permutation of partition coordinates, and each inverting the results' g and u coordinates, and/or its h and v coordinates, or neither, in one of the four possible combinations.

A testbed system is used to produce the sample data array covering the condition space in much the same way as such a system is used to produce the sample data array covering the displacement space as described above with reference to FIG. 28. However, the two additional degrees of freedom that of the condition space has compared to the displacement space place more requirements on the testbed system, an example of whose implementation is described below with reference to FIG. 37.

In the procedure described above, energy capture units are made to move through a two-parameter range of angular motion relative to a lightsource, covering at least one quadrant of the light-displacement space. Because the displacement space is mapped without shading of the capture units, the testbed might use only a single energy collection element to gather data. In the present procedure, the movement of the capture units relative to the array base and relative to the lightsource correspond to movement within the orthogonal angular movement and light displacement subspaces of the condition space, respectively. When a capture unit is moved relative to the base while keeping its orientation relative to the lightsource constant, the PV response levels change only as a function of the movement of shadows across the capture unit. To capture this function of PV response relative to angular movement the test unit needs to generate shadows, either through using an array of instrumented energy collection elements, or through using a single instrumented element surrounded by mockup-up elements that move in unison with the central element and shade it.

Figure 37:
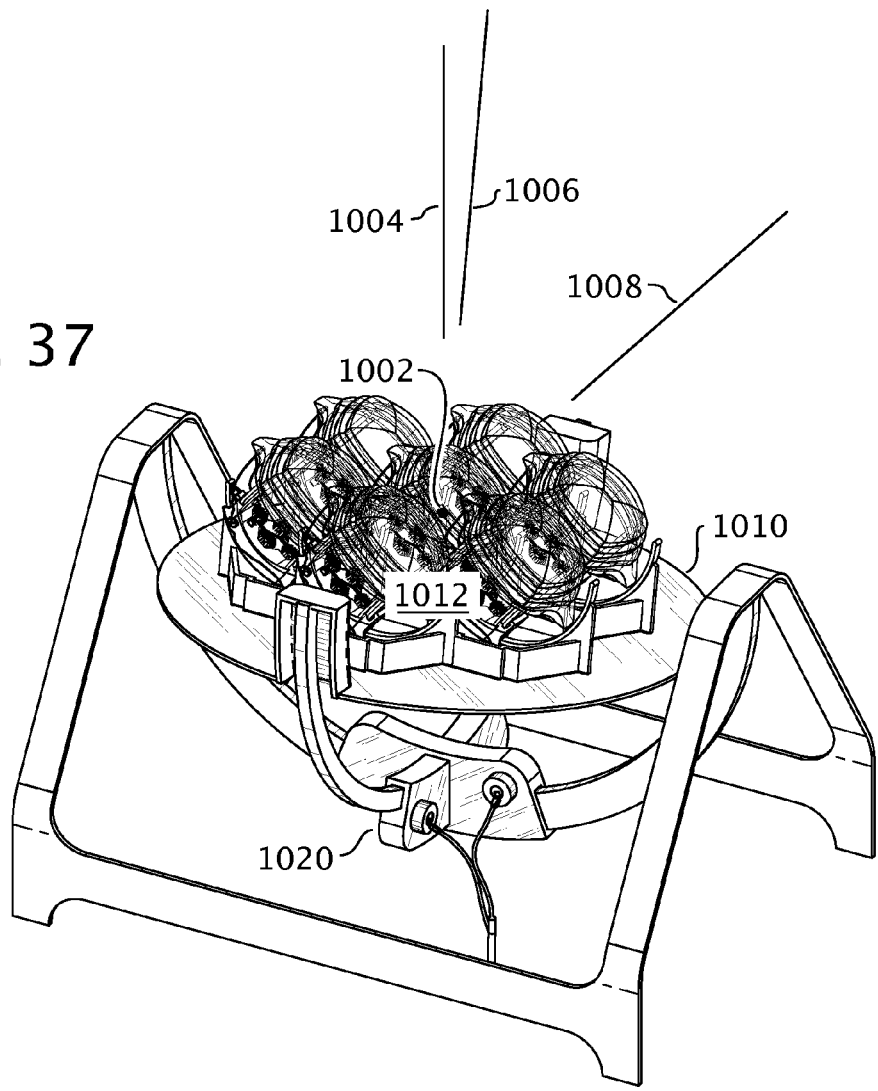
FIG. 37 shows a testbed for generating sample data covering the condition space, using a platform that enables the lightsource to be fixed.

FIG. 37 shows a portion of a testbed system enabling the collection of sample data for a coverage of the condition space. The system uses a testbed positioning device in which the platform 1010 with a two-axis angular positioner 1020, itself a variant of the invention's angular positioner, designed to move a small array of energy collection units 1012 through a range of motion that simulates the range of possible displacements of the sun relative to the array's normal axis. In the illustration, the platform, whose normal axis is 1006, is rotated 10 degrees about its inner tilt axis relative to its base, whose normal axis is 1004, and the energy capture units, the normal axis of the center unit being 1008, are rotated 40 degrees about their outer tilt axes relative to their bases and the platform. The platform is displaced below its inner tilt axis such that the center of rotation of the testbed positioning device corresponds to the center of rotation of the middle energy capture unit.

Because the testbed positioning device provides a two-axis range of angular motion of the test array relative to a fixed lightsource simulating the relative angular displacements of the sun, while the angular positioners of the array's energy collection elements provide an independent two-axis range of angular motion of the energy capture units relative to the array producing the shading conditions within the array, the testbed system allows the generation of data for a coverage of the four-dimensional condition space using a fixed lightsource.

The same apparatus shown in FIG. 37 could be used with the sun, bypassing possible problems arising from differences between sunlight and artificial light, but introducing a constant change in displacement space due to the movement of the sun. Many methods could be used to collect such dynamically-changing data using the computer-controlled four-axis testbed system. One set of methods records a series of traces for each capture component, each recording its PV response data as a function of absolute time, and, with information about the testbed's position history and path of the sun, uses the traces to produce a coverage of condition space. Because the location of the sun, the tilt angles of the testbed capture, and those of the testbed base can be determined with a relatively high degree of accuracy, the location in condition space of any point along a trace can as well. A method for producing a coverage of condition space as a four-dimensional array of samples such as indicated by FIG. 36 is to assign to each sample point the response values of the trace point nearest to it condition space.

Individual PV Response Calibration

The methods described above depend on a capture unit's PV cells providing information about their illumination in the form electrical outputs where the magnitude of a cell's output is proportional to the quantity of sunlight falling on it. The above-described procedure for deriving displacement and condition reverse lookup maps from response maps of the PV cells within a capture unit assume that those cells have response characteristics that are substantially identical to each other and to the PV cells within the testbed system. However, PV cells that are manufactured to identical specifications may have significant differences in response characteristics, and the invention provides means of compensating for such differences. These means consist of recording in each energy collection element's microcontroller calibration data for each of the element's PV cells, such data being used to normalize each PV's output data before it is used by the displacement or condition maps.

The invention contemplates two types of PV output normalization. In the first type of normalization, a single coefficient is stored for each PV cell, and upon each access, the PV's output value is multiplied by the coefficient to obtain the normalized value. In the second type of normalization, a data structure representing a function is stored for each PV cell, and upon each access, the PV's output value is passed to the function to obtain normalized value.

Other Methods of Sample Data Generation

The foregoing description sets fourth methods of programming microcontroller-equipped concentrating solar energy collection devices having certain characteristics to move their energy-capturing means into alignment with directional light, where those methods use empirically-generated sample data describing the PV response levels as functions of positional conditions to generate data describing a reverse map from PV response levels to those conditions. The described testbed systems used to generate the sample data are physical devices employing energy collection elements similar to those of production systems. However, the same methods of generating and using reverse maps to infer displacement and positional information from PV response data could be employed where the sample data was generated by means of computer simulations instead of a physical testbed system, provided that the simulation was sufficiently realistic, given the characteristics of the embodiment, to produce useful sample data.

Other Embodiments

The embodiments described above show preferred forms of the invention given existing fully-developed technologies, such as triple junction photovoltaic cells with sunlight-to-electricity efficiencies approaching forty percent in form-factors down to a few square millimeters of area, high-ratio micro gearmotors half the diameter of a pencil, microcontrollers that can store megabytes of data, and high-volume manufacturing methods for precision optics parts the size of hand-held objects. The inventions related methods of angular positioning, compatible close-packing zero-collision optics shape generation, and per-element tracking may be applied in ways that look very different than said embodiments.

The final two embodiments illustrate forms of the invention made possible by development of methods of manufacture that may not yet exist, but are foreseeable. For example, the fifth embodiment uses bead-like energy capture units that might be quite small. The manufacture of motors, electronics, and optics in such small dimensions and in such large quantities may not be economical today, but is likely to become more so over time as the technology of automated micro-fabrication advances. Likewise, the sixth embodiment requires tiny photovoltaic receivers to be positioned and wired in arrays of thousands. There may exist machines today that can be programmed and configured to perform just such tasks, but their use for manufacturing components of the size of solar panels may not be economical.

Elements Mounted in Tray-Type Base Structures

FIG. 38 shows the fifth embodiment of the invention, which uses an energy capture unit combining reflective and refractive optics and where the energy capture and angular positioning units form modules whose combined shapes nest within cavities within a tray-like platform designed to receive them.

Figure 38A:
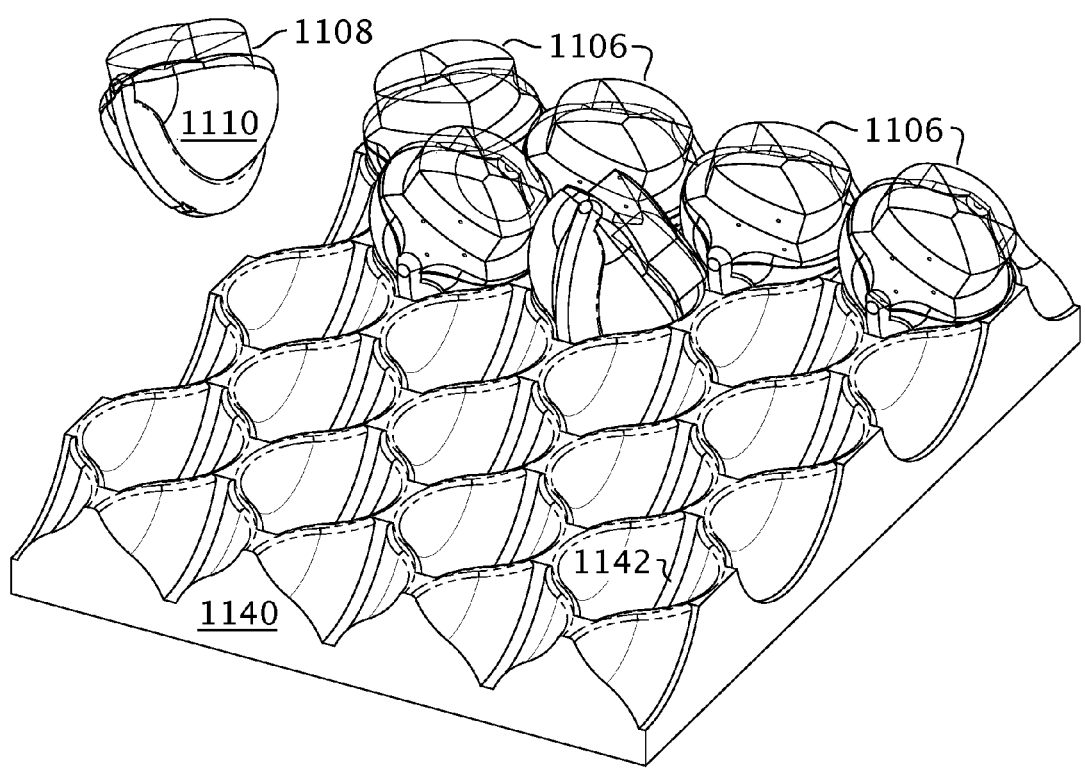
FIG. 38 shows assemblies of the fifth embodiment of the invention.

FIG. 38A shows a portion of a tray 1140 having 18 complete cavities, five of which are occupied by modules 1106, and a single module suspended above the base tray 1108.

Figure 38B:
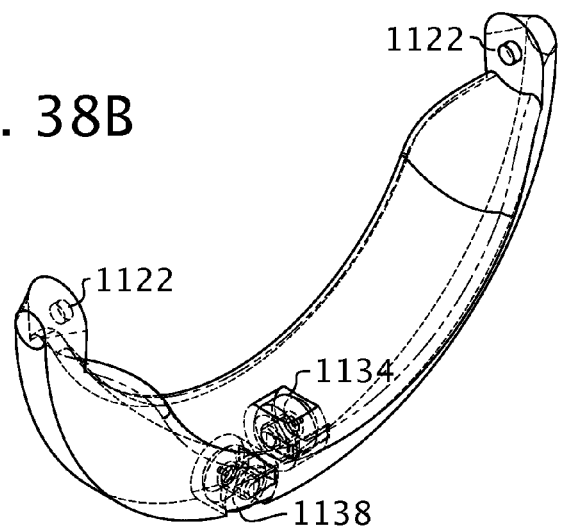

FIG. 38B shows the angular positioning unit of a single module, in which hidden edges are indicated by dashed lines. The positioning unit of this embodiment contrasts with variants in the other embodiments in that it has the shape of an arch extending to opposite ends of the capture unit, which it mounts axially instead of circumferentially via the axial pegs 1122. Like the other embodiments, the positioning unit applies torque on both the inner and outer tilt axes circumferentially, via drive rollers mounted proximal to the mid-point of the arch. The inner drive roller 1134, protruding from a cavity in the upper surface of the positioner's body, engages the underside of the approximately spherical surface 1110 of the energy capture unit. The outer drive roller 1138, protruding from a cavity in the lower surface of the positioner's body, engages the cylindrical track 1142 in the base cavity in which the module is installed. The drive rollers are powered by small gearmotors whose bodies lie mostly inside of the rollers and are anchored to the positioner's body.

The optics of the energy capture units use a combination of refraction and reflection, where incident light is first refracted upon entering the unit's solid transparent body, then reflected by a mirrored surface on the body's back side before finally converging on the PV cells embedded in the body. Each capture unit has four energy capture components arranged in a pattern similar to that found in the capture components of the third embodiment.

FIG. 38 does not show details of the conductors connecting the various electrical components. In one design, conductors pass between the capture unit and angular positioning unit near or through one of the axial pegs 1122, and conductors pass from the capture unit to the base tray through a small cable that emerges from one of the capture unit's faces and passes into the base at a socket located just beyond the track 1142. The cable has sufficient stiffness to assure that it curves in a broad arc, preventing it from becoming tangled between the base and modules.

Element with Micro-Optics

Figure 39:
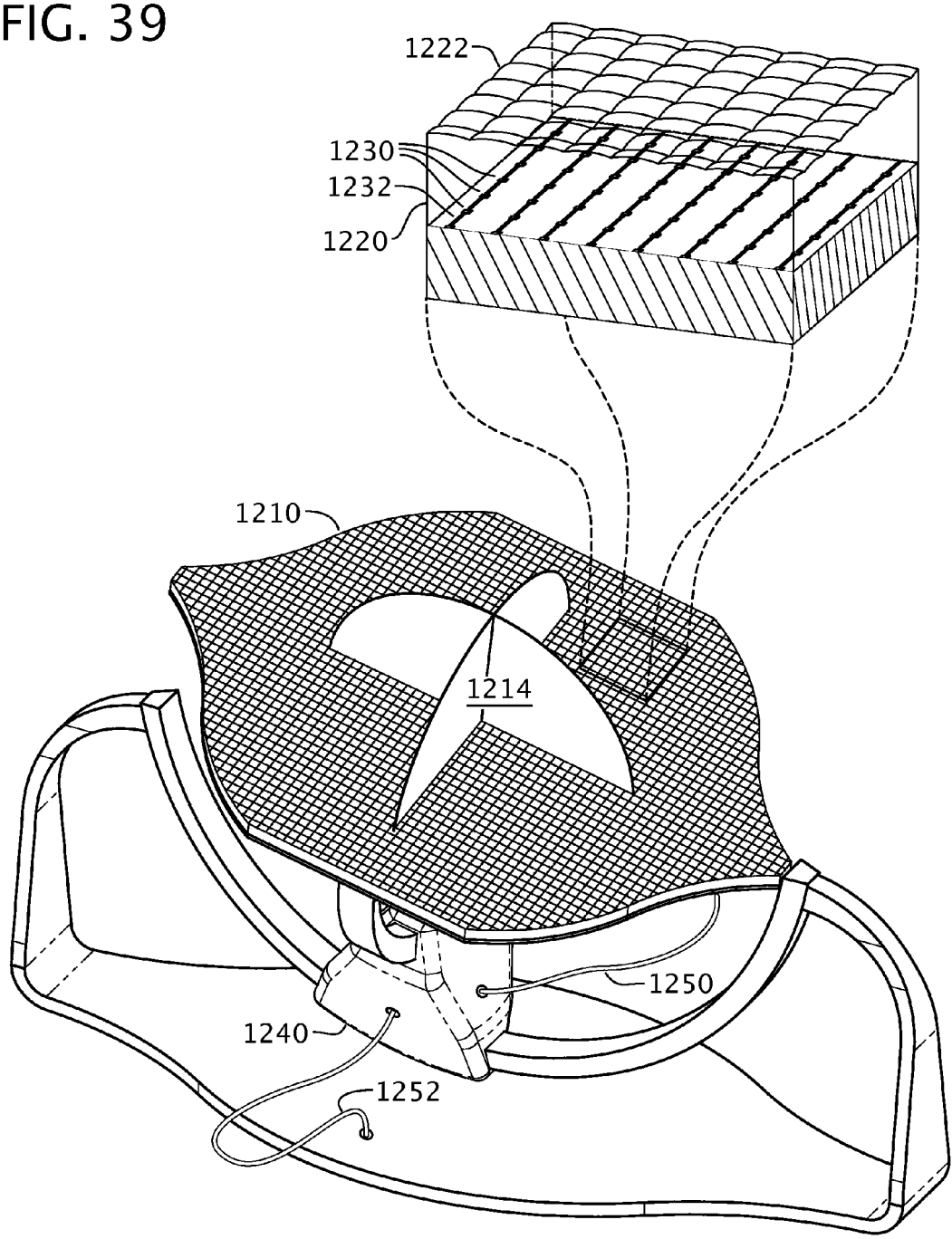
FIG. 39 shows an energy collection element of the sixth embodiment of the invention.

FIG. 39 shows an energy collection element of the sixth embodiment of the invention, whose energy capture unit has a plate-like surface that contains a micro-array of more than one thousand concentrating micro-elements. The lower portion of the figure shows an single energy collection element, based on an elongation ration of 1.0, and the magnified block in the upper-right hand portion of the figure shows a magnified view of a portion of the micro-array having 56 photovoltaic cells.

The means of optical concentration is explained with reference to the magnified view. The transparent material 1220 forms a compound lens with an optical axis for each photovoltaic cell perpendicular to the plate 1210 supporting the micro-array. Each element of the compound lens 1222 has a focal point centered on its respective PV cell 1230. The PV cells are connected by the conductor strips 1232, which collect the electrical power generated by the PV cells and transmit it through the first cable 1250 to the positioning unit 1240 and then through the second cable 1252 to the unit's base.

The pair of thin plates 1214, which are mutually perpendicular and each perpendicular of the plate 1210 divides rows and columns of micro-elements along the symmetry planes of the energy capture unit. Being parallel to the micro-elements' optical axes, these plates do not shade any of the micro-elements when the unit is aligned with directional incident light, but shade progressively more of the micro-elements as the unit's axis departs from the direction of incident light. Which micro-elements are shaded depends of the direction of departure of the unit's axis from the direction of incident light. The energy capture unit's electronics uses information about which micro-elements are shaded to determine the angular direction that the capture unit needs to move to restore alignment between its axis and the direction of incident light and commands the angular positioning unit to move accordingly.

GLOSSARY OF TERMS angular positioning unit (also angular positioner, positioner): the component that orients the energy capture unit through the sliding action of itself against perpendicular arcs in the base and the capture unit.

angular position space (also position space): the two-dimensional space encompassing the set of possible angular positions of the energy capture unit relative to the base provided by the angular positioning unit.

aperture: the region in a plane perpendicular to the direction of dominantly parallel light defining a column of such light that will fall on a device.

aperture plane: the plane perpendicular to an energy capture unit's normal axis containing the unit's inner tilt axis.

aperture efficiency: the fraction of light falling on an array of elements that is captured by those elements.

aperture segment: that portion of an element's aperture covered by one of its energy capture components.

array normal axis (also panel normal axis): The direction perpendicular to the plane of an array of energy collection elements.

base unit: that portion of an energy collection element that supports its angular positioning unit through a mounting arc and anchors the element to the array base or other platform.

capture unit normal axis: the central axis of an energy capture unit, to which its optical axis or axes are parallel, and usually coinciding to the intersection of the unit's planes of reflective symmetry.

center of rotation: the point at which the inner and outer tilt axes intersect.

concave mounting arc: the mounting arc that is rigidly attached to the base unit.

condition map: the data structure and access method that, given coordinates in response space, returns zero or more points in the condition space.

condition space: the four-dimensional space encompassing the set of possible angular displacements of the direction of incident directional light from the energy capture unit's normal axis and the possible angular positions of the energy capture unit relative to the base provided by the angular positioning unit.

convex mounting arc: the mounting arc that is rigidly attached to the energy capture unit.

delta PV response space (also delta response space): the space whose dimensions are the rates of changes of the output levels of an energy capture unit's PV cells in response to small movements along the two directions of angular position space.

displacement map: the data structure and access method that, given coordinates in response space, returns zero or more points in the light displacement space.

displacement lookup data: the data structure, consisting of a partition of the response space into cells referencing points and/or regions in the displacement space, used by the displacement map.

elongation ratio: the ratio of the distance between rows to the distance between elements within a row in an array of energy collection elements.

energy capture component (also capture component): a functional portion of an energy capture unit having an aperture segment.

energy capture unit (also energy capturer): the portion of an energy collection element comprising the light-concentrating optics and light-to-electricity conversion means.

energy collection element: the assembly, arrays of which are installed within panel-like enclosures, comprising an energy capture unit, angular positioning unit, and base unit.

inner tilt axis: the axis of partial rotation of the angular positioner relative to its payload, such as the energy capture unit.

light displacement space: the two-dimensional space encompassing the set of possible angular displacements of the direction of incident directional light from the energy capture unit's normal axis up to 90 degrees from that axis.

mount axis: tilt axis using an angular positioner.

mounting arc: either of the convex mounting arc or concave mounting arc, which are engaged by the angular positioning unit to support and provide angular movement of the energy capture unit.

normal axis: (See capture unit normal axis or array normal axis.)

operational clearance profile: the volume swept out by an energy collection element's capture unit and positioning unit as they move through their ranges of motion through the action of the angular positioning unit.

outer tilt axis: the axis of partial rotation of the angular positioner relative to the base.

PV response function: the function that maps points in the light displacement space to points in the PV response space for a given design of energy capturing unit.

PV response space (also response space): the space whose dimensions are the output levels of an energy capture unit's PV cells.

response-space partition: the segmentation of the response space into cells, based on the distribution of samples in displacement and response space, encoded in the displacement lookup data.

sample data array: the data set generated using the simulation array, consisting of samples giving response-space points for each of a dense grid of points in the displacement space, or product of displacement and position spaces.

tilt axis: either of two axes about which the angular positioning unit generates angular motion—an inner axis of motion relative to the energy capture unit, and an outer axis of motion relative to the base.

What is claimed is:

1. A solar energy collection element comprising:
    an energy capture unit defining an aperture having an axis of symmetry normal to the aperture, comprising:
        a plurality of energy capture components, wherein each of the energy capture components comprises:
            an asymmetrically shaped light-concentrating optic characterized by an optical axis parallel to the axis of symmetry;
            a focus or foci; and
            at least one light-to-electricity converter located at the focus or the foci; and
        a tower mounted at a base of the plurality of energy capture components, wherein each of the light-to-electricity converters is situated at a focus or a foci of at least one of the plurality of light-concentrating optics and is mounted on the tower; and
    a mount mechanically coupled to the energy capture unit and configured to rotate the energy capture unit about one or more tilt axes, wherein,
        the plurality of energy capture components is arranged about the axis of symmetry;
        at least one of the light-to-electricity converters is configured to sense an orientation of the normal axis with respect to the direction of the incident radiation and to generate useful power; and
        the mount is configured to effect rotation about the one or more tilt axes based on the sensed orientation.

2. The solar energy collection element of claim 1 wherein the mount comprises an angular positioning unit comprising an arcuate slot configured to slidably adjust a convex track of the energy capture unit, and a perpendicular arcuate slot configured to slidably adjust a concave track of the energy capture unit.

3. The solar energy collection element of claim 2 wherein the angular positioning unit comprises a pair of motor-driven rollers or pinion gears, each engaging one of the convex track and the concave track and controlling travel of the angular positioning unit along the respective track.

4. The solar energy collection element of claim 3 wherein the motor-driven rollers or pinion gears are powered by electricity generated by the at least one light-to-electricity converter.

5. The solar energy collection element of claim 3 wherein the motor-driven rollers or pinion gears are controlled as a function of a multidimensional vector of response levels of each of the at least one light-to-electricity converter.

6. The solar energy collection element of claim 1 wherein an inner tilt axis, defined by a center of an arcuate track in the energy capture unit, and an outer tilt axis, defined by a center of an arcuate track in the base, are perpendicular to each other and intersect.

7. The solar energy collection element of claim 1 comprising a profile shape as observed along the axis normal to the aperture configured to tile a plane with a pattern of the cmm symmetry group; and when moved about its tilt axes under the control of an angular positioning unit, sweeps out a volume whose projection perpendicular to the base lies exactly within the said profile shape.

8. The solar energy collection element of claim 1, wherein the one or more tilt axes comprises a first tilt axis and a second tilt axis, and the mount is configured to rotate the energy capture unit about the first tilt axis and about the second tilt axis.

9. The solar energy collection element of claim 1, comprising a support structure, wherein the mount is mechanically coupled to the support structure.

10. The solar energy collection element of claim 1, wherein the mount is configured to rotate the energy capture unit along one or more convex arcuate tracks.

11. The solar energy collection element of claim 1, wherein and
each of the light-to-electricity converters configured to receive focused directional light from at least one of the energy capture components for conversion to electricity when the axis of the energy collection element is aligned with the direction of incident directional light, and which is illuminated by directional light when the axis of the energy collection element is not aligned with the direction of incident directional light in such a way that the light-to-electricity converter produces electricity proportional to the magnitude and displacement of the axis of the energy collection element from the incident light axis.

12. The solar energy collection element of claim 11, wherein the light-to-electricity converter comprises a photovoltaic cell.

13. The solar energy collection element of claim 1, wherein outputs of two or more of the light-to-electricity converters are used as inputs to an algorithm that controls rotation of the mount.

14. The solar energy collection element of claim 13, wherein the algorithm comprises:
a data acquisition unit for generating light displacement vectors and response functions for light-to-electricity converters;
a generator for generating an inverse map of the light displacement vectors; and
an output unit for orienting the mounts.

15. A solar energy collection system comprising a plurality of the energy collection elements of claim 1 configured in a two-dimensional array having a normal axis.

16. The solar energy collection system of claim 15, wherein the plurality of energy capture units of the plurality of energy collection elements, when positioned so that a normal axis of each of the plurality of energy capture units is aligned with the normal axis of each of the other of the plurality of energy capture elements fills a plane perpendicular to the normal axis of the array.

17. The solar energy collection system of claim 15, wherein the plurality of energy collection elements is configured in a close-packed arrangement having cmm symmetry group.

18. The solar energy collection system of claim 15, wherein each of the energy capture units is characterized by a profile shape that, when viewed from a normal axis and moved throughout a range of motion, sweeps out a volume in which a projection onto a tiling plane perpendicular to the normal axis coincides with the shape of the energy capture unit.

19. The solar energy collection system of claim 15, wherein the plurality of energy collection elements is configured in a close-packed arrangement, wherein when viewed along the normal axis of the array and when oriented parallel to the normal axis of the array normal, fills a plane perpendicular to the normal axis of the array.

20. The solar energy collection element of claim 1, wherein the at least one light-to-electricity converter is mounted proximate a surface of an oppositely facing light-concentrating optic.

21. The solar energy collection element of claim 1, wherein each of the light-to-electricity converters is configured to sense an orientation of the energy capture aperture with respect to the direction of the incident radiation and to generate useful power.

22. The solar energy collection element of claim 1, wherein opposing light-to-electricity converters are configured to adjust a tilt axis.

* * * * *